(12) United States Patent
Arai

(10) Patent No.: US 6,774,429 B2
(45) Date of Patent: Aug. 10, 2004

(54) HYBRID SEMICONDUCTOR DEVICE WITH A POLY-METAL GATE STRUCTURE

(75) Inventor: Masatoshi Arai, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/921,911

(22) Filed: Aug. 6, 2001

(65) Prior Publication Data

US 2002/0020860 A1 Feb. 21, 2002

(30) Foreign Application Priority Data

Aug. 10, 2000 (JP) ......................................... 2000-242325

(51) Int. Cl.[7] ........................................... H01L 29/788

(52) U.S. Cl. ........................ 257/316; 257/324; 257/326

(58) Field of Search ................................ 257/316, 324, 257/326

(56) References Cited

U.S. PATENT DOCUMENTS

| | | | | |
|---|---|---|---|---|
| 5,656,839 A | * | 8/1997 | Komori et al. | 257/316 |
| 5,736,421 A | * | 4/1998 | Shimomura et al. | 438/253 |
| 2003/0062566 A1 | * | 4/2003 | Schuegraf et al. | 257/316 |

* cited by examiner

*Primary Examiner*—Van Thu Nguyen
*Assistant Examiner*—Christian D. Wilson
(74) *Attorney, Agent, or Firm*—Nixon Peabody LLP; Donald R. Studebaker

(57) ABSTRACT

An inventive semiconductor memory device includes a memory circuit and a logic circuit that are formed on a single semiconductor substrate. The memory circuit includes a storage element having a memory gate structure. The memory gate structure includes: a tunnel insulating film formed on the substrate; and a control gate electrode formed out of a gate prototype film. The logic circuit includes a logical element having a logic gate structure. The logic gate structure includes: a lower gate electrode formed out of the gate prototype film; and an upper gate electrode formed out of a conductor film on the lower gate electrode. The conductor film contains a metal. The memory gate structure includes no metal films.

14 Claims, 36 Drawing Sheets

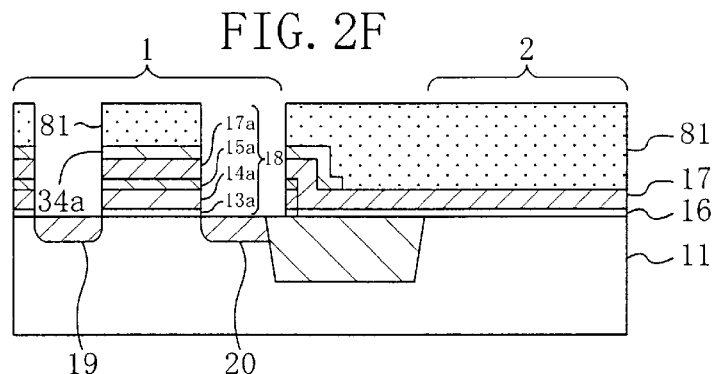
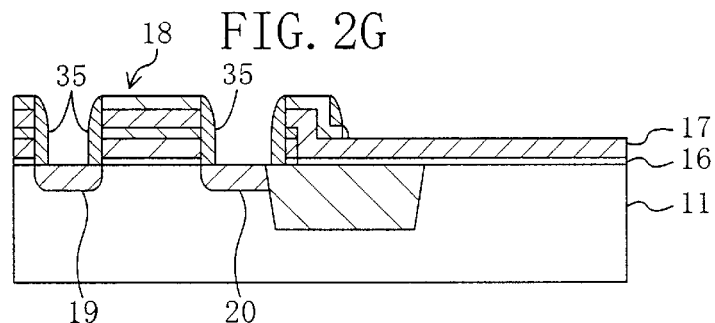
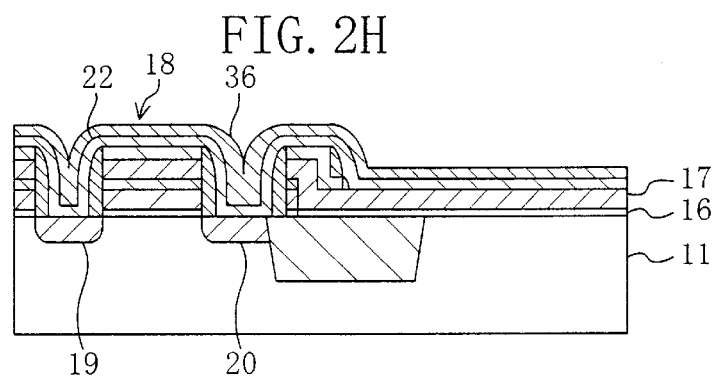
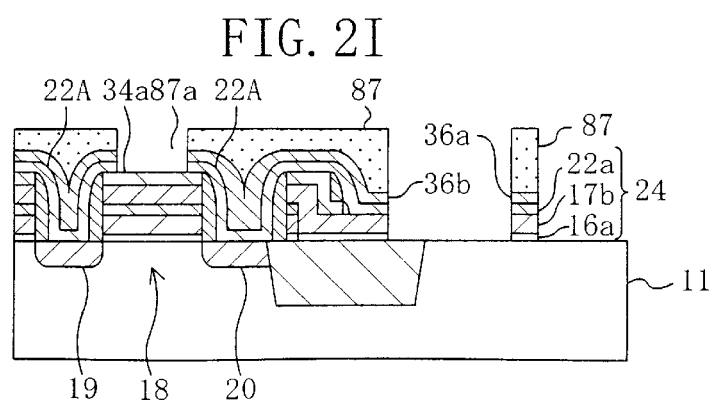

HYBRID SEMICONDUCTOR DEVICE WITH A POLY-METAL GATE STRUCTURE

BACKGROUND OF THE INVENTION

The present invention relates to a semiconductor memory device including memory and logic circuits on the same substrate, and also relates to a method for fabricating a device of that type.

In recent years, a so-called "hybrid device" of the type including memory and logic circuits on the same substrate has been researched and developed vigorously to further increase the operating speed and further improve the performance of a semiconductor memory device.

On the other hand, a technique of forming a "poly-metal gate" as a gate electrode for a transistor by stacking polysilicon and metal films one upon the other is now expected to play a key role in further downsizing and enhancing the performance of a semiconductor integrated circuit device. Accordingly, the implementation of a hybrid device including poly-metal gates is waited for in the art.

Hereinafter, a known method for fabricating a semiconductor memory device will be described with reference to the accompanying drawings. FIGS. 10A through 10L illustrate cross-sectional structures corresponding to respective process steps for fabricating a semiconductor memory device including poly-metal gates in memory and logic circuit sections.

First, as shown in FIG. 10A, isolation regions 102 are defined in a semiconductor substrate 101 of silicon by embedding silicon dioxide in its surface regions. As a result, multiple active regions, including memory and logic circuit sections 100 and 200 illustrated in FIG. 10A, are defined. Thereafter, tunnel insulating and first polysilicon films 103 and 104 are deposited to respective thicknesses of about 9 nm and about 250 nm over the substrate 101.

Next, as shown in FIG. 10B, a capacitive insulating film 105 is formed on the first polysilicon film 104 and then the tunnel insulating, first polysilicon and capacitive insulating films 103, 104 and 105 are patterned to remove their parts located in the logic circuit section 200.

Then, as shown in FIG. 10C, a gate insulating film 106 is formed on part of the surface of the substrate 101 that has been exposed in the logic circuit section 200. Subsequently, a second polysilicon film 107 is deposited to a thickness of about 100 nm over the substrate 101 and then doped with phosphorus ($P^+$) ions by an ion implantation process.

Next, as shown in FIG. 10D, a metal film 108 of tungsten, for example, and a first silicon dioxide film 109 are deposited in this order to respective thicknesses of about 150 nm and about 100 nm over the second polysilicon film 107.

Thereafter, as shown in FIG. 10E, the multilayer structure consisting of the tunnel insulating, first polysilicon, capacitive insulating, second polysilicon, metal and first silicon dioxide films 103, 104, 105, 107, 108 and 109 are dry-etched while being masked with a resist pattern 110. The resist pattern 110 defined on the first silicon dioxide film 109 covers not only part of the memory circuit section 100 where a gate electrode should be formed for the memory circuit but also the entire logic circuit section 200. In this manner, a gate electrode 111 for memory circuit (which will be herein called a "memory gate structure") is formed.

Subsequently, as shown in FIG. 10F, the resist pattern 110 is removed and then source/drain regions 112 and 113 are defined in the substrate 101 using the memory gate structure 111 as a mask.

Then, as shown in FIG. 10G, the multilayer structure consisting of the gate insulating, second polysilicon, metal and first silicon dioxide films 106, 107, 108 and 109 are dry-etched while being masked with a resist pattern 114. The resist pattern 114 defined on the first silicon dioxide film 109 covers not only part of the logic circuit section 200 where a gate electrode should be formed for the logic circuit but also the entire memory circuit section 100. In this manner, a gate electrode 115 for logic circuit (which will be herein called a "logic gate structure") is formed.

Subsequently, as shown in FIG. 10H, arsenic ($As^+$) ions are implanted into the substrate 101 using the resist pattern 114 as a mask, thereby defining light-doped source/drain regions (which will be herein called "LDD regions" simply) 116 and 117 in the substrate 101.

Next, as shown in FIG. 10I, after the resist pattern 114 has been removed, a second silicon dioxide film is deposited over the substrate 101 and then etched back, thereby forming sidewall insulating films 118a and 118b over the memory and logic gate structures 111 and 115, respectively.

Thereafter, as shown in FIG. 10J, a resist pattern 119 is defined to cover the memory circuit section 100 and then $As^+$ ions are implanted into the substrate 101 using the resist pattern 119, logic gate structure 115 and sidewall insulating film 118b as a mask. In this manner, source/drain regions 120 and 121 are defined for the logic circuit.

Subsequently, as shown in FIG. 10K, the resist pattern 119 is removed and then a cobalt film is deposited over the substrate 101 and annealed so that the cobalt film deposited reacts with exposed parts of the substrate 101. In this manner, a silicide layer 122 is formed on the exposed parts of the substrate 101.

Finally, as shown in FIG. 10L, an interlevel dielectric film 123 of silicon dioxide is deposited over the substrate 101 and then contacts 124 are formed in the interlevel dielectric film 123 so as to make electrical contact with the source/drain regions 112 and 113 and 120 and 121 for the memory and logic circuits. As a result, a semiconductor memory device is completed.

In the known semiconductor memory device, however, the tunnel insulating film 103 of the memory gate structure 111 might show inferior reliability.

Specifically, when the source/drain regions 112 and 113 are defined for the memory circuit by implanting dopant ions into the substrate 101 in the process step shown in FIG. 10F, the dopant ions should pass the edges of the memory gate structure 111. As a result, the tunnel insulating film 103 is partially damaged. For that reason, after the source/drain regions 112 and 113 have been defined, the memory gate structure 111 should be annealed if possible to repair the damage done on the tunnel insulating film 103.

But if this annealing process were conducted on the memory gate structure 111, the metal film 108 included in the memory gate structure 111 might be oxidized abnormally and even peel off unintentionally. Accordingly, there has been no other choice than omitting the annealing process. In that case, however, it is impossible to repair the damage done on the tunnel insulating film 103 and it is very hard for such a semiconductor memory device to show good reliability.

Also, where a resistor (not shown) should be formed out of the second polysilicon film 107 in the logic circuit section 200, the process step of removing part of the metal film 108 deposited on the second polysilicon film 107 should be performed additionally. Thus, the known method is disadvantageous in this respect also.

Furthermore, a hybrid device normally needs a greater area on the chip because a device of that type is essentially a combination of devices of two types. So the known structure interferes with the chip-downsizing trend.

SUMMARY OF THE INVENTION

An object of the present invention is to improve the reliability of a tunnel insulating film for a semiconductor memory device including memory and logic circuits on the same substrate and using a poly-metal gate structure for the logic circuit.

Another object of this invention is to reduce a chip area necessary for a semiconductor memory device of that type.

A third object of the invention is to get a resistor fabricated for a device of that type without increasing the number of process steps needed.

To achieve the first object, in the inventive process for fabricating a semiconductor memory device, it is not until a memory gate structure has been formed and annealed that a metal film, which will form part of a logic gate structure as a poly-metal gate, is deposited.

According to the present invention, a metal film to be contact pads for a storage element and a metal film that will form part of a logic gate structure are formed out of the same material in a single process step, thus accomplishing the second object.

The third object is also achievable by forming contacts that are self-aligned with a memory gate structure in accordance with the present invention. For that purpose, a sidewall insulating film, covering the side edges of contact pads in the memory circuit region, and an interlevel dielectric film are made of mutually different materials.

Specifically, a semiconductor memory device according to the present invention includes a memory circuit and a logic circuit that are formed on a single semiconductor substrate. The memory circuit includes a storage element having a memory gate structure. The memory gate structure includes: a tunnel insulating film formed on the substrate; and a control gate electrode formed out of a gate prototype film. The logic circuit includes a logical element having a logic gate structure. The logic gate structure includes: a lower gate electrode formed out of the gate prototype film; and an upper gate electrode formed out of a conductor film on the lower gate electrode. The conductor film contains a metal. In this memory device, the memory gate structure includes no metal films.

In the inventive semiconductor memory device, the memory gate structure includes no metal films, and the substrate can be annealed to repair the damage done on the tunnel insulating film. As a result, the tunnel insulating film can have its reliability improved. In addition, the logic gate structure includes the upper gate electrode formed out of a conductor film containing a metal. Accordingly, even if the logic gate structure is formed in a small size, the logic gate structure has a sufficiently low resistance.

In one embodiment of the present invention, the storage element preferably further includes a silicide film on the control gate electrode.

In another embodiment of the present invention, the storage element preferably further includes: source/drain regions; and contact pads that are electrically connected to the source/drain regions. The contact pads have preferably been formed out of the conductor film for the upper gate electrode. Then, the storage and logical elements can have their resistance and area both reduced without increasing the number of process steps needed. That is to say, the second object of the present invention is accomplished.

In this particular embodiment, the source/drain regions are preferably defined in parts of the substrate that are located beside the memory gate structure. And the contact pads preferably cover the upper surface of the source/drain regions and the side faces and upper edges of the memory gate structure.

Also, a first passivation film has preferably been formed on the upper surface of the control gate electrode, and a first sidewall insulating film has preferably been formed on the side faces of the control gate electrode. In this case, an etch selectivity of the first passivation film to the first sidewall insulating film is preferably sufficiently high.

Furthermore, the upper surface and side edges of the contact pads are preferably covered with a second passivation film and a second sidewall insulating film, respectively. The upper surface and side faces of the logic gate structure are also preferably covered with the second passivation and second sidewall insulating films, respectively. And the second passivation and second sidewall insulating films have been shaped out of first and second insulating films, respectively.

In this particular embodiment, an interlevel dielectric film has preferably been deposited as a third insulating film over the substrate. The first and second insulating films are preferably made of the same material. And an etch selectivity of the third insulating film to the first and second insulating films is preferably sufficiently high.

In still another embodiment, the inventive memory device may further include: an isolation region defined in the substrate; and a resistor formed on the isolation region. The resistor preferably includes: a body formed out of the gate prototype film; and two terminals, which have been formed out of the conductor film and make electrical contact with both edges of the body. Then, the third object of the present invention is achievable.

In yet another embodiment, the conductor film may be a single metal film, a stack of multiple metal films or a multilayer structure including a silicide film.

In yet another embodiment, a sidewall passivation film with an L-cross section and a first sidewall insulating film may have been stacked in this order on the side faces of the memory gate structure. On the other hand, the side faces of the logic gate structure may not be covered with the sidewall passivation film but with the first sidewall insulating film.

In yet another embodiment, the memory gate structure may further include a floating gate electrode and a capacitive insulating film that have been formed in this order on the tunnel insulating film and under the control gate electrode.

An inventive fabricating method is for use to fabricate a semiconductor memory device including a storage element and a logical element. The method includes the step of a) defining an isolation region in a semiconductor substrate and thereby partitioning the principal surface of the substrate into a memory circuit region where the storage element will be formed and a logic circuit region where the logical element will be formed. The method further includes the step of b) forming a first insulating film, a first gate prototype film of silicon and a second insulating film in this order on the memory circuit region of the substrate. The method further includes the steps of: c) forming a third insulating film on the logic circuit region of the substrate; d) depositing a second gate prototype film of silicon over the second and third insulating films; and e) forming a memory gate structure on the memory circuit region after the step d) has been performed. The memory gate structure includes a tunnel insulating film, a floating gate electrode, a capacitive insulating film and a control gate electrode that have been formed by selectively etching away the first insulating, first gate prototype, second insulating and second gate prototype films, respectively. The method further includes the steps of: f) selectively implanting dopant ions into respective parts of the substrate that are located beside the memory gate structure, thereby defining source/drain regions for the storage element after the step e) has been performed; g) annealing the substrate after the step f) has been performed; h) depositing a conductor film, containing a metal, over the substrate as well as over part of the second gate prototype film located in the logic circuit region after the step g) has been performed; and i) forming a logic gate structure on the logic circuit region after the step h) has been performed. The logic gate structure includes a gate insulating film and lower and upper gate electrodes that have been formed by selectively etching away the third insulating, second gate prototype and conductor films, respectively.

In the inventive fabricating method, a control gate electrode is formed out of a second gate prototype film of silicon for a storage element. That is to say, the control gate electrode is not formed out of a metal film. Accordingly, a tunnel insulating film, which is formed out of a first insulating film, can be annealed to have its quality improved.

In one embodiment of the present invention, the substrate may be made of silicon, while the second gate prototype film may be made of polycrystalline or amorphous silicon. The method may further include the step of siliciding respective exposed silicon portions of the substrate and the control gate electrode after the step i) has been performed. Then, the storage and logical elements can both make good electrical contact with upper-level interconnects.

In another embodiment of the present invention, the inventive method may further include the steps of: depositing a fourth insulating film on part of the second gate prototype film located in the memory circuit region between the steps d) and e); and depositing a first sidewall insulating film on the side faces of the memory gate structure between the steps f) and h). The step e) may include forming a first passivation film out of the fourth insulating film on the control gate electrode in the memory circuit region. The step i) may include forming contact pads out of the conductor film while forming the logic gate structure. The contact pads are electrically connected to the source/drain regions for the storage element.

In this manner, while a logic gate structure is being formed, contact pads, which are electrically connected to source/drain regions for a storage element, are also formed out of a conductor film in accordance with the present invention. Thus, the second object of the present invention is achieved. In addition, the storage and logical elements can have their resistance and area both reduced without increasing the number of process steps needed.

In this particular embodiment, the contact pads preferably cover the upper surface of the source/drain regions and the side faces and upper edges of the memory gate structure.

Also, the inventive method preferably further includes the step of depositing a fifth insulating film over the conductor film between the steps h) and i). In that case, the step i) preferably includes forming a second passivation film out of the fifth insulating film on the upper gate electrode and on the contact pads.

More specifically, in the step i), after the second passivation film has been formed on the conductor film out of the fifth insulating film as a mask pattern for forming the logic gate structure and the contact pads, the conductor and first passivation films are preferably etched selectively to form the contact pads while the conductor, second gate prototype and third insulating films are preferably etched selectively to form the logic gate structure. The contact pads and the logic gate structure are both formed using the second passivation film as a mask. Generally speaking, when a fine-line pattern should be formed using a resist film as a mask, part of the resultant resist pattern might be deformed due to unwanted deposition of polymers produced from the resist film, thus possibly making it difficult to define the desired fine-line pattern. However, according to the present invention, a logic gate structure is formed using the fifth insulating film as a so-called "hard mask". Thus, the logic gate structure can be formed as a desired fine-line pattern.

In still another embodiment, the inventive method may further include the steps of: depositing a fourth insulating film on part of the second gate prototype film located in the memory circuit region between the steps d) and e); depositing a first sidewall insulating film on the side faces of the memory gate structure between the steps f) and h); depositing a fifth insulating film over the conductor film between the steps h) and i); selectively etching the fifth insulating film between the steps h) and i) to form a second passivation film that will be used as a mask pattern for forming the logic gate structure in the logic circuit region and that covers the memory circuit region entirely; and etching the second passivation, conductor and first passivation films using, as a mask, a resist pattern having an opening over the memory gate structure, thereby forming contact pads after the step i) has been performed. The contact pads are preferably electrically connected to the source/drain regions for the storage element. The step e) may include forming the first passivation film out of the fourth insulating film on the control gate electrode in the memory circuit region. In the step i), the logic gate structure may be formed using the second passivation film as an etching mask.

In this particular embodiment, the contact pads preferably cover the upper surface of the source/drain regions for the storage element and the side faces and upper edges of the memory gate structure.

Also, the fourth and fifth insulating films are preferably made of mutually different materials. Then, the etch selectivity of the fourth insulating film to be etched to the fifth insulating film used as a hard mask for forming the memory gate structure can be sufficiently high, thus considerably increasing the process stability.

Moreover, the substrate is preferably made of silicon while the second gate prototype film is preferably made of polycrystalline or amorphous silicon. And the method preferably further includes the step of siliciding respective exposed silicon portions of the substrate and the control gate electrode after the contact pads have been formed.

Furthermore, the second gate prototype film is preferably made of polycrystalline or amorphous silicon. And the method preferably further includes the steps of: implanting dopant ions into part of the second gate prototype film located in the logic circuit region between the steps d) and h); and implanting dopant ions into the logic circuit region of the substrate using the logic gate structure as a mask, thereby defining source/drain regions for the logical element and implanting the dopant ions into the control gate electrode after the contact pads have been formed.

In a dual-gate implantation process, ions of n- and p-type dopants are respectively implanted into the polysilicon gate electrodes of n- and p-channel transistors in the logic circuit region. In that case, when the substrate is annealed, the n- and p-type dopants introduced into those gate electrodes will cause interdiffusion, thus changing the threshold voltage of each of these transistors. However, according to the present invention, the unwanted phenomenon like that is avoidable without increasing the number of process steps.

Furthermore, the fourth insulating and first sidewall insulating films are preferably made of mutually different materials. Then, the etch selectivity of the fourth insulating film to the first sidewall insulating film can be so high that a contact for the control gate electrode can be formed just as intended.

Also, the inventive method may further include the step of forming a third passivation film out of the fourth insulating film on part of the second gate prototype film, where a resistor will be formed, between the steps d) and h). The third passivation film is used as a mask for defining the resistor. The second gate prototype film may be made of polycrystalline or amorphous silicon. The step d) may include covering part of the isolation region on which the resistor will be formed with the second gate prototype film. The step of forming the fourth insulating film may include covering part of the second gate prototype film where the resistor will be formed with the fourth insulating film. And the step i) may include forming a body of the resistor out of the part of the second gate prototype film, where the resistor will be formed, by etching the second gate prototype film using at least the third passivation film as a mask.

Then, the third object of the present invention is achieved. That is to say, where a resistor should be formed out of the second gate prototype film, there is no need to perform the additional process step of removing a metal film from a multilayer structure for a poly-metal gate. In addition, when the second gate prototype film is patterned to form a logic gate structure, the resistor is also formed at the same time. Accordingly, there is no need to perform the additional process step of forming the resistor.

Moreover, the inventive method may further include, after the contact pads have been formed, the step of: forming a second sidewall insulating film on the side edges of the contact pads along the length of the memory gate structure and on the side faces of the logic gate structure. The method may further include the step of implanting dopant ions into the logic circuit region of the substrate using the logic gate structure and the second sidewall insulating film as a mask, thereby defining source/drain regions for the logical element. The method may further include the step of depositing an interlevel dielectric film over the substrate. The interlevel dielectric film is preferably made of a material showing a high etch selectivity with respect to the second sidewall insulating film. And the method may further include the step of forming contact holes through the interlevel dielectric film so that the holes are located over, and self-aligned with, the contact pads and the source/drain regions of the logical element.

Then, a mask alignment margin, allowable for aligning the contact pads with a contact that should be located over the control gate electrode, can be increased considerably. As a result, the storage element can have its area further reduced.

In still another embodiment, the conductor film may be a single metal film, a stack of multiple metal films or a multilayer structure including a silicide film.

In yet another embodiment, the second insulating film may be a stack of oxide and nitride films.

DESCRIPTION OF THE PREFERRED EMBODIMENTS

Embodiment 1

Hereinafter, a first embodiment of the present invention will be described with reference to the accompanying drawings.

Figure 1A:
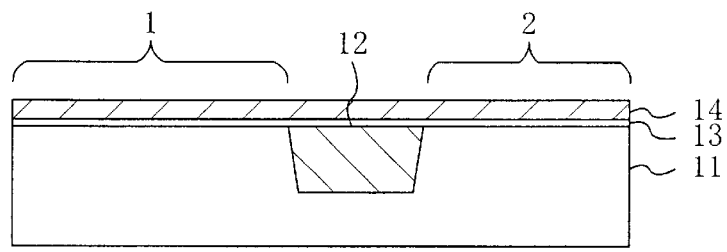
FIGS. 1A through 1N are cross-sectional views illustrating respective process steps for fabricating a semiconductor memory device according to a first embodiment of the present invention.
Figure 1B:
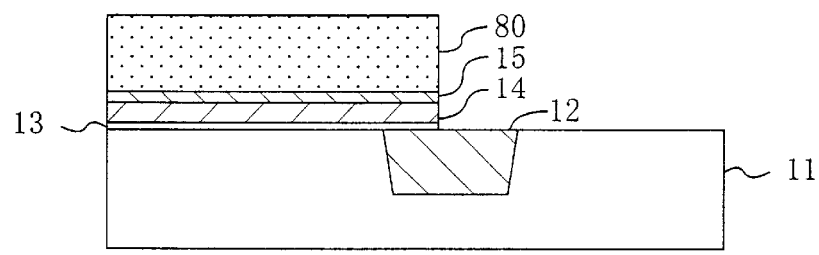
Figure 1C:
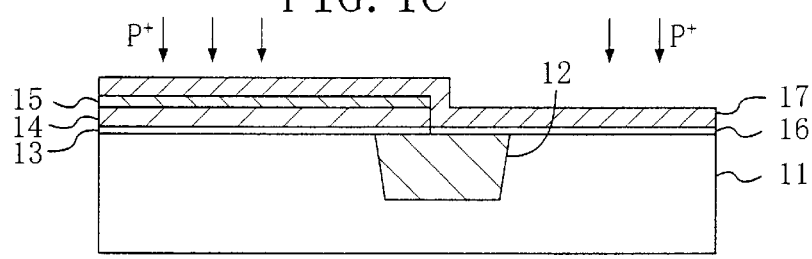
Figure 1D:
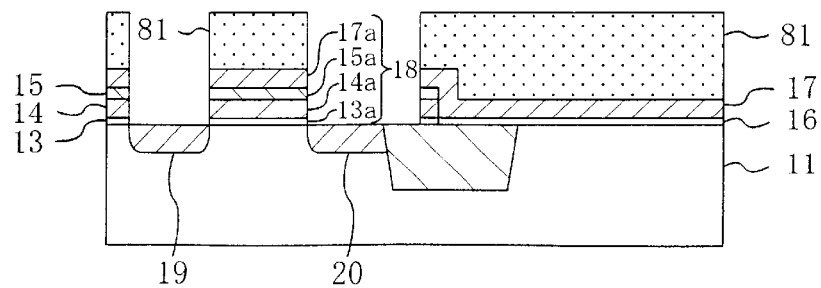
Figure 1E:
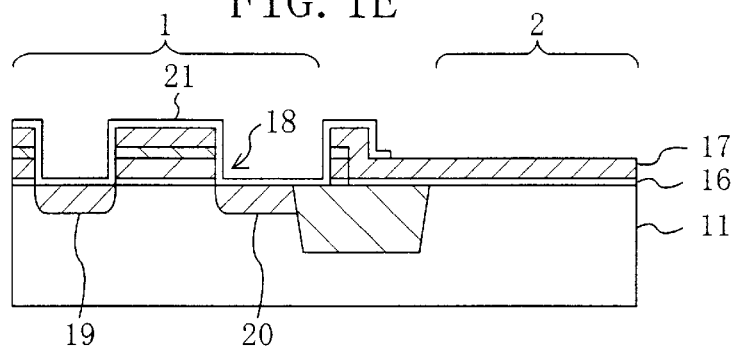
Figure 1F:
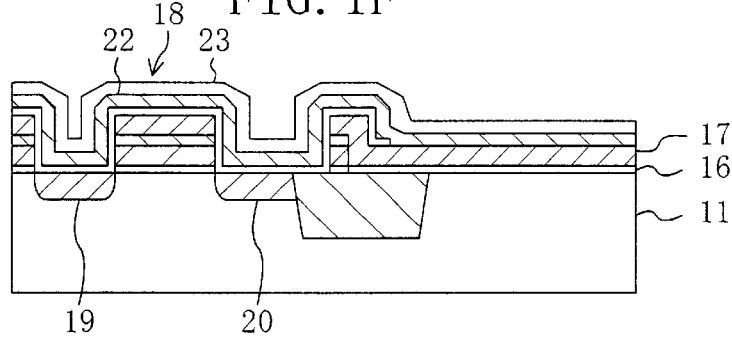
Figure 1G:
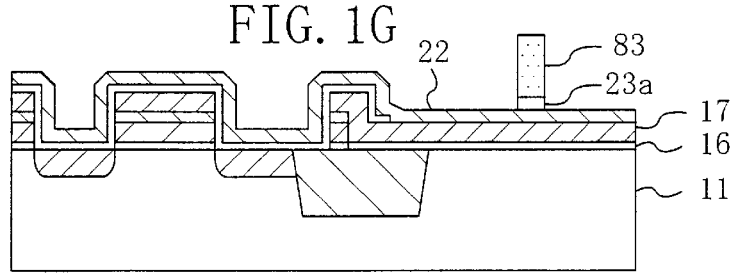
Figure 1H:
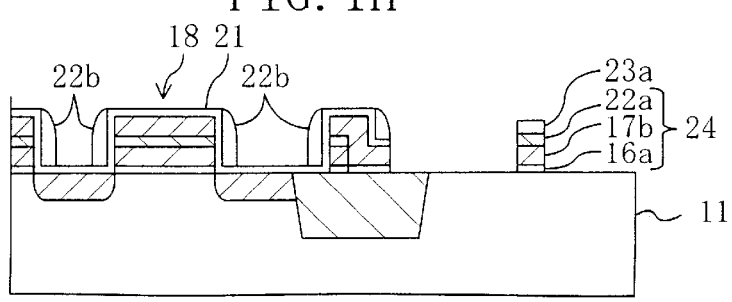
Figure 1I:
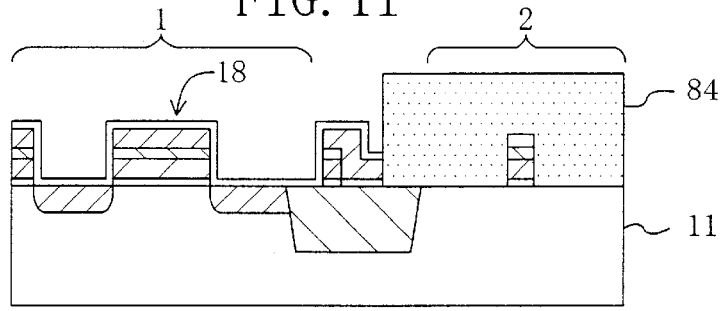
Figure 1J:
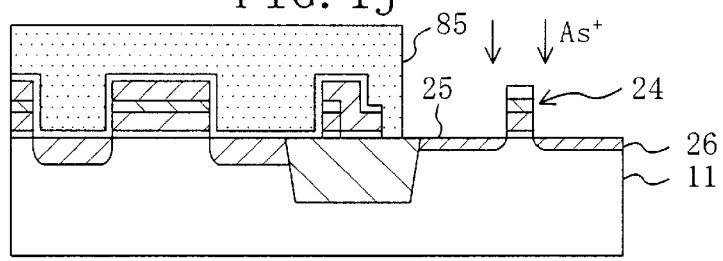
Figure 1K:
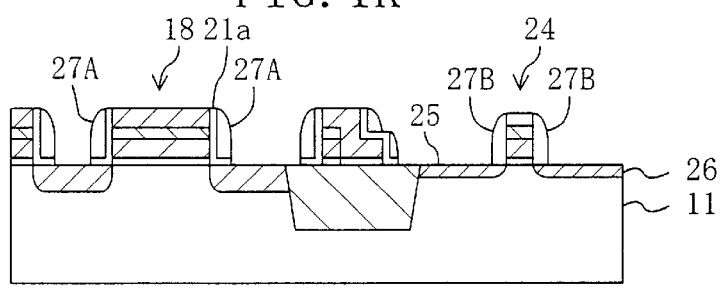
Figure 1L:
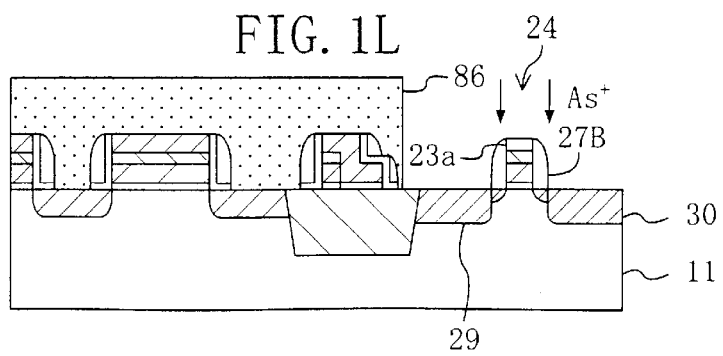
Figure 1M:
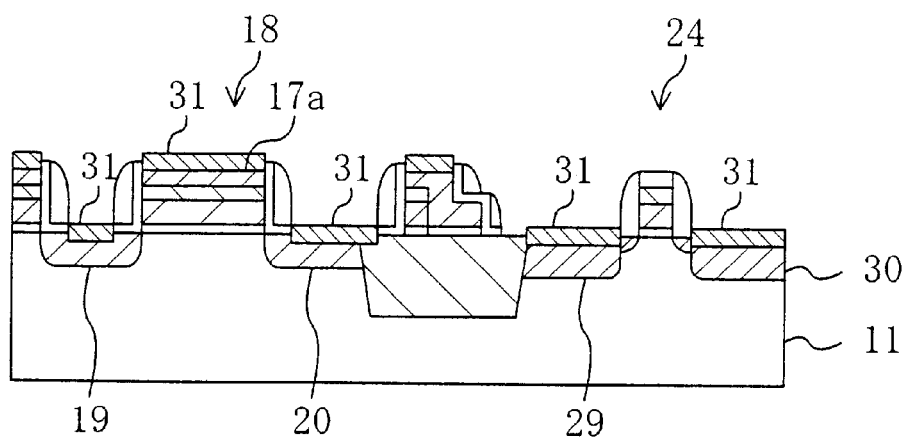
Figure 1N:
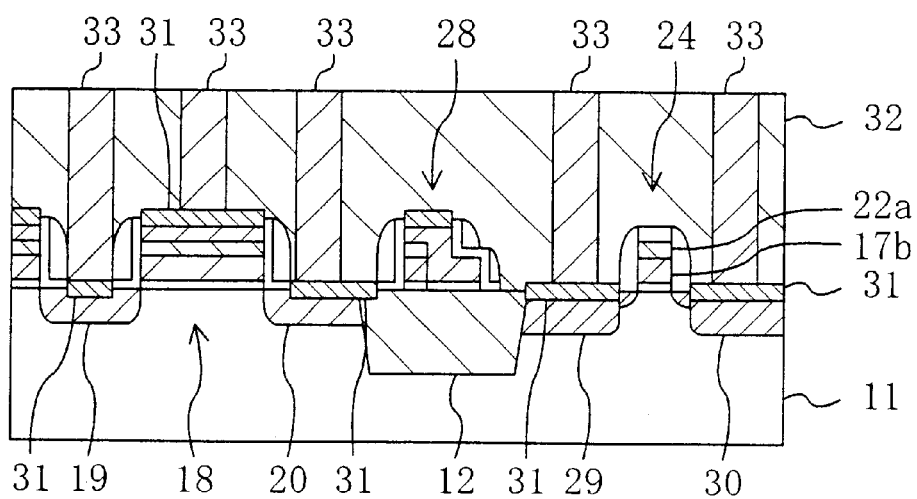

FIGS. 1A through 1N illustrate cross-sectional structures corresponding to respective process steps for fabricating a semiconductor memory device according to the first embodiment. It should be noted that although p- and n-channel transistors are actually formed in the region where a logic circuit will be formed, the illustration of the p-channel transistor is omitted from FIGS. 1A through 1N to make the drawings more easily understandable.

First, in the process step shown in FIG. 1A, an isolation region 12 is defined in a semiconductor substrate 11 of silicon by embedding silicon dioxide in its surface region so that the substrate 11 is partitioned into a region 1 where a memory circuit including multiple storage elements will be formed and a region 2 where a logic circuit or a peripheral circuit for the storage elements will be formed. In the following description, these regions 1 and 2 will be referred to as "memory circuit region" and "logic circuit region", respectively. Thereafter, a first insulating film 13 to be a tunnel insulating film is formed to have a thickness of about 9 nm over the substrate 11 by a thermal oxidation process, for example. Next, a first gate prototype film 14 of polysilicon is deposited to a thickness of about 250 nm over the first insulating film 13 by a CVD process, for example.

Next, in the process step shown in FIG. 1B, a second insulating film 15 to be a capacitive insulating film is formed as a stack of silicon dioxide, silicon nitride and silicon dioxide films (i.e., having a so-called "ONO" structure) on the first gate prototype film 14. Thereafter, a resist pattern 80, covering the memory circuit region 1, is defined on the second insulating film 15. Then, respective parts of the first insulating, first gate prototype and second insulating films 13, 14 and 15 located in the logic circuit region 2 are removed using the resist pattern 80 as a mask. As a result, patterned first insulating, first gate prototype and second insulating films 13, 14 and 15 are left in the memory circuit region 1.

Then, in the process step shown in FIG. 1C, the resist pattern 80 is removed and then a third insulating film 16 to be a gate insulating film is selectively formed to have a thickness of 10 nm on the logic circuit region 2 of the substrate 11. The third insulating film 16 may be formed by a thermal oxidation process, for example. Subsequently, a second gate prototype film 17 of polysilicon is deposited to a thickness of about 100 nm over the second and third insulating films 15 and 16 by a CVD process, for example. Thereafter, phosphorus ($P^+$) ions are implanted at a dose of about $5 \times 10^{15}$ cm$^{-2}$ into the second gate prototype film 17 to make the second gate prototype film 17 exhibit n-type conductivity. Although not shown, part of the second gate prototype film 17 where a p-channel transistor will be formed may be covered with a resist mask in this $P^+$ ion implanting step so that the covered part will exhibit p-type conductivity through the implantation of a p-type dopant in another process step.

Next, in the process step shown in FIG. 1D, a resist pattern 81, covering the entire logic circuit region 2 and part of the memory circuit region 1 where a gate electrode for a storage medium will be formed, is defined on the second gate prototype film 17. Thereafter, using the resist pattern 81 as a mask, the multilayer structure consisting of the first insulating, first gate prototype, second insulating and second gate prototype films 13, 14, 15 and 17 is dry-etched anisotropically. In this manner, tunnel insulating film 13a, floating gate electrode 14a, capacitive insulating film 15a and control gate electrode 17a are formed in the memory circuit region 1 out of the first insulating, first gate prototype, second insulating and second gate prototype films 13, 14, 15 and 17, respectively. In the following description, the gate structure made up of the tunnel insulating film 13a, floating gate electrode 14a, capacitive insulating film 15a and control gate electrode 17a will be referred to as a "memory gate structure" 18. As a result of this dry etching process step, parts of the substrate 11 to be source/drain regions for a storage element are exposed in the memory circuit region 1.

Subsequently, using the resist pattern 81 as a mask, phosphorus ions are implanted into the substrate 11 at a dose of about $2 \times 10^{15}$ cm$^{-2}$ and at an accelerating voltage of about 30 keV, thereby selectively defining source/drain regions 19 and 20 in the substrate 11 beside the memory gate structure 18 in the memory circuit region 1. Next, the resist pattern 81 is removed and then the substrate 11 including the source/drain regions 19 and 20 therein is annealed at about 900° C. This annealing process is performed to repair the ion-implant-induced damage done on the tunnel insulating film 13a and thereby improve the physical properties thereof.

Thereafter, in the process step shown in FIG. 1E, a fourth insulating film of silicon dioxide is deposited to a thickness of about 20 nm over the substrate 11 by a CVD process, for example. Thereafter, part of the fourth insulating film covering the logic circuit region 2 is selectively removed, thereby forming a first passivation film 21 in the memory circuit region 1 out of the fourth insulating film.

Next, in the process step shown in FIG. 1F, a conductor film 22 of tungsten (W), for example, is deposited to a thickness of about 150 nm over the substrate 11 by a CVD, evaporation or sputtering process. In this process step, the memory gate structure 18 is also covered with the conductor film 22. Subsequently, a fifth insulating film 23 of silicon dioxide is deposited to a thickness of about 100 nm over the conductor film 22.

Then, in the process step shown in FIG. 1G, a resist pattern 83, covering part of the logic circuit region 2 where a gate electrode for a logical element will be formed, is defined on the fifth insulating film 23. And using the resist pattern 83 as a mask, the fifth insulating film 23 is etched, thereby forming a second passivation film 23a out of the fifth insulating film 23 on that part of the logic circuit region 2 where a gate electrode for a logical element will be formed.

Thereafter, in the process step shown in FIG. 1H, the resist pattern 83 is removed. Then, using the second passivation film 23a as a mask, the multilayer structure consisting of the third insulating, second gate prototype and conductor films 16, 17 and 22 is dry-etched anisotropically. In this manner, gate insulating film 16a and lower and upper gate electrodes 17b and 22a are formed in the logic circuit region 2 out of the third insulating, second gate prototype and conductor films 16, 17 and 22, respectively. In this process step, the memory circuit region 1 is covered with the first passivation film 21 so the memory gate structure 18 will not be etched. However, some residue 22b of the conductor film 22 will be left on the side faces of the memory gate structure 18. In the illustrated embodiment, a mixture of sulfur hexafluoride ($SF_6$) and chlorine ($Cl_2$) gases is used as an etchant for the conductor film 22 made of W. In the following description, the gate structure made up of the gate insulating film 16a and lower and upper gate electrodes 17b and 22a will be referred to as a "logic gate structure" 24.

Next, in the process step shown in FIG. 1I, a resist pattern 84, covering the logic circuit region 2, is defined. Using this resist pattern 84 as a mask, the residue 22b is etched away isotropically from the memory circuit region 1 and isolation region 12.

Then, in the process step shown in FIG. 1J, the resist pattern 84 is removed and then a resist pattern 85, covering the memory circuit region 1, is defined over the substrate 11. Subsequently, using the resist pattern 85 and logic gate structure 24 including the second passivation film 23a as a mask, arsenic ($As^+$) ions are implanted into the substrate 11 at a dose of about $1 \times 10^{15}$ cm$^{-2}$ and at an accelerating voltage of about 10 keV, thereby defining lightly doped source/drain regions 25 and 26 in the logic circuit region 2. The lightly doped source/drain regions 25 and 26 will be herein referred to as LDD regions 25 and 26 simply.

Thereafter, in the process step shown in FIG. 1K, the resist pattern 85 is removed and a silicon dioxide film is deposited over the substrate 11 and then etched back. In this manner, sidewall insulating films 27A and 27B of silicon dioxide are formed on the side faces of the memory and logic gate structures 18 and 24, respectively. In this process step, parts of the first passivation film 21 that have been exposed on the upper surface of the memory gate structure 18 and on the source/drain regions 19 and 20 are removed. As a result, a sidewall passivation film 21a with an L-cross section is formed out of the first passivation film 21 between the memory gate structure 18 and sidewall insulating film 27A.

Then, in the process step shown in FIG. 1L, a resist pattern 86, covering the memory circuit region 1, is defined over the substrate 11. Subsequently, using the resist pattern 86, logic gate structure 24 including the second passivation film 23a and sidewall insulating film 27B as a mask, As$^+$ ions are implanted again into the substrate 11 at a dose of about $3 \times 10^{15}$ cm$^{-2}$ and at an accelerating voltage of about 30 keV, thereby defining heavily doped source/drain (HDD) regions 29 and 30 in the logic circuit region 2.

Thereafter, in the process step shown in FIG. 1M, the resist pattern 86 is removed and then a cobalt (Co) film is deposited over the substrate 11 by an evaporation or sputtering process, for example. Subsequently, the substrate is annealed at a temperature high enough to cause silicidation reaction between the exposed silicon of the substrate 11 and control gate electrode 17a and the Co film. In this manner, a cobalt silicide layer 31 is selectively formed on the control gate electrode 17a of the memory gate structure 18, source/drain regions 19 and 20 and HDD regions 29 and 30.

Subsequently, in the process step shown in FIG. 1N, an interlevel dielectric film 32 of silicon dioxide is deposited over the substrate 11. Finally, contacts 33 are formed in the interlevel dielectric film 32 so as to make electrical contact with the control gate electrode 17a, source/drain regions 19 and 20 and HDD regions 29 and 30 via the cobalt silicide layer 31.

It should be noted that the structure 28 shown in FIG. 1N is formed out of the respective films deposited on the isolation region 12 every time the storage and logical elements are formed through the above process steps. But this structure 28 has nothing to do with the operation of the semiconductor memory device. The same statement will be applicable to the description of any other embodiment of the present invention.

In the first embodiment, the memory gate structure 18 formed in the memory circuit region 1 includes the floating and control gate electrodes 14a and 17a of polysilicon, and the cobalt silicide layer 31 has been deposited on the control gate electrode 17a. Accordingly, the memory gate structure 18 includes no metal films and the substrate 11 can be annealed to repair the ion-implant-induced damage done on the tunnel insulating film 13a in the process step shown in FIG. 1D. As a result, the tunnel insulating film 13a can have its reliability improved.

On the other hand, the logic gate structure 24 formed in the logic circuit region 2 is a so-called "poly-metal gate" including the upper and lower gate electrodes 22a and 17b of tungsten and polysilicon, respectively. Accordingly, the gate structure 24 can have a lower resistance. That is to say, although the logic gate structure 24 includes the upper gate electrode 22a made of metal tungsten, the memory gate structure 18 includes no metal film of tungsten.

In the first embodiment, parts of the third insulating film 16 located on those areas of the logic circuit region 2 where HDD regions 29 and 30 will be defined are removed completely to expose the surface of the substrate 11 there in the process step shown in FIG. 1H. Alternatively, those parts of the third insulating film 16 may be left over those areas of the logic circuit region 2 in the process step shown in FIG. 1H. In that case, those parts of the third insulating film 16 remaining on the LDD regions 25 and 26 may be removed in the process step shown in FIG. 1K.

Embodiment 2

Hereinafter, a second embodiment of the present invention will be described with reference to the accompanying drawings.

Figure 2A:
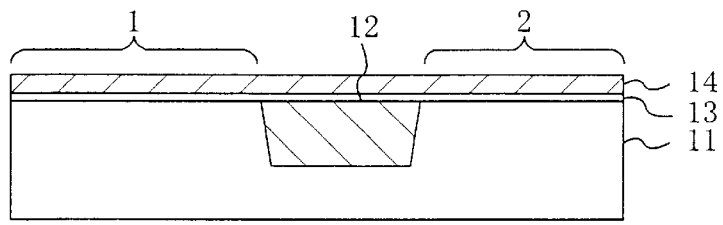
FIGS. 2A through 2O are cross-sectional views illustrating respective process steps for fabricating a semiconductor memory device according to a second embodiment of the present invention.
Figure 2B:
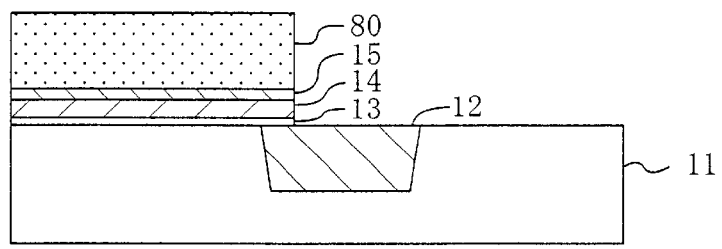
Figure 2C:
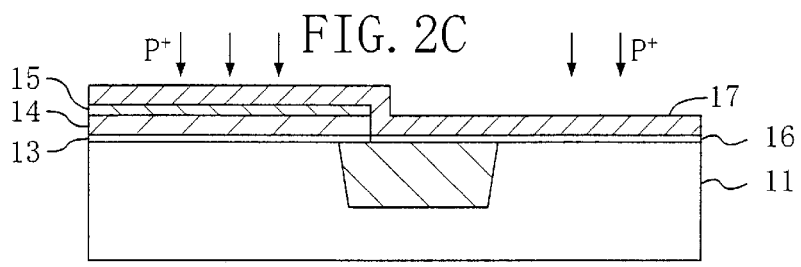
Figure 2D:
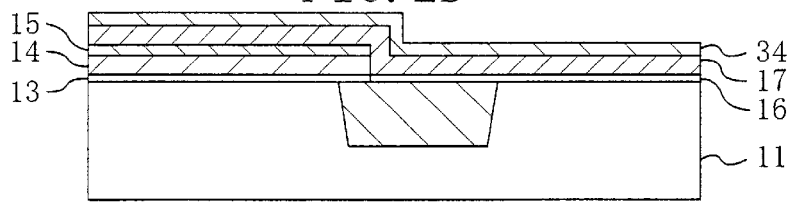
Figure 2E:
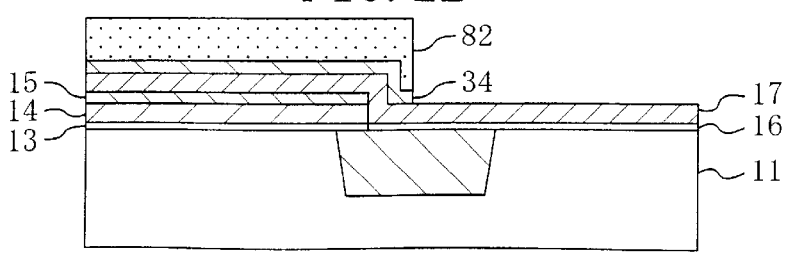
Figure 2J:
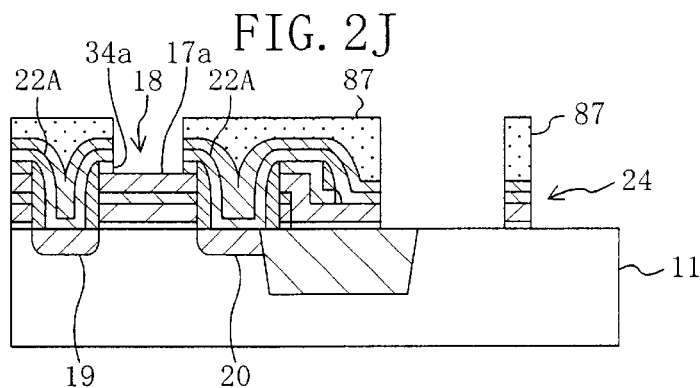
Figure 2K:
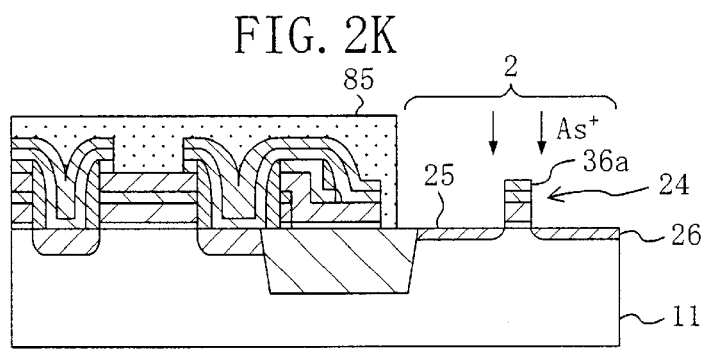
Figure 2L:
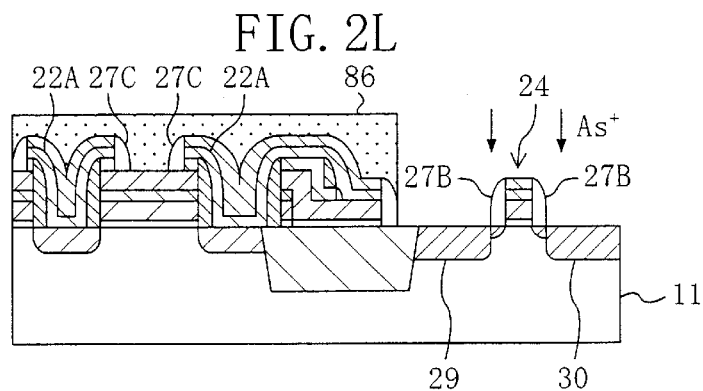
Figure 2M:
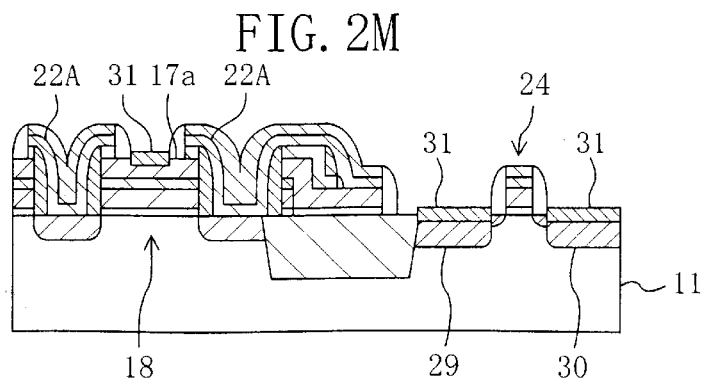
Figure 2N:
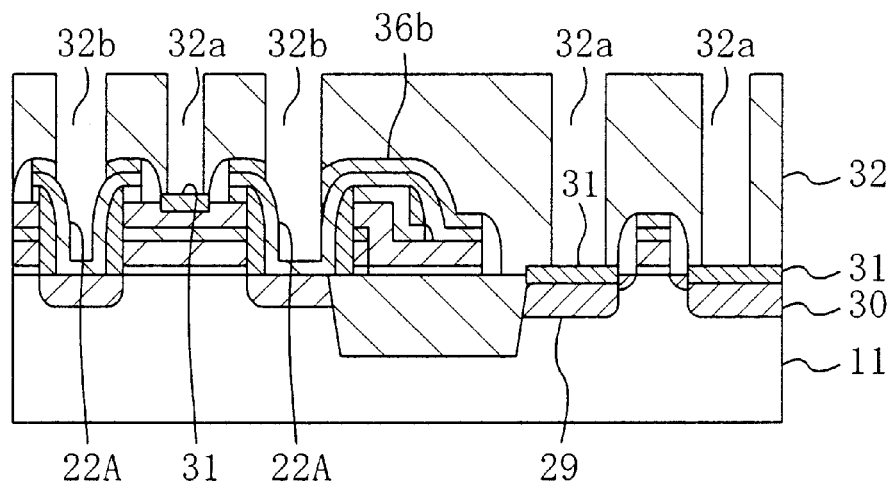
Figure 2O:
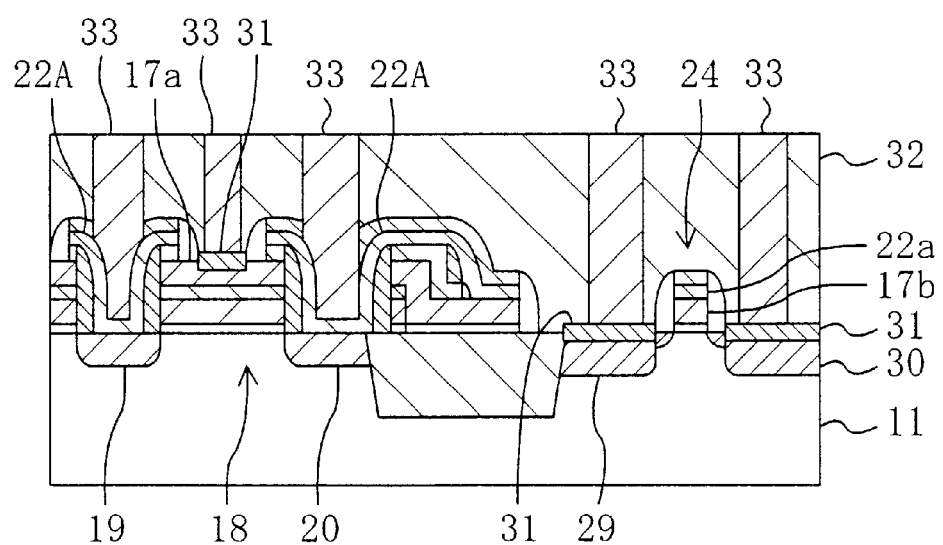

FIGS. 2A through 2O illustrate cross-sectional structures corresponding to respective process steps for fabricating a semiconductor memory device according to the second embodiment. It should be noted that although p- and n-channel transistors are actually formed in the logic circuit region, the illustration of the p-channel transistor is omitted from FIGS. 2A through 2O because of the reasons already described for the first embodiment.

The second embodiment of the present invention is characterized by forming an upper gate electrode for the logic gate structure and contact pads for the memory circuit region 1 out of the same conductor film in a single process step. As used herein, the "contact pads" mean electrode pads interposed between source/drain regions and contacts to reduce the contact resistance of the contacts that electrically connect the source/drain regions to an external unit.

First, in the process step shown in FIG. 2A, an isolation region 12 is defined in a semiconductor substrate 11 of silicon by embedding silicon dioxide in its surface region so that the substrate 11 is partitioned into a memory circuit region 1 and a logic circuit region 2. Thereafter, a first insulating film 13 to be a tunnel insulating film is formed to have a thickness of about 9 nm over the substrate 11 by a thermal oxidation process, for example. Next, a first gate prototype film 14 of polysilicon is deposited to a thickness of about 250 nm over the first insulating film 13 by a CVD process, for example.

Next, in the process step shown in FIG. 2B, a second insulating film 15 to be a capacitive insulating film is formed as a stack of silicon dioxide, silicon nitride and silicon dioxide films (i.e., having a so-called "ONO" structure) on the first gate prototype film 14. Thereafter, a resist pattern 80, covering the memory circuit region 1, is defined on the second insulating film 15. Then, respective parts of the first insulating, first gate prototype and second insulating films 13, 14 and 15 located in the logic circuit region 2 are removed using the resist pattern 80 as a mask.

Then, in the process step shown in FIG. 2C, the resist pattern 80 is removed and then a third insulating film 16 to be a gate insulating film is selectively formed to have a thickness of 10 nm on the logic circuit region 2 of the substrate 11. The third insulating film 16 may be formed by a thermal oxidation process, for example. Subsequently, a second gate prototype film 17 of polysilicon is deposited to a thickness of about 100 nm over the second and third insulating films 15 and 16 by a CVD process, for example. Thereafter, P$^+$ ions are implanted at a dose of about $5 \times 10^{15}$ cm$^{-2}$ into the second gate prototype film 17 to make the second gate prototype film 17 exhibit n-type conductivity. Although not shown, part of the second gate prototype film 17 where a p-channel transistor will be formed may be covered with a resist mask in this P$^+$ ion implanting step so that the covered part will exhibit p-type conductivity through implantation of a p-type dopant in a subsequent process step.

Next, in the process step shown in FIG. 2D, a fourth insulating film 34 of silicon nitride is deposited to a thickness of about 200 nm over the second gate prototype film 17 by a CVD process, for example.

Thereafter, in the process step shown in FIG. 2E, a resist pattern 82, covering the memory circuit region 1, is defined on the fourth insulating film 34. Then, using the resist pattern 82 as a mask, part of the fourth insulating film 34 located in the logic circuit region 2 is removed.

Subsequently, in the process step shown in FIG. 2F, the resist pattern 82 is removed and instead a resist pattern 81, covering the entire logic circuit region 2 and part of the memory circuit region 1 where a memory gate structure will be formed, is defined. Thereafter, using the resist pattern 81 as a mask, the multilayer structure consisting of the first insulating, first gate prototype, second insulating, second gate prototype and fourth insulating films 13, 14, 15, 17 and 34 is dry-etched anisotropically. In this manner, tunnel insulating film 13a, floating gate electrode 14a, capacitive insulating film 15a, control gate electrode 17a and first passivation film 34a are formed in the memory circuit region 1 out of the first insulating, first gate prototype, second insulating, second gate prototype and fourth insulating films 13, 14, 15, 17 and 34, respectively. In the following description, the gate structure made up of the tunnel insulating film 13a, floating gate electrode 14a, capacitive insulating film 15a and control gate electrode 17a will be referred to as a "memory gate structure" 18.

Subsequently, using the resist pattern 81 as a mask, phosphorus ions are implanted into the substrate 11 at a dose of about $2 \times 10^{15}$ cm$^{-2}$ and at an accelerating voltage of about 30 keV, thereby selectively defining source/drain regions 19 and 20 in the substrate 11 beside the memory gate structure 18 in the memory circuit region 1. Next, the resist pattern 81 is removed and then the substrate 11 including the source/drain regions 19 and 20 therein is annealed at about 900° C. This annealing process is performed to repair the ion-implant-induced damage done on the tunnel insulating film 13a and thereby improve the physical properties thereof.

Thereafter, in the process step shown in FIG. 2G, a silicon nitride film is deposited over the substrate 11 by a CVD process and then etched back, thereby forming a sidewall insulating film 35 of silicon nitride on the side faces of the memory gate structure 18 in the gate length direction.

Next, in the process step shown in FIG. 2H, a conductor film 22 of tungsten (W), for example, is deposited to a thickness of about 150 nm over the substrate 11 by a CVD, evaporation or sputtering process. In this process step, the memory gate structure 18 is also covered with the conductor film 22. Subsequently, a fifth insulating film 36 of silicon nitride is deposited to a thickness of about 100 nm over the conductor film 22.

Then, in the process step shown in FIG. 2I, a resist pattern 87 is defined over the substrate 11. The resist pattern 87 includes a contact pad defining pattern covering the source/drain regions 19 and 20 and having an opening 87a over the memory gate structure 18. The resist pattern 87 also includes a pattern covering part of the logic circuit region 2 where a logic gate structure will be formed. And using this resist pattern 87 as a mask, the third insulating, second gate prototype, conductor and fifth insulating films 16, 17, 22 and 36 are dry-etched anisotropically. In this manner, gate insulating film 16a, lower and upper gate electrodes 17b and 22a and second passivation film 36a are formed in the logic circuit region 2 out of the third insulating, second gate prototype, conductor and fifth insulating films 16, 17, 22 and 36, respectively. In the memory circuit region 1 on the other hand, second passivation film 36b and contact pads 22A are also formed out of the fifth insulating and conductor films 36 and 22, respectively, so as to be self-aligned with the memory gate structure 18. The contact pads 22A are electrically connected to the source/drain regions 19 and 20 and cover the upper surface of the source/drain regions 19 and 20 and the side faces and upper edges of the memory gate structure 18. In the following description, a gate structure, which has been formed in the logic circuit region 2 to include the gate insulating film 16a and lower and upper gate electrodes 17b and 22a, will be referred to as a "logic gate structure" 24.

Once the conductor film 22 of tungsten has been etched, the first passivation film 34a of silicon nitride is exposed in the memory circuit region 1 and the second gate prototype film 17 of polysilicon is exposed in the logic circuit region 2. However, if the etchant used realizes a polysilicon etch rate greater than a silicon nitride etch rate, then the first passivation film 34a will function as a protective film that prevents the memory gate structure 18 from being etched.

Thereafter, in the process step shown in FIG. 2J, the part of the first passivation film 34a exposed on the memory gate structure 18 is etched away using the resist pattern 87 as a mask, thereby exposing the surface of the control gate electrode 17a. As a result, the first passivation film 34a is partially left at the upper edges of the memory gate structure 18.

Then, in the process step shown in FIG. 2K, the resist pattern 87 is removed and then a resist pattern 85, covering the memory circuit region 1, is defined over the substrate 11. Subsequently, using the resist pattern 85 and logic gate structure 24 including the second passivation film 36a as a mask, As$^+$ ions are implanted into the substrate 11 at a dose of about $1 \times 10^{15}$ cm$^{-2}$ and at an accelerating voltage of about 10 keV, thereby defining LDD regions 25 and 26 in the logic circuit region 2.

Thereafter, in the process step shown in FIG. 2L, the resist pattern 85 is removed and a silicon dioxide film is deposited over the substrate 11 and then etched back. In this manner, sidewall insulating films 27C and 27B of silicon dioxide are formed on the side edges of the contact pads 22A and on the side faces of the logic gate structure 24, respectively. Then, a resist pattern 86, covering the memory circuit region 1, is defined over the substrate 11. Subsequently, using the resist pattern 86, logic gate structure 24 including the second passivation film 36a and sidewall insulating film 27B as a mask, As$^+$ ions are implanted again into the substrate 11 at a dose of about $3 \times 10^{15}$ cm$^{-2}$ and at an accelerating voltage of about 30 keV, thereby defining HDD regions 29 and 30 in the logic circuit region 2.

Thereafter, in the process step shown in FIG. 2M, the resist pattern 86 is removed and then a Co film is deposited over the substrate 11 by an evaporation or sputtering process, for example. Subsequently, the substrate is annealed at a temperature high enough to cause silicidation reaction between the exposed silicon of the substrate 11 and control gate electrode 17a and the Co film. In this manner, a cobalt silicide layer 31 is selectively formed on the control gate electrode 17a of the memory gate structure 18 and HDD regions 29 and 30.

Subsequently, in the process step shown in FIG. 2N, an interlevel dielectric film 32 of silicon dioxide, for example, is deposited over the substrate 11. Next, a first group of openings 32a are formed in the interlevel dielectric film 32 to expose parts of the cobalt silicide layer 31 on the memory gate structure 18 and on the HDD regions 29 and 30. Subsequently, a second group of openings 32b are formed in the interlevel dielectric film 32 to expose the contact pads 22A. That is to say, the first group of openings 32a are formed by etching silicon dioxide for the interlevel dielectric film 32, while the second group of openings 32b are formed by silicon dioxide and silicon nitride for the interlevel dielectric film 32 and second passivation film 36b.

Thereafter, in the process step shown in FIG. 2O, the first and second groups of openings 32a and 32b of the interlevel dielectric film 32 are filled in with a metal film of tungsten, for example, by an evaporation or sputtering process. In this manner, contacts 33 are formed so as to make electrical contact with the control gate electrode 17a, source/drain regions 19 and 20 and HDD regions 29 and 30. In this case, the control gate electrode 17a and HDD regions 29 and 30 are connected to the contacts 33 via the cobalt silicide layer 31, while the source/drain regions 19 and 20 are connected to the contacts 33 via the contact pads 22A.

In the second embodiment, the memory gate structure 18 includes the floating and control gate electrodes 14a and 17a of polysilicon, and the cobalt silicide layer 31 has been deposited on part of the upper surface of the control gate electrode 17a. That is to say, the memory gate structure 18 does not include the conductor film 22 of tungsten that forms part of the logic gate structure 24. Accordingly, the substrate 11 can be annealed to repair the ion-implant-induced damage done on the tunnel insulating film 13a after the source/drain regions 19 and 20 have been defined for storage element. As a result, the tunnel insulating film 13a can have its reliability improved.

In addition, the logic gate structure 24 formed in the logic circuit region 2 is a so-called "poly-metal gate" including the upper and lower gate electrodes 22a and 17b made of tungsten and polysilicon, respectively. Accordingly, the gate structure 24 can have a lower resistance.

Furthermore, the contact pads 22A can be formed out of the conductor film 22 over the source/drain regions 19 and 20 for storage element when the logic gate structure 24 is formed by patterning its associated multilayer structure including the conductor film 22. As a result, the storage and logical elements can have their resistance reduced and the memory circuit region 1 can have its area reduced without increasing the number of process steps.

Embodiment 3

Hereinafter, a third embodiment of the present invention will be described with reference to the accompanying drawings.

Figure 3A:
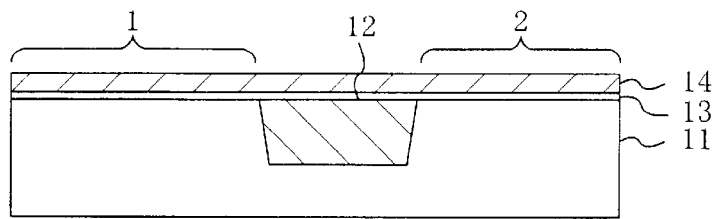
FIGS. 3A through 3P are cross-sectional views illustrating respective process steps for fabricating a semiconductor memory device according to a third embodiment of the present invention.
Figure 3B:
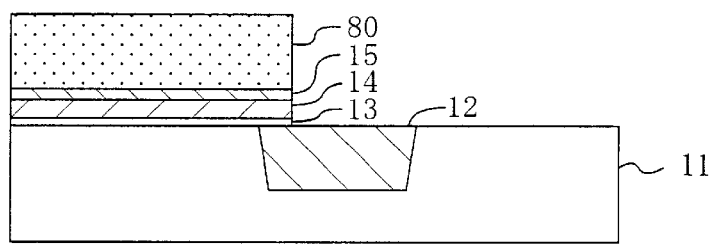
Figure 3C:
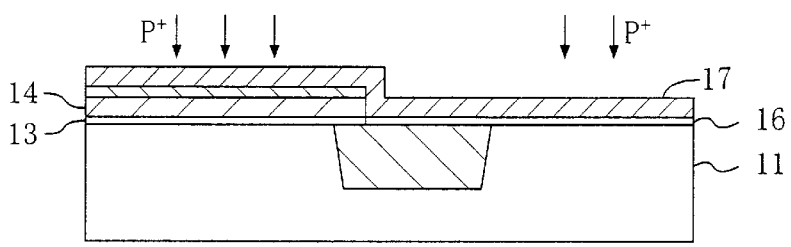
Figure 3D:
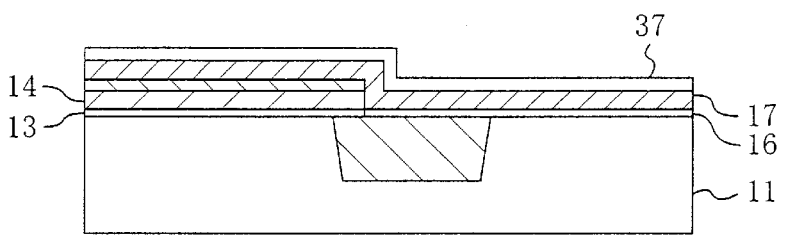
Figure 3E:
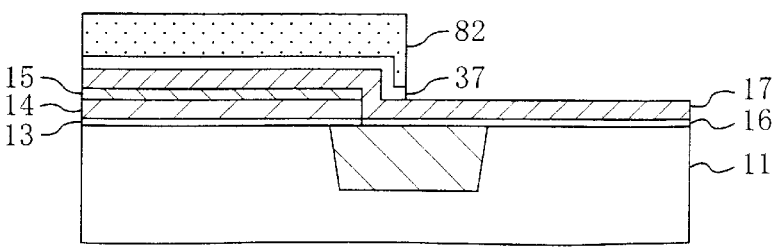
Figure 3F:
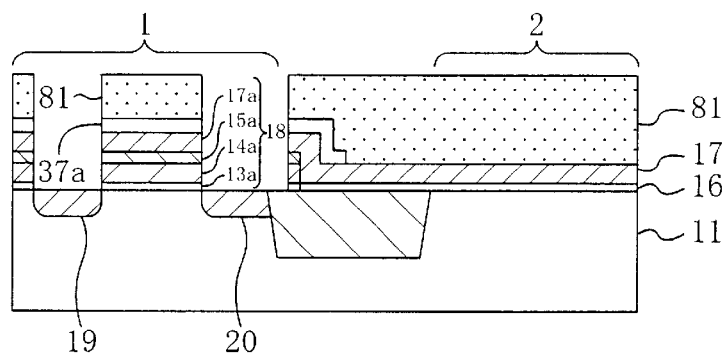
Figure 3G:
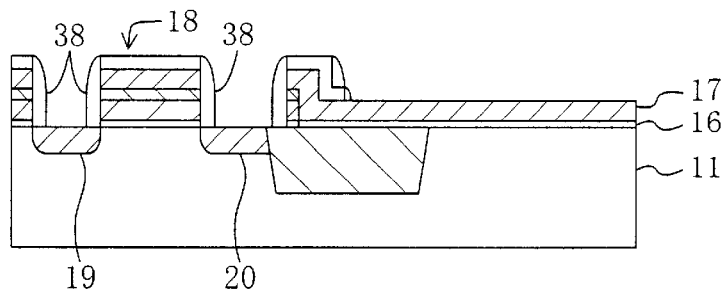
Figure 3H:
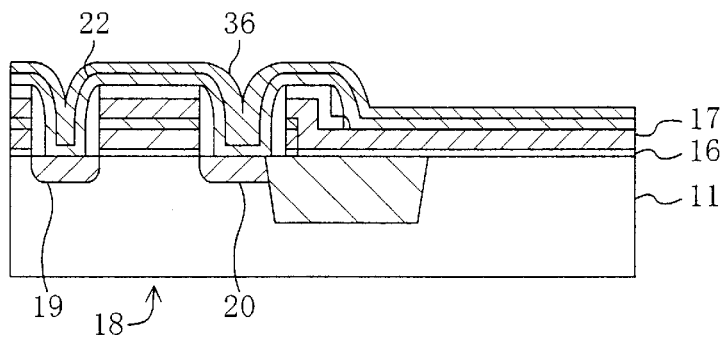
Figure 3I:
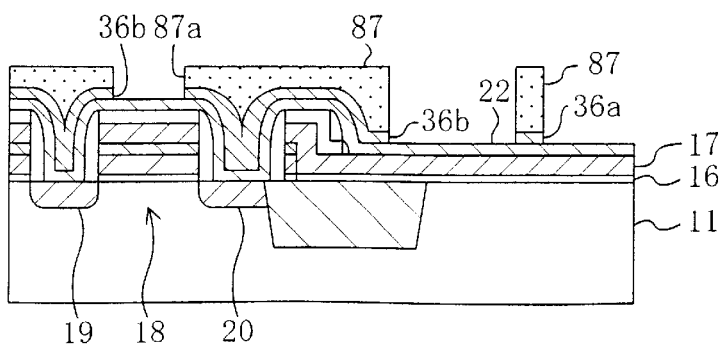
Figure 3J:
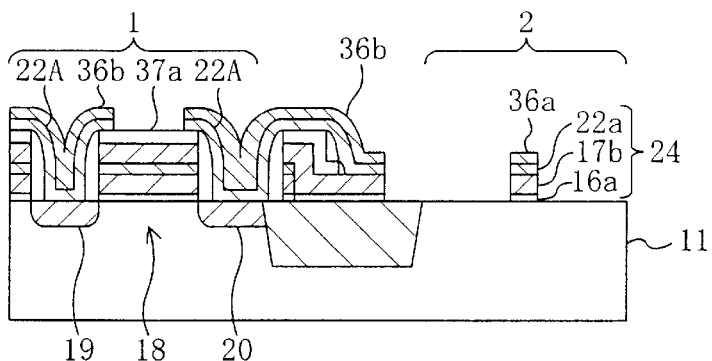
Figure 3K:
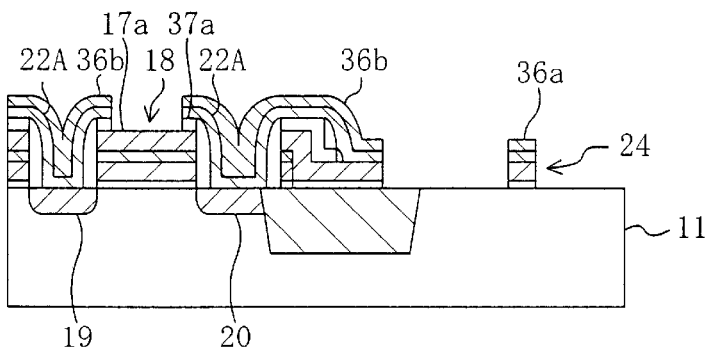
Figure 3L:
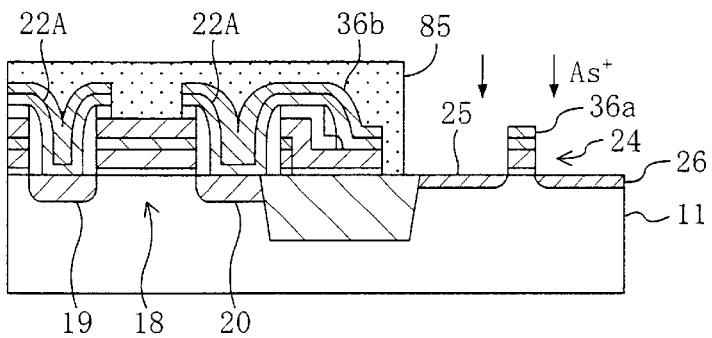
Figure 3M:
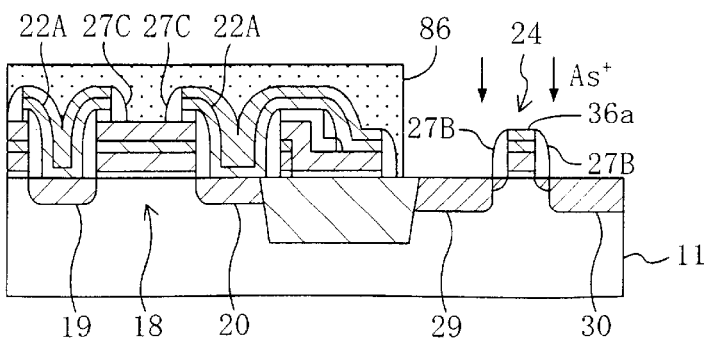
Figure 3N:
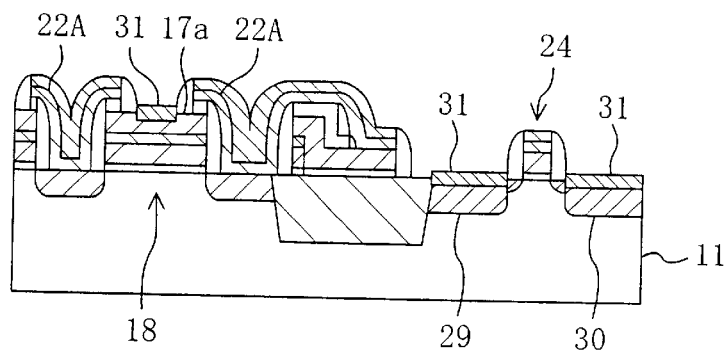
Figure 3O:
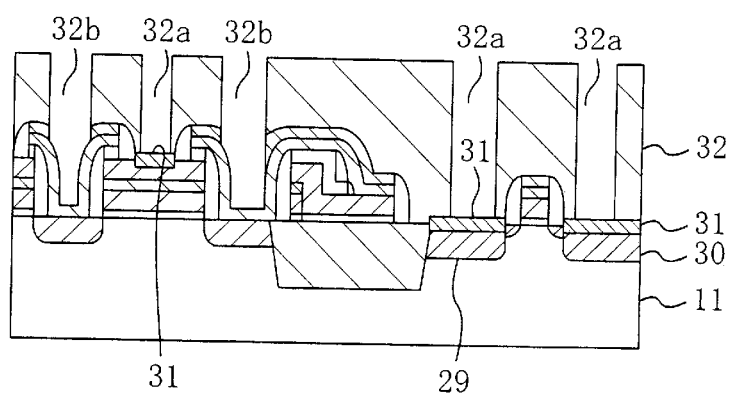
Figure 3P:
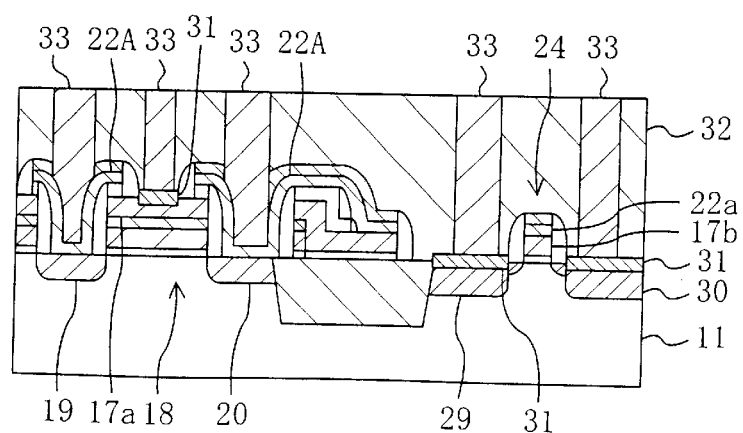

FIGS. 3A through 3P illustrate cross-sectional structures corresponding to respective process steps for fabricating a semiconductor memory device according to the third embodiment. It should be noted that although p- and n-channel transistors are actually formed in the logic circuit region, the illustration of the p-channel transistor is omitted from FIGS. 3A through 3P because of the reasons already described for the first embodiment.

The third embodiment of the present invention is characterized by using an insulating film as a hard mask for forming logic gate structure and contact pads by patterning their associated multilayer structures.

First, in the process step shown in FIG. 3A, an isolation region 12 is defined in a semiconductor substrate 11 of silicon by embedding silicon dioxide in its surface region so that the substrate 11 is partitioned into a memory circuit region 1 and a logic circuit region 2. Thereafter, a first insulating film 13 to be a tunnel insulating film is formed to have a thickness of about 9 nm over the substrate 11 by a thermal oxidation process, for example. Next, a first gate prototype film 14 of polysilicon is deposited to a thickness of about 250 nm over the first insulating film 13 by a CVD process, for example.

Next, in the process step shown in FIG. 3B, a second insulating film 15 to be a capacitive insulating film is formed as a stack of silicon dioxide, silicon nitride and silicon dioxide films (i.e., having a so-called "ONO" structure) on the first gate prototype film 14. Thereafter, a resist pattern 80, covering the memory circuit region 1, is defined on the second insulating film 15. Then, respective parts of the first insulating, first gate prototype and second insulating films 13, 14 and 15 located in the logic circuit region 2 are removed using the resist pattern 80 as a mask.

Then, in the process step shown in FIG. 3C, the resist pattern 80 is removed and then a third insulating film 16 to be a gate insulating film is selectively formed to have a thickness of 10 nm on the logic circuit region 2 of the substrate 11. The third insulating film 16 may be formed by a thermal oxidation process, for example. Subsequently, a second gate prototype film 17 of polysilicon is deposited to a thickness of about 100 nm over the second and third insulating films 15 and 16 by a CVD process, for example. Thereafter, $P^+$ ions are implanted at a dose of about $5 \times 10^{15}$ $cm^{-2}$ into the second gate prototype film 17 to make the second gate prototype film 17 exhibit n-type conductivity. Although not shown, part of the second gate prototype film 17 where a p-channel transistor will be formed may be covered with a resist mask in this $P^+$ ion implanting step so that the covered part will exhibit p-type conductivity through implantation of a p-type dopant in a subsequent process step.

Next, in the process step shown in FIG. 3D, a fourth insulating film 37 of silicon dioxide is deposited to a thickness of about 200 nm over the second gate prototype film 17 by a CVD process, for example.

Thereafter, in the process step shown in FIG. 3E, a resist pattern 82, covering the memory circuit region 1, is defined on the fourth insulating film 37. Then, using the resist pattern 82 as a mask, part of the fourth insulating film 37 located in the logic circuit region 2 is removed.

Subsequently, in the process step shown in FIG. 3F, the resist pattern 82 is removed and instead a resist pattern 81, covering the entire logic circuit region 2 and part of the memory circuit region 1 where a memory gate structure will be formed, is defined. Thereafter, using the resist pattern 81 as a mask, the multilayer structure consisting of the first insulating, first gate prototype, second insulating, second gate prototype and fourth insulating films 13, 14, 15, 17 and 37 is dry-etched anisotropically. In this manner, tunnel insulating film 13a, floating gate electrode 14a, capacitive insulating film 15a, control gate electrode 17a and first passivation film 37a are formed in the memory circuit region 1 out of the first insulating, first gate prototype, second insulating, second gate prototype and fourth insulating films 13, 14, 15, 17 and 37, respectively. In the following description, the gate structure made up of the tunnel insulating film 13a, floating gate electrode 14a, capacitive insulating film 15a and control gate electrode 17a will be referred to as a "memory gate structure" 18.

Subsequently, using the resist pattern 81 as a mask, phosphorus ions are implanted into the substrate 11 at a dose of about $2 \times 10^{15}$ $cm^{-2}$ and at an accelerating voltage of about 30 keV, thereby selectively defining source/drain regions 19 and 20 in the substrate 11 beside the memory gate structure 18 in the memory circuit region 1. Next, the resist pattern 81 is removed and then the substrate 11 including the source/drain regions 19 and 20 therein is annealed at about 900° C. This annealing process is performed to repair the ion-implant-induced damage done on the tunnel insulating film 13a and thereby improve the physical properties thereof.

Thereafter, in the process step shown in FIG. 3G, a silicon dioxide film is deposited over the substrate 11 by a CVD process and then etched back, thereby forming a sidewall insulating film 38 of silicon dioxide on the side faces of the memory gate structure 18 in the gate length direction.

Next, in the process step shown in FIG. 3H, a conductor film 22 of tungsten (W), for example, is deposited to a thickness of about 150 nm over the substrate 11 by a CVD, evaporation or sputtering process. In this process step, the memory gate structure 18 is also covered with the conductor film 22. Subsequently, a fifth insulating film 36 of silicon nitride is deposited to a thickness of about 100 nm over the conductor film 22.

Then, in the process step shown in FIG. 3I, a resist pattern 87 is defined over the substrate 11. The resist pattern 87 includes a contact pad defining pattern covering the source/drain regions 19 and 20 and having an opening 87a over the memory gate structure 18. The resist pattern 87 also includes a pattern covering part of the logic circuit region 2 where a logic gate structure will be formed. Subsequently, using this resist pattern 87 as a mask, the fifth insulating film 36 is dry-etched. As a result, a second passivation film 36a and 36b is formed out of the fifth insulating film 36 in the logic and memory circuit regions 2 and 1, respectively. The second passivation film 36a will be used as a mask for defining a logic gate structure in the next process step. On the other hand, the second passivation film 36b will be used as a contact pad defining pattern in the next process step.

Next, in the process step shown in FIG. 3J, the resist pattern 87 is removed. Thereafter, using the second passivation film 36a and 36b as a mask, the third insulating, second gate prototype and conductor films 16, 17 and 22 are dry-etched anisotropically. In this manner, gate insulating film 16a and lower and upper gate electrodes 17b and 22a are formed in the logic circuit region 2 out of the third insulating, second gate prototype and conductor films 16, 17 and 22, respectively. In the memory circuit region 1 on the other hand, contact pads 22A are also formed out of the conductor film 22 so as to be self-aligned with the memory gate structure 18. The contact pads 22A are electrically connected to the source/drain regions 19 and 20 and cover the upper surface of the source/drain regions 19 and 20 and the side faces and upper edges of the memory gate structure 18. In the following description, a gate structure, which has been formed in the logic circuit region 2 to include the gate insulating film 16a and lower and upper gate electrodes 17b and 22a, will be referred to as a "logic gate structure" 24.

Once the conductor film 22 of tungsten has been etched, the first passivation film 37a of silicon dioxide is exposed in the memory circuit region 1 and the second gate prototype film 17 of polysilicon is exposed in the logic circuit region 2. However, if the etchant used realizes a polysilicon etch rate greater than a silicon dioxide etch rate, then the first passivation film 37a will function as a protective film that prevents the memory gate structure 18 from being etched.

Thereafter, in the process step shown in FIG. 3K, the part of the first passivation film 37a exposed on the memory gate structure 18 is etched away using the second passivation film 36b as a mask, thereby exposing the surface of the control gate electrode 17a. As a result, the first passivation film 37a is partially left at the upper edges of the memory gate structure 18.

Then, in the process step shown in FIG. 3L, a resist pattern 85, covering the memory circuit region 1, is defined over the substrate 11. Subsequently, using the resist pattern 85 and logic gate structure 24 including the second passivation film 36a as a mask, As$^+$ ions are implanted into the substrate 11 at a dose of about $1\times10^{15}$ cm$^{-2}$ and at an accelerating voltage of about 10 keV, thereby defining LDD regions 25 and 26 in the logic circuit region 2.

Thereafter, in the process step shown in FIG. 3M, the resist pattern 85 is removed and a silicon dioxide film is deposited over the substrate 11 and then etched back. In this manner, sidewall insulating films 27C and 27B of silicon dioxide are formed on the side edges of the contact pads 22A and on the side faces of the logic gate structure 24, respectively. Then, a resist pattern 86, covering the memory circuit region 1, is defined over the substrate 11. Subsequently, using the resist pattern 86, logic gate structure 24 including the second passivation film 36a and sidewall insulating film 27B as a mask, As$^+$ ions are implanted again into the substrate 11 at a dose of about $3\times10^{15}$ cm$^{-2}$ and at an accelerating voltage of about 30 keV, thereby defining HDD regions 29 and 30 in the logic circuit region 2.

Thereafter, in the process step shown in FIG. 3N, the resist pattern 86 is removed and then a Co film is deposited over the substrate 11 by an evaporation or sputtering process, for example. Subsequently, the substrate is annealed at a temperature high enough to cause silicidation reaction between the exposed silicon of the substrate 11 and control gate electrode 17a and the Co film. In this manner, a cobalt silicide layer 31 is selectively formed on the control gate electrode 17a of the memory gate structure 18 and HDD regions 29 and 30.

Subsequently, in the process step shown in FIG. 3O, an interlevel dielectric film 32 of silicon dioxide, for example, is deposited over the substrate 11. Next, a first group of openings 32a are formed in the interlevel dielectric film 32 to expose parts of the cobalt silicide layer 31 on the memory gate structure 18 and on the HDD regions 29 and 30. Subsequently, a second group of openings 32b are formed in the interlevel dielectric film 32 to expose the contact pads 22A.

Thereafter, in the process step shown in FIG. 3P, the first and second groups of openings 32a and 32b of the interlevel dielectric film 32 are filled in with a metal film of tungsten, for example, by an evaporation or sputtering process. In this manner, contacts 33 are formed so as to make electrical contact with the control gate electrode 17a, source/drain regions 19 and 20 and HDD regions 29 and 30. In this case, the control gate electrode 17a and HDD regions 29 and 30 are connected to the contacts 33 via the cobalt silicide layer 31, while the source/drain regions 19 and 20 are connected to the contacts 33 via the contact pads 22A.

In the third embodiment, the memory gate structure 18 includes the floating and control gate electrodes 14a and 17a made of polysilicon, and the cobalt silicide layer 31 has been deposited on part of the upper surface of the control gate electrode 17a. That is to say, the memory gate structure 18 does not include the conductor film 22 of tungsten that forms part of the logic gate structure 24. Accordingly, the substrate 11 can be annealed to repair the ion-implant-induced damage done on the tunnel insulating film 13a after the source/drain regions 19 and 20 have been defined for storage element. As a result, the tunnel insulating film 13a can have its reliability improved.

In addition, the logic gate structure 24 formed in the logic circuit region 2 is a so-called "poly-metal gate" including the upper and lower gate electrodes 22a and 17b made of tungsten and polysilicon, respectively. Accordingly, the gate structure 24 can have a lower resistance.

Furthermore, the contact pads 22A can be formed out of the conductor film 22 over the source/drain regions 19 and 20 for storage element when the logic gate structure 24 is formed by patterning its associated multilayer structure including the conductor film 22. As a result, the storage and logical elements can have their resistance reduced and the memory circuit region 1 can have its area reduced without increasing the number of process steps.

Particularly, in the third embodiment, the logic gate structure 24 and contact pads 22A are formed in the process step shown in FIG. 3J using, as a mask, the second passivation film 36a and 36b that has been formed out of the fifth insulating film 36 of silicon nitride. Generally speaking, when a resist film is used, part of the resultant resist pattern might have its size increased unintentionally due to unwanted deposition of polymers of the resist material, thus possibly making it difficult to define a desired fine-line pattern for a gate electrode. However, when the second passivation film 36a and 36b is used as a hard mask instead of a normal resist film, the unwanted situation like that is avoidable.

Also, when the control gate electrode 17a of the memory gate structure 18 should be exposed in the process step shown in FIG. 3K, the first passivation film 37a is removable just as intended. This is because the second passivation film 36b as a mask is made of silicon nitride while the first passivation film 37a on the memory gate structure 18 is made of silicon dioxide. As a result, the process increases its stability.

Embodiment 4

Hereinafter, a fourth embodiment of the present invention will be described with reference to the accompanying drawings.

Figure 4A:
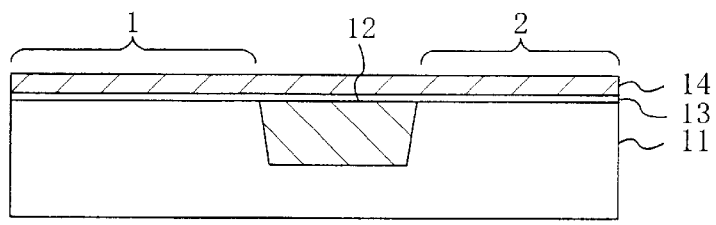
FIGS. 4A through 4P are cross-sectional views illustrating respective process steps for fabricating a semiconductor memory device according to a fourth embodiment of the present invention.
Figure 4B:
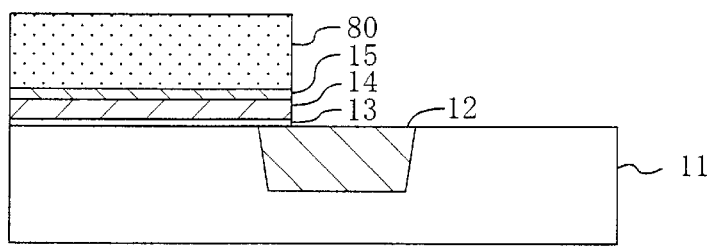
Figure 4C:
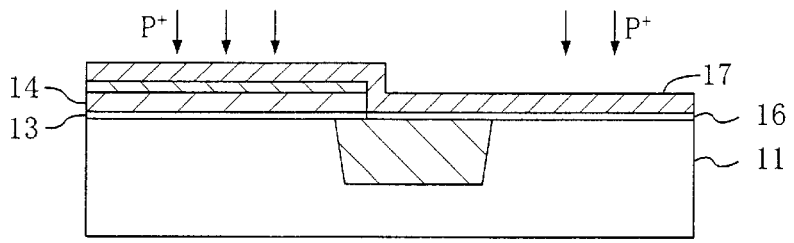
Figure 4D:
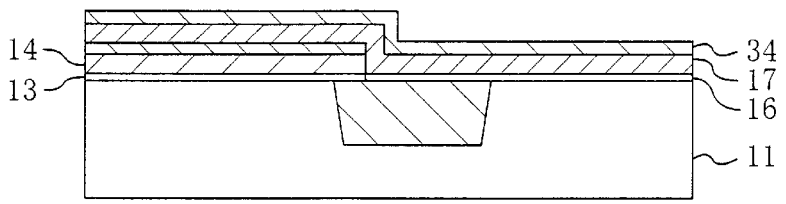
Figure 4E:
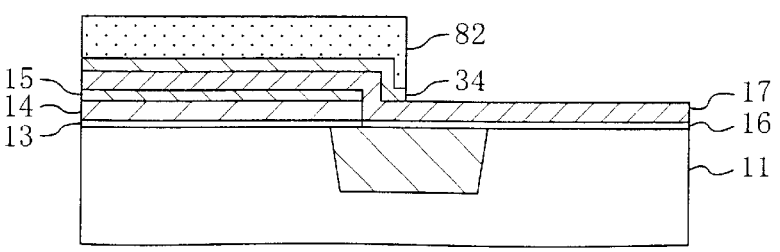
Figure 4F:
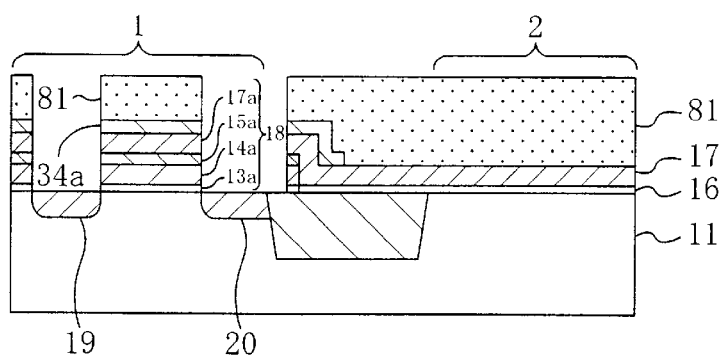
Figure 4G:
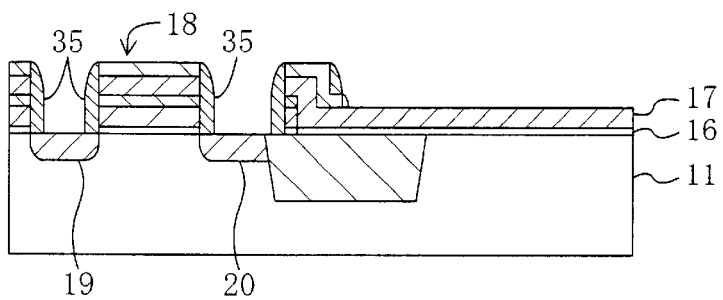
Figure 4H:
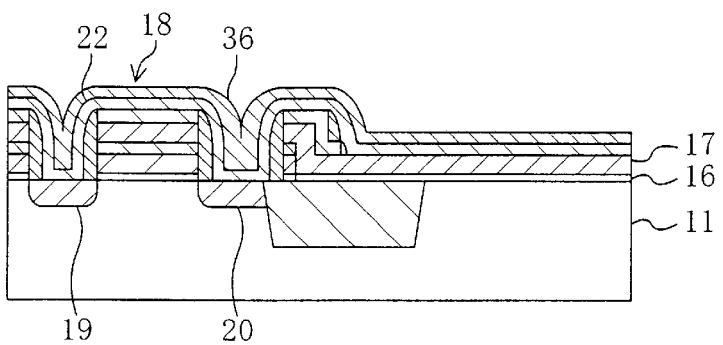
Figure 4I:
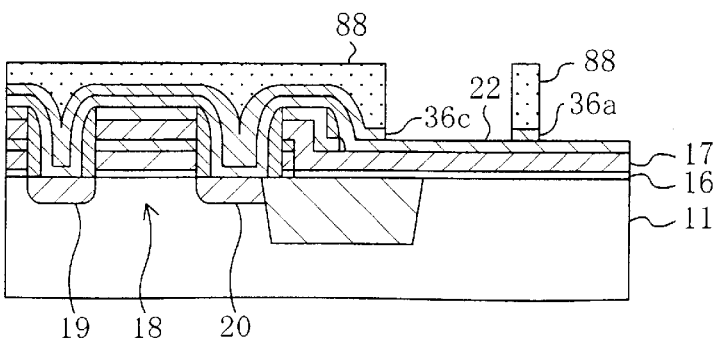
Figure 4J:
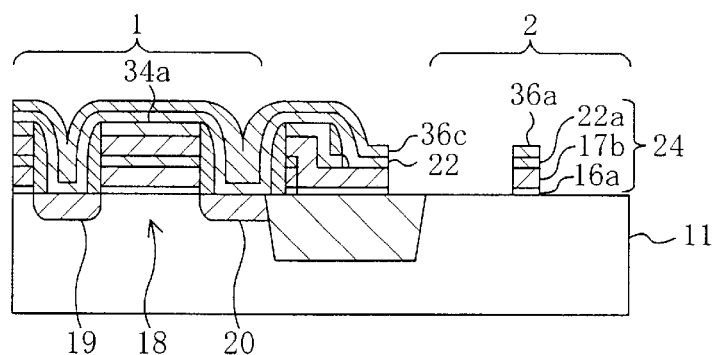
Figure 4K:
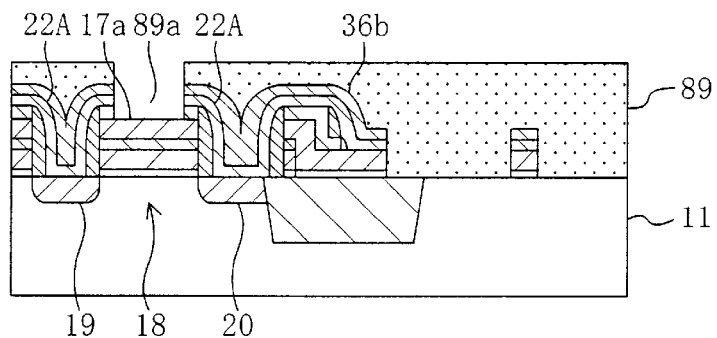
Figure 4L:
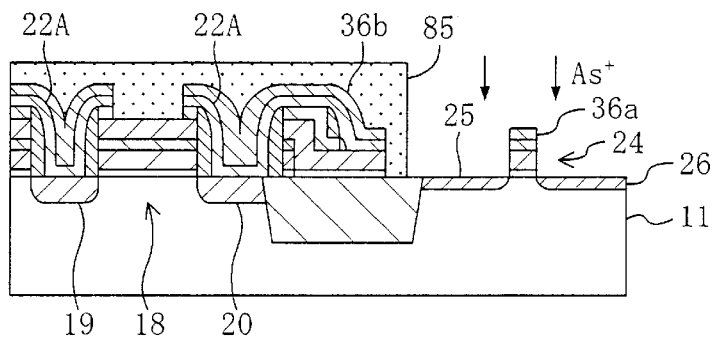
Figure 4M:
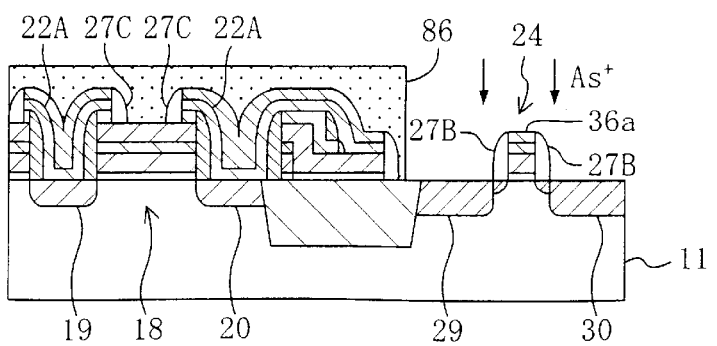
Figure 4N:
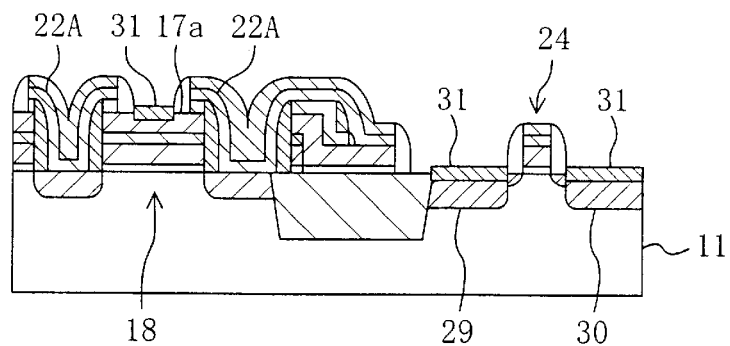
Figure 4O:
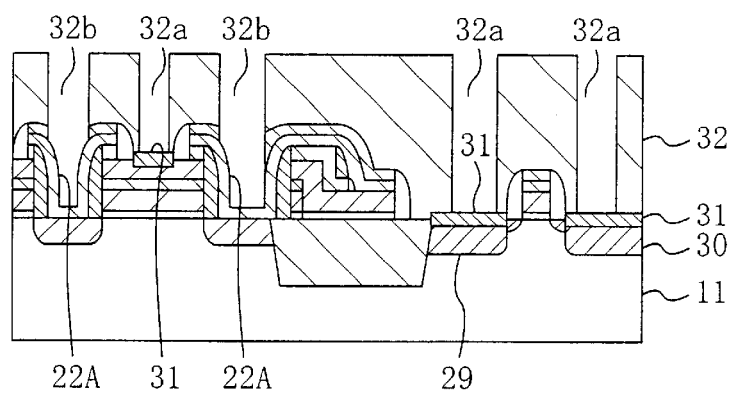
Figure 4P:
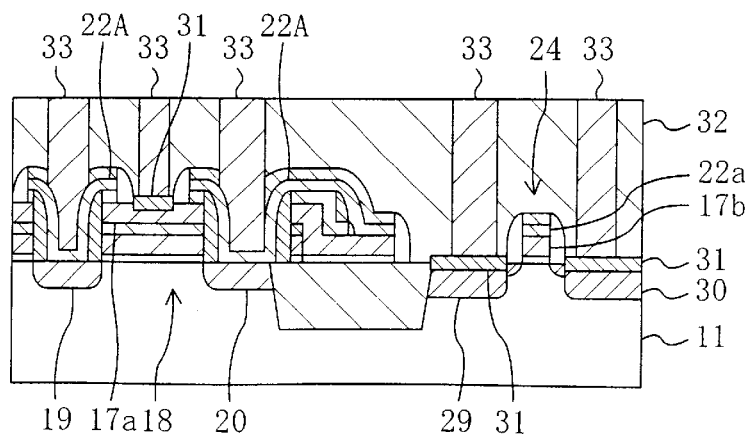

FIGS. 4A through 4P illustrate cross-sectional structures corresponding to respective process steps for fabricating a semiconductor memory device according to the fourth embodiment. It should be noted that although p- and n-channel transistors are actually formed in the logic circuit region, the illustration of the p-channel transistor is omitted from FIGS. 4A through 4P because of the reasons already described for the first embodiment.

The fourth embodiment of the present invention is characterized by using a hard mask to form the logic gate structure 24 and a normal resist pattern to form the contact pads 22A, respectively.

First, in the process step shown in FIG. 4A, an isolation region 12 is defined in a semiconductor substrate 11 of silicon by embedding silicon dioxide in its surface region so that the substrate 11 is partitioned into a memory circuit region 1 and a logic circuit region 2. Thereafter, a first insulating film 13 to be a tunnel insulating film is formed to have a thickness of about 9 nm over the substrate 11 by a thermal oxidation process, for example. Next, a first gate prototype film 14 of polysilicon is deposited to a thickness of about 250 nm over the first insulating film 13 by a CVD process, for example.

Next, in the process step shown in FIG. 4B, a second insulating film 15 to be a capacitive insulating film is formed as a stack of silicon dioxide, silicon nitride and silicon dioxide films (i.e., having a so-called "ONO" structure) on the first gate prototype film 14. Thereafter, a resist pattern 80, covering the memory circuit region 1, is defined on the second insulating film 15. Then, respective parts of the first insulating, first gate prototype and second insulating films 13, 14 and 15 located in the logic circuit region 2 are removed using the resist pattern 80 as a mask.

Then, in the process step shown in FIG. 4C, the resist pattern 80 is removed and then a third insulating film 16 to be a gate insulating film is selectively formed to have a thickness of 10 nm on the logic circuit region 2 of the substrate 11. The third insulating film 16 may be formed by a thermal oxidation process, for example. Subsequently, a second gate prototype film 17 of polysilicon is deposited to a thickness of about 100 nm over the second and third insulating films 15 and 16 by a CVD process, for example. Thereafter, P$^+$ ions are implanted at a dose of about $5 \times 10^{15}$ cm$^{-2}$ into the second gate prototype film 17 to make the second gate prototype film 17 exhibit n-type conductivity. Although not shown, part of the second gate prototype film 17 where a p-channel transistor will be formed may be covered with a resist mask in this P$^+$ ion implanting step so that the covered part will exhibit p-type conductivity through implantation of a p-type dopant in a subsequent process step.

Next, in the process step shown in FIG. 4D, a fourth insulating film 34 of silicon nitride is deposited to a thickness of about 200 nm over the second gate prototype film 17 by a CVD process, for example.

Thereafter, in the process step shown in FIG. 4E, a resist pattern 82, covering the memory circuit region 1, is defined on the fourth insulating film 34. Then, using the resist pattern 82 as a mask, part of the fourth insulating film 34 located in the logic circuit region 2 is removed.

Subsequently, in the process step shown in FIG. 4F, the resist pattern 82 is removed and instead a resist pattern 81, covering the entire logic circuit region 2 and part of the memory circuit region 1 where a memory gate structure will be formed, is defined. Thereafter, using the resist pattern 81 as a mask, the multilayer structure consisting of the first insulating, first gate prototype, second insulating, second gate prototype and fourth insulating films 13, 14, 15, 17 and 34 is dry-etched anisotropically. In this manner, tunnel insulating film 13a, floating gate electrode 14a, capacitive insulating film 15a, control gate electrode 17a and first passivation film 34a are formed in the memory circuit region 1 out of the first insulating, first gate prototype, second insulating, second gate prototype and fourth insulating films 13, 14, 15, 17 and 34, respectively. In the following description, the gate structure made up of the tunnel insulating film 13a, floating gate electrode 14a, capacitive insulating film 15a and control gate electrode 17a will be referred to as a "memory gate structure" 18.

Subsequently, using the resist pattern 81 as a mask, phosphorus ions are implanted into the substrate 11 at a dose of about $2 \times 10^{15}$ cm$^{-2}$ and at an accelerating voltage of about 30 keV, thereby selectively defining source/drain regions 19 and 20 in the substrate 11 beside the memory gate structure 18 in the memory circuit region 1. Next, the resist pattern 81 is removed and then the substrate 11 including the source/drain regions 19 and 20 therein is annealed at about 900° C. This annealing process is performed to repair the ion-implant-induced damage done on the tunnel insulating film 13a and thereby improve the physical properties thereof.

Thereafter, in the process step shown in FIG. 4G, a silicon nitride film is deposited over the substrate 11 by a CVD process and then etched back, thereby forming a sidewall insulating film 35 of silicon nitride on the side faces of the memory gate structure 18 in the gate length direction.

Next, in the process step shown in FIG. 4H, a conductor film 22 of tungsten (W), for example, is deposited to a thickness of about 150 nm over the substrate 11 by a CVD, evaporation or sputtering process. In this process step, the memory gate structure 18 is also covered with the conductor film 22. Subsequently, a fifth insulating film 36 of silicon nitride is deposited to a thickness of about 100 nm over the conductor film 22.

Then, in the process step shown in FIG. 4I, a resist pattern 88, covering the entire memory circuit region 1 and part of the logic circuit region 2 where a logic gate structure will be formed, is defined over the substrate 11. Subsequently, using this resist pattern 88 as a mask, the fifth insulating film 36 is dry-etched. As a result, a second passivation film 36a and 36c is formed in the logic and memory circuit regions 2 and 1, respectively. The second passivation film 36a will be used as a mask for defining a logic gate structure in the next process step. On the other hand, the second passivation film 36c covers the memory circuit region 1 completely.

Next, in the process step shown in FIG. 4J, the resist pattern 88 is removed. Thereafter, using the second passivation film 36a and 36c as a mask, the third insulating, second gate prototype and conductor films 16, 17 and 22 are dry-etched anisotropically. In this manner, gate insulating film 16a and lower and upper gate electrodes 17b and 22a are formed in the logic circuit region 2 out of the third insulating, second gate prototype and conductor films 16, 17 and 22, respectively. In the memory circuit region 1 on the other hand, the conductor film 22 and its underlying layers are not etched because the memory circuit region 1 is entirely covered with the second passivation film 36c. In the following description, a gate structure, which has been formed in the logic circuit region 2 to include the gate insulating film 16a and lower and upper gate electrodes 17b and 22a, will be referred to as a "logic gate structure" 24.

Subsequently, in the process step shown in FIG. 4K, a resist pattern 89 having an opening 89a over the memory gate structure 18 is defined over the substrate 11. Then, using the resist pattern 89 as a mask, the first passivation, conductor and second passivation films 34a, 22 and 36c are dry-etched anisotropically, thereby exposing the control gate electrode 17a. As a result, a second passivation film 36b is formed out of the fifth insulating film 36 and contact pads 22A are formed out of the conductor film 22 in the memory circuit region 1. The contact pads 22A are electrically connected to the source/drain regions 19 and 20 for storage element. Also, the contact pads 22A cover the upper surface of the source/drain regions 19 and 20 and the side faces and upper edges of the memory gate structure 18.

Thereafter, in the process step shown in FIG. 4L, the resist pattern 89 is removed and instead a resist pattern 85 covering the memory circuit region 1 is defined over the substrate 11. Subsequently, using the resist pattern 85 and logic gate structure 24 including the second passivation film 36a as a mask, $As^+$ ions are implanted into the substrate 11 at a dose of about $1 \times 10^{15}$ cm$^{-2}$ and at an accelerating voltage of about 10 keV, thereby defining LDD regions 25 and 26 in the logic circuit region 2.

Then, in the process step shown in FIG. 4M, the resist pattern 85 is removed and a silicon dioxide film is deposited over the substrate 11 and then etched back. In this manner, sidewall insulating films 27C and 27B of silicon dioxide are formed on the side edges of the contact pads 22A and on the side faces of the logic gate structure 24, respectively. Then, a resist pattern 86, covering the memory circuit region 1, is defined over the substrate 11. Subsequently, using the resist pattern 86, logic gate structure 24 including the second passivation film 36a and sidewall insulating film 27B as a mask, $As^+$ ions are implanted again into the substrate 11 at a dose of about $3 \times 10^{15}$ cm$^{-2}$ and at an accelerating voltage of about 30 keV, thereby defining HDD regions 29 and 30 in the logic circuit region 2.

Thereafter, in the process step shown in FIG. 4N, the resist pattern 86 is removed and then a Co film is deposited over the substrate 11 by an evaporation or sputtering process, for example. Subsequently, the substrate is annealed at a temperature high enough to cause silicidation reaction between the exposed silicon of the substrate 11 and control gate electrode 17a and the Co film. In this manner, a cobalt silicide layer 31 is selectively formed on the control gate electrode 17a of the memory gate structure 18 and on the HDD regions 29 and 30.

Subsequently, in the process step shown in FIG. 4O, an interlevel dielectric film 32 of silicon dioxide, for example, is deposited over the substrate 11. Next, a first group of openings 32a are formed in the interlevel dielectric film 32 to expose parts of the cobalt silicide layer 31 on the memory gate structure 18 and on the HDD regions 29 and 30. Then, a second group of openings 32b are formed in the interlevel dielectric film 32 to expose the contact pads 22A.

Thereafter, in the process step shown in FIG. 4P, the first and second groups of openings 32a and 32b of the interlevel dielectric film 32 are filled in with a metal film of tungsten, for example, by an evaporation or sputtering process. In this manner, contacts 33 are formed so as to make electrical contact with the control gate electrode 17a, source/drain regions 19 and 20 and HDD regions 29 and 30. In this case, the control gate electrode 17a and HDD regions 29 and 30 are connected to the contacts 33 via the cobalt silicide layer 31, while the source/drain regions 19 and 20 are connected to the contacts 33 via the contact pads 22A.

In the fourth embodiment, the memory gate structure 18 includes the floating and control gate electrodes 14a and 17a made of polysilicon, and the cobalt silicide layer 31 has been deposited on part of the upper surface of the control gate electrode 17a. That is to say, the memory gate structure 18 does not include the conductor film 22 of tungsten that forms part of the logic gate structure 24. Accordingly, the substrate 11 can be annealed to repair the ion-implant-induced damage done on the tunnel insulating film 13a after the source/drain regions 19 and 20 have been defined for storage element. As a result, the tunnel insulating film 13a can have its reliability improved.

In addition, the logic gate structure 24 formed in the logic circuit region 2 is a so-called "poly-metal gate" including the upper and lower gate electrodes 22a and 17b made of tungsten and polysilicon, respectively. Accordingly, the gate structure 24 can have a lower resistance.

Furthermore, the contact pads 22A can be formed out of the conductor film 22 over the source/drain regions 19 and 20 for storage element when the logic gate structure 24 is formed by patterning its associated multilayer structure including the conductor film 22. As a result, the storage and logical elements can have their resistance reduced and the memory circuit region 1 can have its area reduced.

Particularly, in the fourth embodiment, the logic gate structure 24 is formed in the process step shown in FIG. 4J using, as a mask, the second passivation film 36a that has been formed out of the fifth insulating film 36 of silicon nitride. Generally speaking, when a resist film is used, part of the resultant resist pattern might have its size increased due to unwanted deposition of polymers of the resist material, thus possibly making it difficult to define a desired fine-line pattern for a gate electrode. However, when the second passivation film 36a is used as a hard mask instead of a normal resist film, the unwanted situation like that is avoidable.

Also, when the contact pads 22A are formed in the memory circuit region 1, the first passivation, conductor and second passivation films 34a, 22 and 36c are etched using the resist pattern 89 as a mask as shown in FIG. 4K. That is to say, the second passivation film 36b is not used as a mask pattern. Accordingly, there is no need to consider an etch selectivity between the first and second passivation films 34a and 36b, thus increasing the flexibility and stability of the process.

Embodiment 5

Hereinafter, a fifth embodiment of the present invention will be described with reference to the accompanying drawings.

Figure 5A:
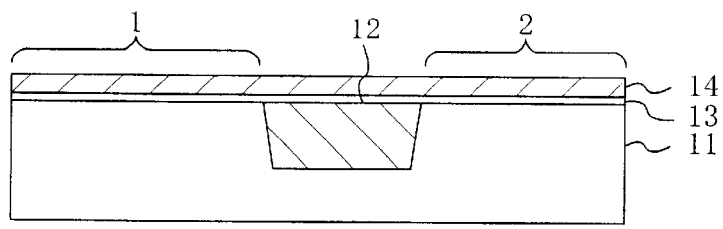
FIGS. 5A through 5P are cross-sectional views illustrating respective process steps for fabricating a semiconductor memory device according to a fifth embodiment of the present invention.
Figure 5B:
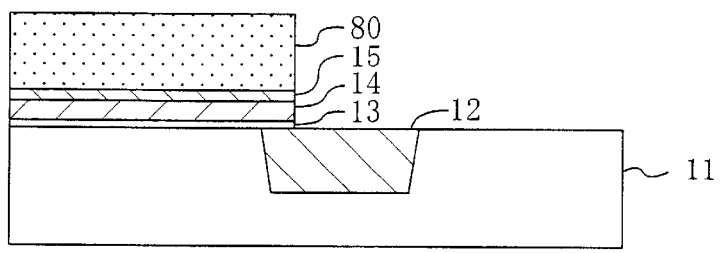
Figure 5C:
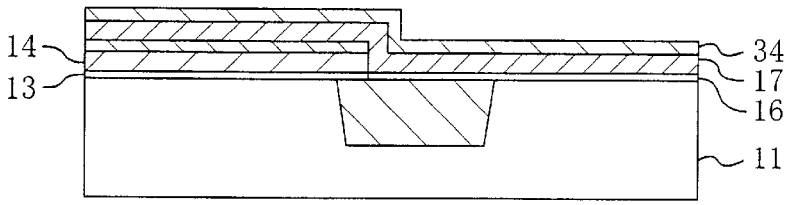
Figure 5D:
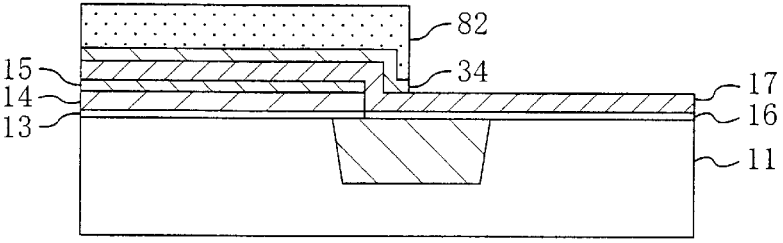
Figure 5E:
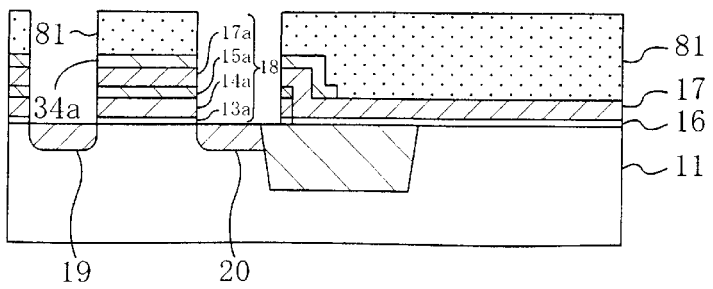
Figure 5F:
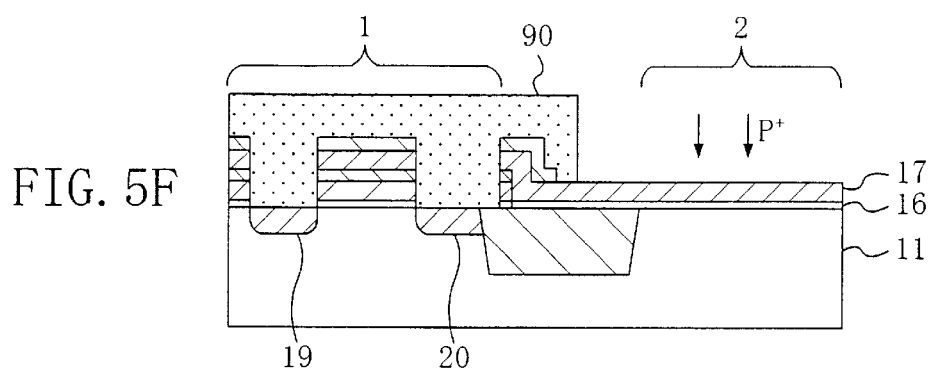
Figure 5G:
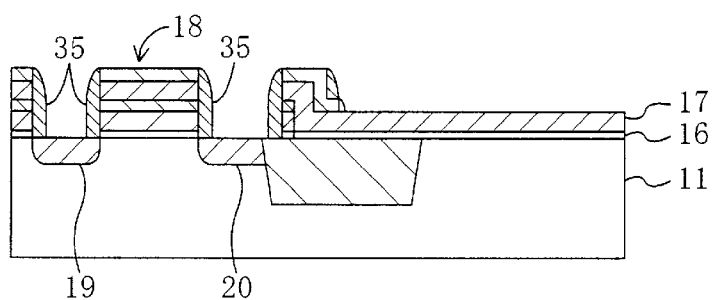
Figure 5H:
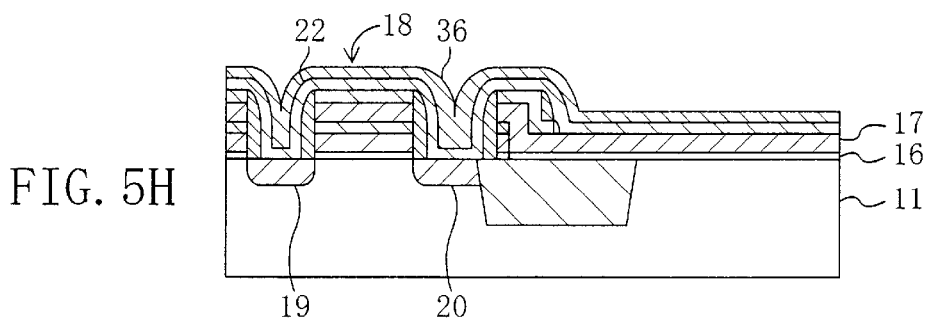
Figure 5I:
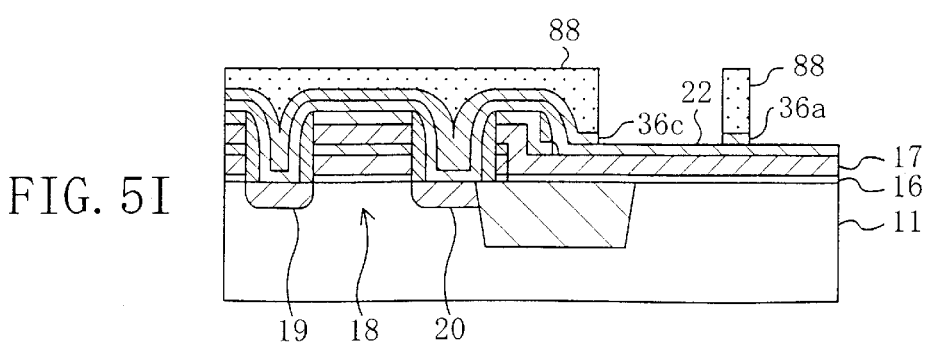
Figure 5J:
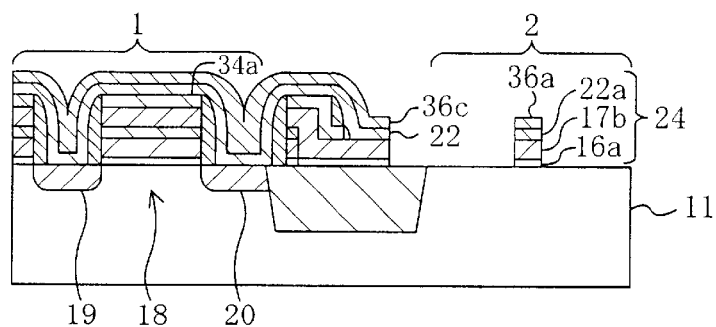
Figure 5K:
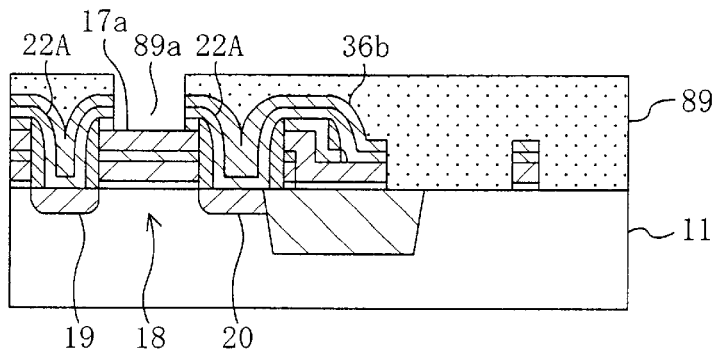
Figure 5L:
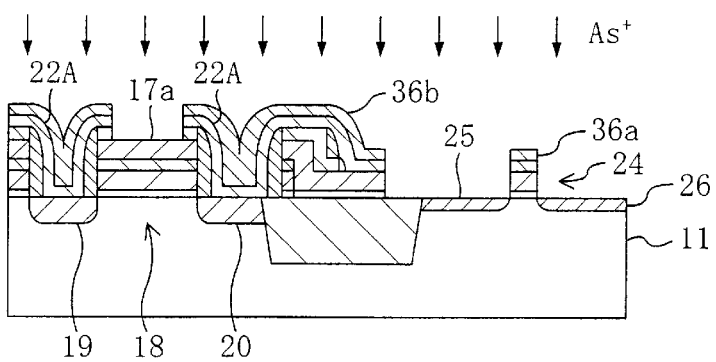
Figure 5M:
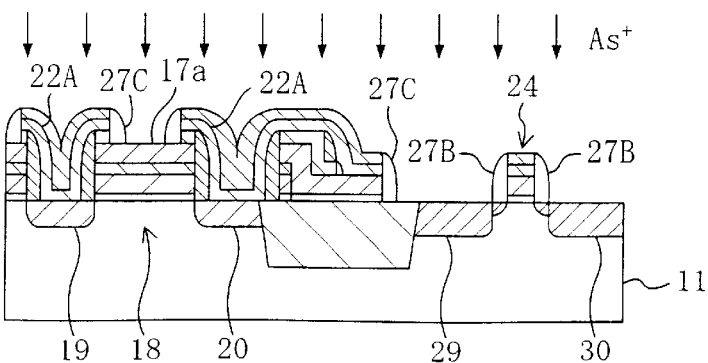
Figure 5N:
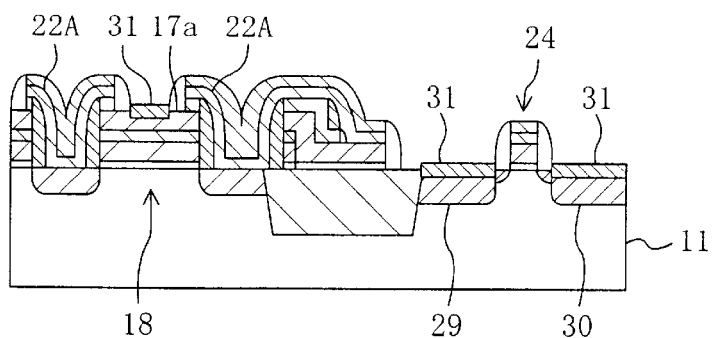
Figure 5O:
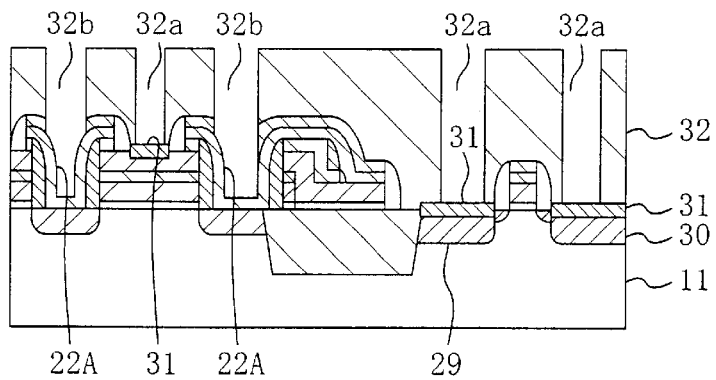
Figure 5P:
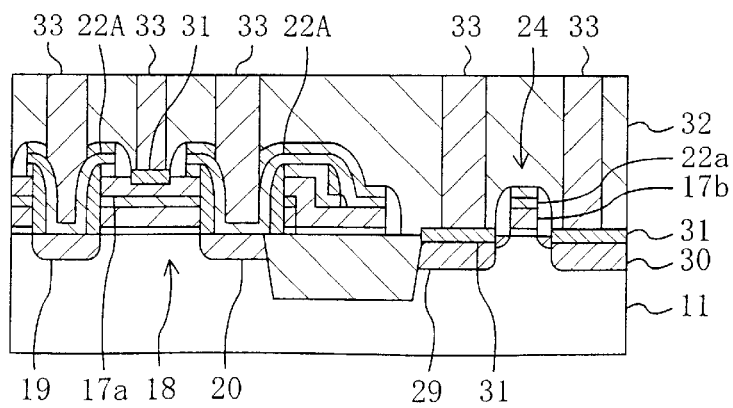

FIGS. 5A through 5P illustrate cross-sectional structures corresponding to respective process steps for fabricating a semiconductor memory device according to the fifth embodiment. It should be noted that although p- and n-channel transistors are actually formed in the logic circuit region, the illustration of the p-channel transistor is omitted from FIGS. 5A through 5P because of the reasons already described for the first embodiment.

The fifth embodiment of the present invention is characterized by introducing mutually different dopants into respective parts of the second gate prototype film for the memory and logic circuit regions separately without increasing the number of process steps.

First, in the process step shown in FIG. 5A, an isolation region 12 is defined in a semiconductor substrate 11 of silicon by embedding silicon dioxide in its surface region so that the substrate 11 is partitioned into a memory circuit region 1 and a logic circuit region 2. Thereafter, a first insulating film 13 to be a tunnel insulating film is formed to have a thickness of about 9 nm over the substrate 11 by a thermal oxidation process, for example. Next, a first gate prototype film 14 of polysilicon is deposited to a thickness of about 250 nm over the first insulating film 13 by a CVD process, for example.

Next, in the process step shown in FIG. 5B, a second insulating film 15 to be a capacitive insulating film is formed as a stack of silicon dioxide, silicon nitride and silicon dioxide films (i.e., having a so-called "ONO" structure) on the first gate prototype film 14. Thereafter, a resist pattern 80, covering the memory circuit region 1, is defined on the second insulating film 15. Then, respective parts of the first insulating, first gate prototype and second insulating films 13, 14 and 15 located in the logic circuit region 2 are removed using the resist pattern 80 as a mask. As a result, patterned first insulating, first gate prototype and second insulating films 13, 14 and 15 are left in the memory circuit region 1.

Then, in the process step shown in FIG. 5C, the resist pattern 80 is removed and then a third insulating film 16 to be a gate insulating film is selectively formed to have a thickness of 10 nm on the logic circuit region 2 of the substrate 11. The third insulating film 16 may be formed by a thermal oxidation process, for example. Subsequently, a second gate prototype film 17 of polysilicon is deposited to a thickness of about 100 nm over the second and third insulating films 15 and 16 by a CVD process, for example. Thereafter, a fourth insulating film 34 of silicon nitride is deposited to a thickness of about 200 nm over the second gate prototype film 17 by a CVD process, for example.

Thereafter, in the process step shown in FIG. 5D, a resist pattern 82, covering the memory circuit region 1, is defined on the fourth insulating film 34. Then, using the resist pattern 82 as a mask, part of the fourth insulating film 34 located in the logic circuit region 2 is removed.

Subsequently, in the process step shown in FIG. 5E, the resist pattern 82 is removed and instead a resist pattern 81, covering the entire logic circuit region 2 and part of the memory circuit region 1 where a memory gate structure will be formed, is defined. Thereafter, using the resist pattern 81 as a mask, the multilayer structure consisting of the first insulating, first gate prototype, second insulating, second gate prototype and fourth insulating films 13, 14, 15, 17 and 34 is dry-etched anisotropically. In this manner, tunnel insulating film 13a, floating gate electrode 14a, capacitive insulating film 15a, control gate electrode 17a and first passivation film 34a are formed in the memory circuit region 1 out of the first insulating, first gate prototype, second insulating, second gate prototype and fourth insulating films 13, 14, 15, 17 and 34, respectively. In the following description, the gate structure made up of the tunnel insulating film 13a, floating gate electrode 14a, capacitive insulating film 15a and control gate electrode 17a will be referred to as a "memory gate structure" 18.

Subsequently, using the resist pattern 81 as a mask, phosphorus ions are implanted into the substrate 11 at a dose of about $2 \times 10^{15}$ cm$^{-2}$ and at an accelerating voltage of about 30 keV, thereby selectively defining source/drain regions 19 and 20 in the substrate 11 beside the memory gate structure 18 in the memory circuit region 1. Next, the resist pattern 81 is removed and then the substrate 11 including the source/drain regions 19 and 20 therein is annealed at about 900° C. This annealing process is performed to repair the ion-implant-induced damage done on the tunnel insulating film 13a and thereby improve the physical properties thereof.

Thereafter, in the process step shown in FIG. 5F, a resist pattern 90, covering the entire memory circuit region 1, is defined over the substrate 11. Then, using the resist pattern 90 as a mask, P$^+$ ions are implanted at a dose of about $5 \times 10^{15}$ cm$^{-2}$ into part of the second gate prototype film 17, where an n-channel transistor will be formed, in the logic circuit region 2 to make that part of the second gate prototype film 17 exhibit n-type conductivity. Although not shown, part of the second gate prototype film 17 where a p-channel transistor will be formed may be covered with a resist mask in this P$^+$ ion implanting step so that the covered part will exhibit p-type conductivity through implantation of a p-type dopant in a subsequent process step.

Next, in the process step shown in FIG. 5G, the resist pattern 90 is removed. Then, a silicon nitride film is deposited over the substrate 11 by a CVD process and then etched back, thereby forming a sidewall insulating film 35 of silicon nitride on the side faces of the memory gate structure 18 in the gate length direction.

Thereafter, in the process step shown in FIG. 5H, a conductor film 22 of tungsten (W), for example, is deposited to a thickness of about 150 nm over the substrate 11 by a CVD, evaporation or sputtering process. In this process step, the memory gate structure 18 is also covered with the conductor film 22. Subsequently, a fifth insulating film 36 of silicon nitride is deposited to a thickness of about 100 nm over the conductor film 22.

Then, in the process step shown in FIG. 5I, a resist pattern 88, covering the entire memory circuit region 1 and part of the logic circuit region 2 where a logic gate structure will be formed, is defined over the substrate 11. Subsequently, using this resist pattern 88 as a mask, the fifth insulating film 36 is dry-etched. As a result, a second passivation film 36a and 36c is formed in the logic and memory circuit regions 2 and 1, respectively. The second passivation film 36a will be used as a mask for defining a logic gate structure in the next process step. On the other hand, the second passivation film 36c covers the memory circuit region 1 completely.

Next, in the process step shown in FIG. 5J, the resist pattern 88 is removed. Thereafter, using the second passivation film 36a and 36c as a mask, the third insulating, second gate prototype and conductor films 16, 17 and 22 are dry-etched anisotropically. In this manner, gate insulating film 16a and lower and upper gate electrodes 17b and 22a are formed in the logic circuit region 2 out of the third insulating, second gate prototype and conductor films 16, 17 and 22, respectively. In the memory circuit region 1 on the other hand, the conductor film 22 and its underlying layers are not etched because the memory circuit region 1 is entirely covered with the second passivation film 36c. In the following description, a gate structure, which has been formed in the logic circuit region 2 to include the gate insulating film 16a and lower and upper gate electrodes 17b and 22a, will be referred to as a "logic gate structure" 24.

Subsequently, in the process step shown in FIG. 5K, a resist pattern 89 having an opening 89a over the memory gate structure 18 is defined over the substrate 11. Then, using the resist pattern 89 as a mask, the first passivation, conductor and second passivation films 34a, 22 and 36c are dry-etched anisotropically, thereby exposing the control gate electrode 17a. As a result, a second passivation film 36b is formed out of the fifth insulating film 36 and contact pads 22A are formed out of the conductor film 22 in the memory circuit region 1. The contact pads 22A are electrically connected to the source/drain regions 19 and 20 for storage element. Also, the contact pads 22A cover the upper surface of the source/drain regions 19 and 20 and the side faces and upper edges of the memory gate structure 18.

Thereafter, in the process step shown in FIG. 5L, the resist pattern 89 is removed. Subsequently, using the second passivation film 36b and logic gate structure 24 including the second passivation film 36a as a mask, As$^+$ ions are implanted into the substrate 11 at a dose of about $1 \times 10^{15}$ cm$^{-2}$ and at an accelerating voltage of about 10 keV, thereby defining LDD regions 25 and 26 in the logic circuit region 2. As a result of this process step, the control gate electrode 17a comes to exhibit n-type conductivity because the surface of the control gate electrode 17a is exposed on the memory gate structure 18.

Then, in the process step shown in FIG. 5M, a silicon dioxide film is deposited over the substrate 11 and then etched back. In this manner, sidewall insulating films 27C and 27B of silicon dioxide are formed on the side edges of the contact pads 22A and on the side faces of the logic gate structure 24, respectively. Subsequently, using the logic gate structure 24, sidewall insulating films 27B and 27C and second passivation film 36b as a mask, As$^+$ ions are implanted again into the substrate 11 at a dose of about $3 \times 10^{15}$ cm$^{-2}$ and at an accelerating voltage of about 30 keV, thereby defining HDD regions 29 and 30 in the logic circuit region 2. In this process step, the As$^+$ ions are also implanted into that exposed part of the control gate electrode 17a. Accordingly, the control gate electrode 17a has its dopant concentration increased and its resistance reduced.

Thereafter, in the process step shown in FIG. 5N, a Co film is deposited over the substrate 11 by an evaporation or sputtering process, for example. Subsequently, the substrate is annealed at a temperature high enough to cause silicidation reaction between the exposed silicon of the substrate 11 and control gate electrode 17a and the Co film. In this manner, a cobalt silicide layer 31 is selectively formed on the control gate electrode 17a of the memory gate structure 18 and HDD regions 29 and 30.

Subsequently, in the process step shown in FIG. 5O, an interlevel dielectric film 32 of silicon dioxide, for example, is deposited over the substrate 11. Next, a first group of openings 32a are formed in the interlevel dielectric film 32 to expose parts of the cobalt silicide layer 31 on the memory gate structure 18 and on the HDD regions 29 and 30. Then, a second group of openings 32b are formed in the interlevel dielectric film 32 to expose the contact pads 22A.

Thereafter, in the process step shown in FIG. 5P, the first and second groups of openings 32a and 32b of the interlevel dielectric film 32 are filled in with a metal film of tungsten, for example, by an evaporation or sputtering process. In this manner, contacts 33 are formed so as to make electrical contact with the control gate electrode 17a, source/drain regions 19 and 20 and HDD regions 29 and 30. In this case, the control gate electrode 17a and HDD regions 29 and 30 are connected to the contacts 33 via the cobalt silicide layer 31, while the source/drain regions 19 and 20 are connected to the contacts 33 via the contact pads 22A.

In the fifth embodiment, the memory gate structure 18 includes the floating and control gate electrodes 14a and 17a made of polysilicon, and the cobalt silicide layer 31 has been deposited on part of the upper surface of the control gate electrode 17a. That is to say, the memory gate structure 18 does not include the conductor film 22 of tungsten that forms part of the logic gate structure 24. Accordingly, the substrate 11 can be annealed to repair the ion-implant-induced damage done on the tunnel insulating film 13a after the source/drain regions 19 and 20 have been defined for storage element. As a result, the tunnel insulating film 13a can have its reliability improved.

In addition, the logic gate structure 24 formed in the logic circuit region 2 is a so-called "poly-metal gate" including the upper and lower gate electrodes 22a and 17b made of tungsten and polysilicon, respectively. Accordingly, the gate structure 24 can have a lower resistance.

Furthermore, the contact pads 22A can be formed out of the conductor film 22 over the source/drain regions 19 and 20 for storage element when the logic gate structure 24 is formed by patterning its associated multilayer structure including the conductor film 22. As a result, the storage and logical elements can have their resistance reduced and the memory circuit region 1 can have its area reduced.

Particularly, in the fifth embodiment, mutually different dopants are separately introduced into respective parts of the second gate prototype film 17 for the memory and logic circuit regions 1 and 2. Specifically, in the process step shown in FIG. 5F, after the source/drain regions 19 and 20 have been annealed, a dopant is introduced into part of the second gate prototype film 17 located in the logic circuit region 2. Thereafter, in the process steps shown in FIGS. 5L and 5M, when the LDD and HDD regions 25, 26 and 29, 30 are defined in the logic circuit region 2 after the conductor film 22 has been deposited, another dopant is introduced into the control gate electrode 17a of the memory gate structure 18. Accordingly, part of the second gate prototype film 17 belonging to the logic circuit region 2 is annealed a fewer number of times. Thus, even though this semiconductor memory device has a dual-gate structure, interdiffusion between the n- and p-type dopants can be suppressed. In addition, the dopant is introduced into the control gate electrode 17a of the memory gate structure 18 when the source/drain regions are defined in the logic circuit region 2. So the number of process steps required does not increase.

In the fifth embodiment, the logic gate structure 24 is formed using the second passivation film 36a as a hard mask, while the contact pads 22A are formed using the resist pattern 89. Alternatively, the logic gate structure 24 and contact pads 22A may be formed at a time using the resist pattern 87 as in the second embodiment. As another alternative, the contact pads 22A may also be formed using the second passivation film 36b as a hard mask as in the third embodiment. It should be noted, however, that when a hard mask is used for a patterning process step, the fourth and fifth insulating films 34 and 36 should be made of such materials as realizing a high etch selectivity between them.

Embodiment 6

Hereinafter, a sixth embodiment of the present invention will be described with reference to the accompanying drawings.

Figure 6A:
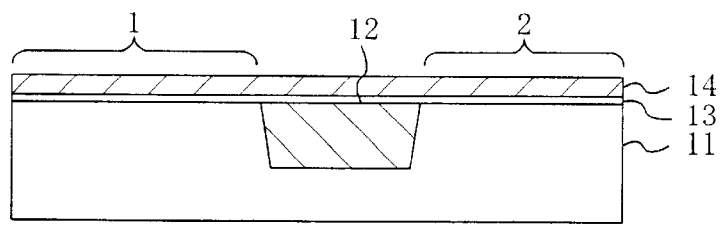
FIGS. 6A through 6P are cross-sectional views illustrating respective process steps for fabricating a semiconductor memory device according to a sixth embodiment of the present invention.
Figure 6B:
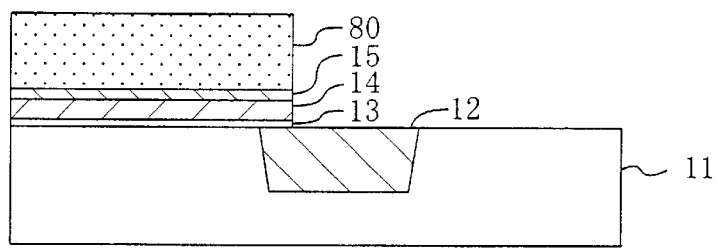
Figure 6C:
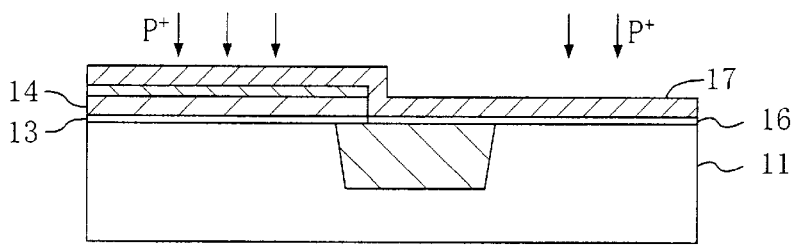
Figure 6D:
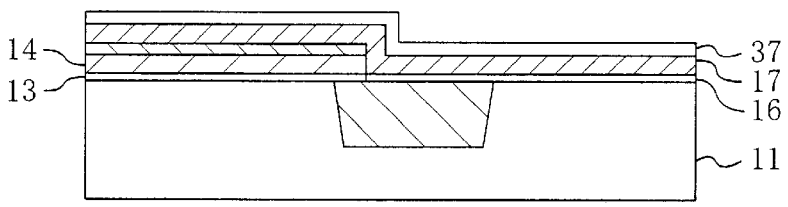
Figure 6E:
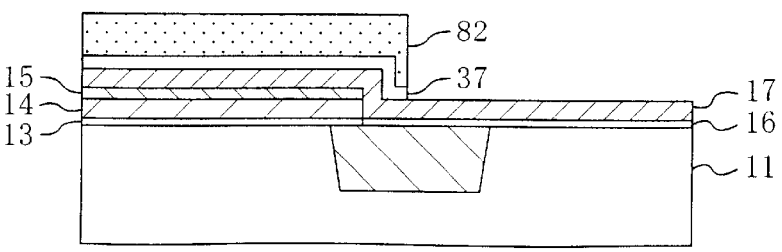
Figure 6F:
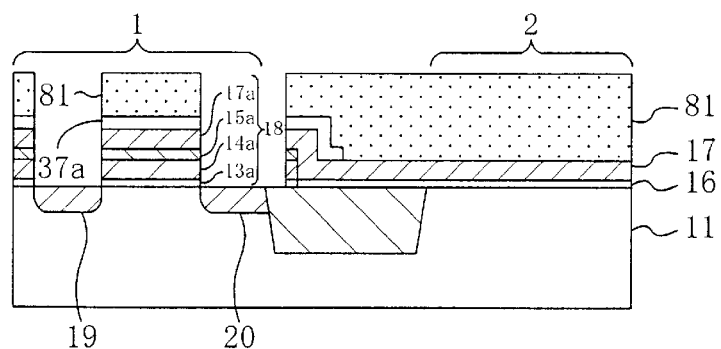
Figure 6G:
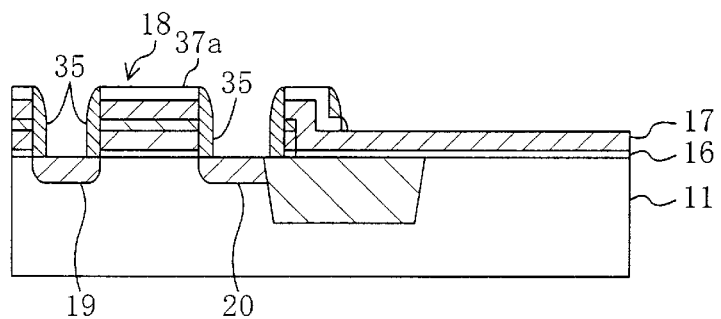
Figure 6H:
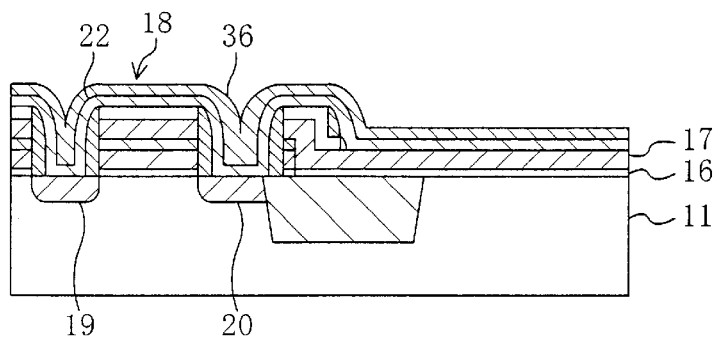
Figure 6I:
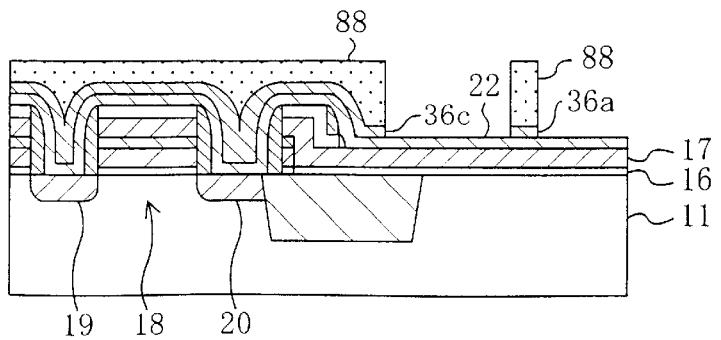
Figure 6J:
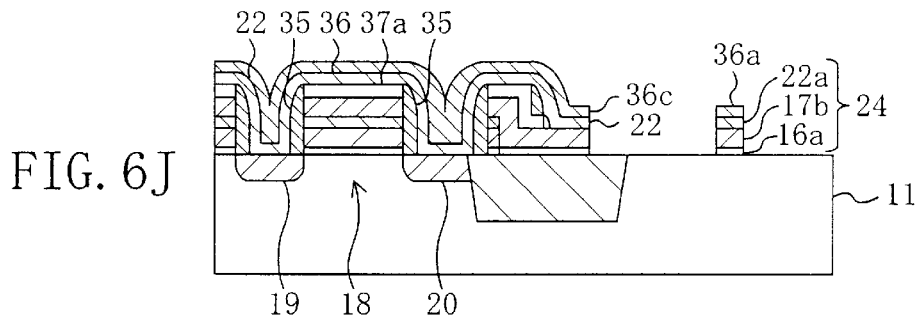
Figure 6K:
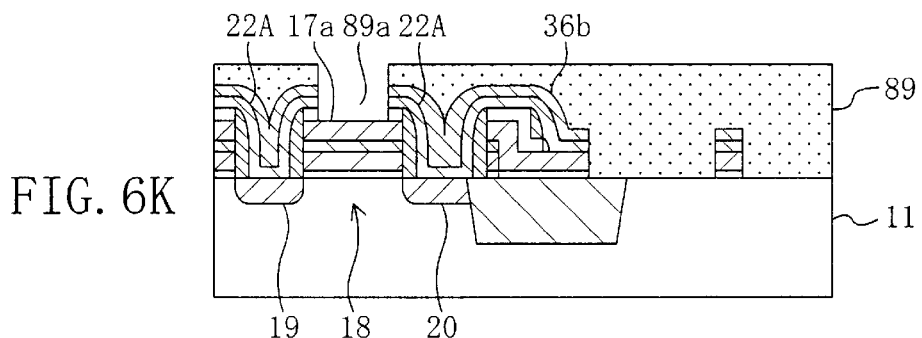
Figure 6L:
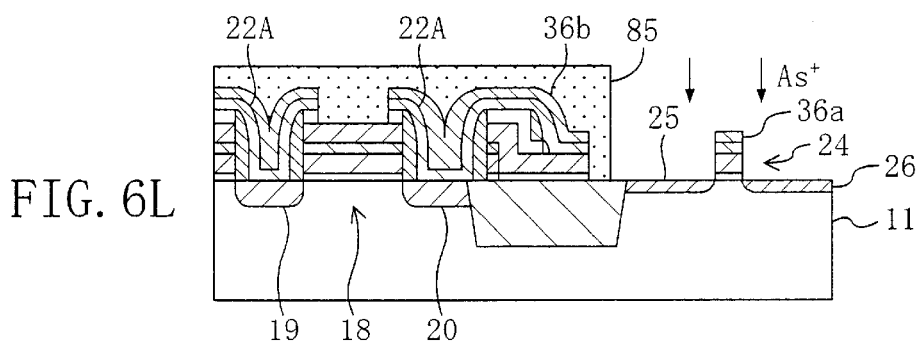
Figure 6M:
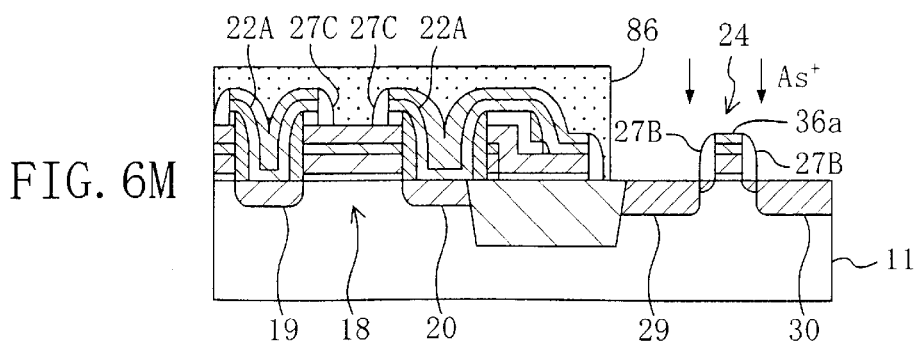
Figure 6N:
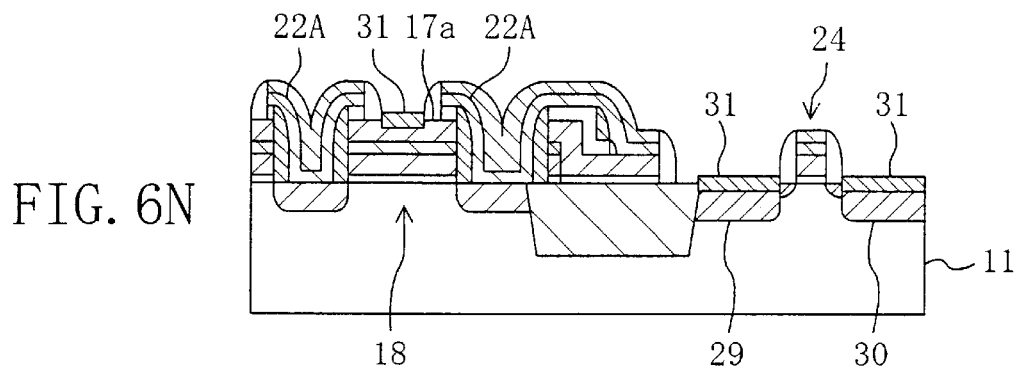
Figure 6O:
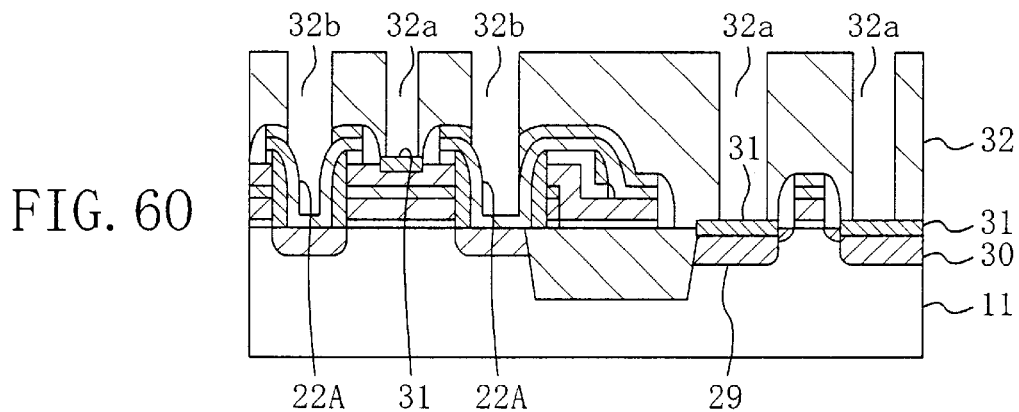
Figure 6P:
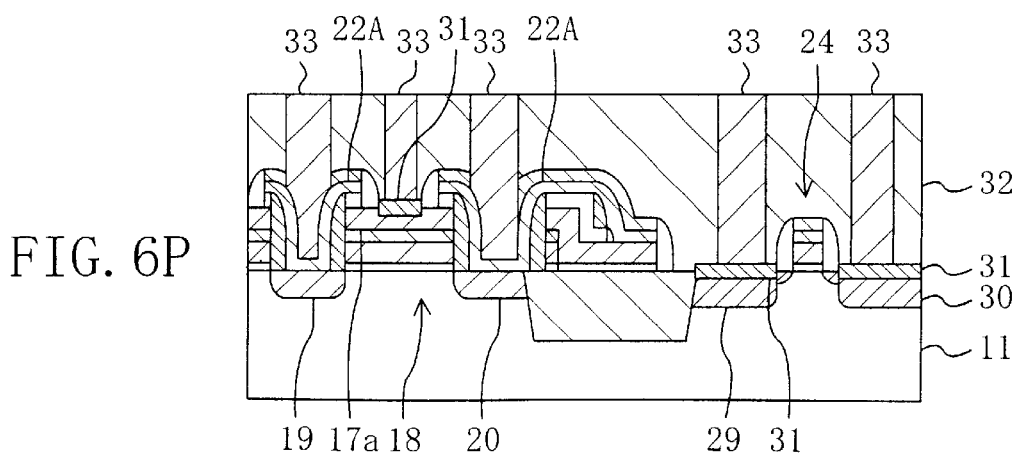

FIGS. 6A through 6P illustrate cross-sectional structures corresponding to respective process steps for fabricating a semiconductor memory device according to the sixth embodiment. It should be noted that although p- and n-channel transistors are actually formed in the logic circuit region, the illustration of the p-channel transistor is omitted from FIGS. 6A through 6P because of the reasons already described for the first embodiment.

The sixth embodiment of the present invention is characterized by making the sidewall insulating film for storage element and the first passivation film on the memory gate structure out of a particular combination of materials that are selected to realize a high etch selectivity between them.

First, in the process step shown in FIG. 6A, an isolation region 12 is defined in a semiconductor substrate 11 of silicon by embedding silicon dioxide in its surface region so that the substrate 11 is partitioned into a memory circuit region 1 and a logic circuit region 2. Thereafter, a first insulating film 13 to be a tunnel insulating film is formed to have a thickness of about 9 nm over the substrate 11 by a thermal oxidation process, for example. Next, a first gate prototype film 14 of polysilicon is deposited to a thickness of about 250 nm over the first insulating film 13 by a CVD process, for example.

Next, in the process step shown in FIG. 6B, a second insulating film 15 to be a capacitive insulating film is formed as a stack of silicon dioxide, silicon nitride and silicon dioxide films (i.e., having a so-called "ONO" structure) on the first gate prototype film 14. Thereafter, a resist pattern 80, covering the memory circuit region 1, is defined on the second insulating film 15. Then, respective parts of the first insulating, first gate prototype and second insulating films 13, 14 and 15 located in the logic circuit region 2 are removed using the resist pattern 80 as a mask.

Then, in the process step shown in FIG. 6C, the resist pattern 80 is removed and then a third insulating film 16 to be a gate insulating film is selectively formed to have a thickness of 10 nm on the logic circuit region 2 of the substrate 11. The third insulating film 16 may be formed by a thermal oxidation process, for example. Subsequently, a second gate prototype film 17 of polysilicon is deposited to a thickness of about 100 nm over the second and third insulating films 15 and 16 by a CVD process, for example. Thereafter, P$^+$ ions are implanted at a dose of about 5×10$^{15}$ cm$^{-2}$ into the second gate prototype film 17 to make the second gate prototype film 17 exhibit n-type conductivity. Although not shown, part of the second gate prototype film 17 where a p-channel transistor will be formed may be covered with a resist mask in this P$^+$ ion implanting step so that the covered part will exhibit p-type conductivity through implantation of a p-type dopant in a subsequent process step.

Next, in the process step shown in FIG. 6D, a fourth insulating film 37 of silicon dioxide is deposited to a thickness of about 200 nm over the second gate prototype film 17 by a CVD process, for example.

Thereafter, in the process step shown in FIG. 6E, a resist pattern 82, covering the memory circuit region 1, is defined on the fourth insulating film 37. Then, using the resist pattern 82 as a mask, part of the fourth insulating film 37 located in the logic circuit region 2 is removed.

Subsequently, in the process step shown in FIG. 6F, the resist pattern 82 is removed and instead a resist pattern 81, covering the entire logic circuit region 2 and part of the memory circuit region 1 where a memory gate structure will be formed, is defined. Thereafter, using the resist pattern 81 as a mask, the multilayer structure consisting of the first insulating, first gate prototype, second insulating, second gate prototype and fourth insulating films 13, 14, 15, 17 and 37 is dry-etched anisotropically. In this manner, tunnel insulating film 13a, floating gate electrode 14a, capacitive insulating film 15a, control gate electrode 17a and first passivation film 37a are formed in the memory circuit region 1 out of the first insulating, first gate prototype, second insulating, second gate prototype and fourth insulating films 13, 14, 15, 17 and 37, respectively. In the following description, the gate structure made up of the tunnel insulating film 13a, floating gate electrode 14a, capacitive insulating film 15a and control gate electrode 17a will be referred to as a "memory gate structure" 18.

Subsequently, using the resist pattern 81 as a mask, phosphorus ions are implanted into the substrate 11 at a dose of about 2×10$^{15}$ cm$^{-2}$ and at an accelerating voltage of about 30 keV, thereby selectively defining source/drain regions 19 and 20 in the substrate 11 beside the memory gate structure 18 in the memory circuit region 1. Next, the resist pattern 81 is removed and then the substrate 11 including the source/drain regions 19 and 20 therein is annealed at about 900° C. This annealing process is performed to repair the ion-implant-induced damage done on the tunnel insulating film 13a and thereby improve the physical properties thereof.

Thereafter, in the process step shown in FIG. 6G, a silicon nitride film is deposited over the substrate 11 by a CVD process and then etched back, thereby forming a sidewall insulating film 35 of silicon nitride on the side faces of the memory gate structure 18 in the gate length direction.

Next, in the process step shown in FIG. 6H, a conductor film 22 of tungsten (W), for example, is deposited to a thickness of about 150 nm over the substrate 11 by a CVD, evaporation or sputtering process. In this process step, the memory gate structure 18 is also covered with the conductor film 22. Subsequently, a fifth insulating film 36 of silicon nitride is deposited to a thickness of about 100 nm over the conductor film 22.

Then, in the process step shown in FIG. 6I, a resist pattern 88, covering the entire memory circuit region 1 and part of the logic circuit region 2 where a logic gate structure will be formed, is defined over the substrate 11. Subsequently, using this resist pattern 88 as a mask, the fifth insulating film 36 is dry-etched. As a result, a second passivation film 36a and 36c is formed in the logic and memory circuit regions 2 and 1, respectively. The second passivation film 36a will be used as a mask for defining a logic gate structure in the next process step. On the other hand, the second passivation film 36c covers the memory circuit region 1 completely.

Next, in the process step shown in FIG. 6J, the resist pattern 88 is removed. Thereafter, using the second passivation film 36a and 36c as a mask, the third insulating, second gate prototype and conductor films 16, 17 and 22 are dry-etched anisotropically. In this manner, gate insulating film 16a and lower and upper gate electrodes 17b and 22a are formed in the logic circuit region 2 out of the third insulating, second gate prototype and conductor films 16, 17 and 22, respectively. In the memory circuit region 1 on the other hand, the conductor film 22 and its underlying layers are not etched because the memory circuit region 1 is entirely covered with the second passivation film 36c. In the following description, a gate structure, which has been formed in the logic circuit region 2 to include the gate insulating film 16a and lower and upper gate electrodes 17b and 22a, will be referred to as a "logic gate structure" 24.

Subsequently, in the process step shown in FIG. 6K, a resist pattern 89 having an opening 89a over the memory gate structure 18 is defined over the substrate 11. Then, using the resist pattern 89 as a mask, the first passivation, conductor and second passivation films 37a, 22 and 36c are dry-etched anisotropically, thereby exposing the control gate electrode 17a. As a result, contact pads 22A are formed out of the conductor film 22 and a second passivation film 36b is formed out of the fifth insulating film 36 on the contact pads 22A in the memory circuit region 1. The contact pads 22A are electrically connected to the source/drain regions 19 and 20 for storage element. Also, the contact pads 22A cover the upper surface of the source/drain regions 19 and 20 and the side faces and upper edges of the memory gate structure 18.

Thereafter, in the process step shown in FIG. 6L, the resist pattern 89 is removed and instead a resist pattern 85 covering the memory circuit region 1 is defined over the substrate 11. Subsequently, using the resist pattern 85 and logic gate structure 24 including the second passivation film 36a as a mask, As$^+$ ions are implanted into the substrate 11 at a dose of about $1 \times 10^{15}$ cm$^{-2}$ and at an accelerating voltage of about 10 kev, thereby defining LDD regions 25 and 26 in the logic circuit region 2.

Then, in the process step shown in FIG. 6M, the resist pattern 85 is removed and a silicon dioxide film is deposited over the substrate 11 and then etched back. In this manner, sidewall insulating films 27C and 27B of silicon dioxide are formed on the side edges of the contact pads 22A and on the side faces of the logic gate structure 24, respectively. Then, a resist pattern 86, covering the memory circuit region 1, is defined over the substrate 11. Subsequently, using the resist pattern 86, logic gate structure 24 including the second passivation film 36a and sidewall insulating film 27B as a mask, As$^+$ ions are implanted again into the substrate 11 at a dose of about $3 \times 10^{15}$ cm$^{-2}$ and at an accelerating voltage of about 30 keV, thereby defining HDD regions 29 and 30 in the logic circuit region 2.

Thereafter, in the process step shown in FIG. 6N, the resist pattern 86 is removed and then a Co film is deposited over the substrate 11 by an evaporation or sputtering process, for example. Subsequently, the substrate is annealed at a temperature high enough to cause silicidation reaction between the exposed silicon of the substrate 11 and control gate electrode 17a and the Co film. In this manner, a cobalt silicide layer 31 is selectively formed on the control gate electrode 17a of the memory gate structure 18 and on the HDD regions 29 and 30.

Subsequently, in the process step shown in FIG. 6O, an interlevel dielectric film 32 of silicon dioxide, for example, is deposited over the substrate 11. Next, a first group of openings 32a are formed in the interlevel dielectric film 32 to expose parts of the cobalt silicide layer 31 on the memory gate structure 18 and on the HDD regions 29 and 30. Then, a second group of openings 32b are formed in the interlevel dielectric film 32 to expose the contact pads 22A.

Thereafter, in the process step shown in FIG. 6P, the first and second groups of openings 32a and 32b of the interlevel dielectric film 32 are filled in with a metal film of tungsten, for example, by an evaporation or sputtering process. In this manner, contacts 33 are formed so as to make electrical contact with the control gate electrode 17a, source/drain regions 19 and 20 and HDD regions 29 and 30. In this case, the control gate electrode 17a and HDD regions 29 and 30 are connected to the contacts 33 via the cobalt silicide layer 31, while the source/drain regions 19 and 20 are connected to the contacts 33 via the contact pads 22A.

The sixth embodiment of the present invention can also attain the effects of the fourth embodiment and is characterized by making the first passivation film 37a and sidewall insulating film 35 of silicon dioxide and silicon nitride, respectively. Accordingly, in the process step shown in FIG. 6K for exposing the control gate electrode 17a, an increased mask alignment margin is allowable for forming the contact pads 22A. Hereinafter, this effect will be briefly described with reference to FIGS. 7A and 7B.

Figure 7A:
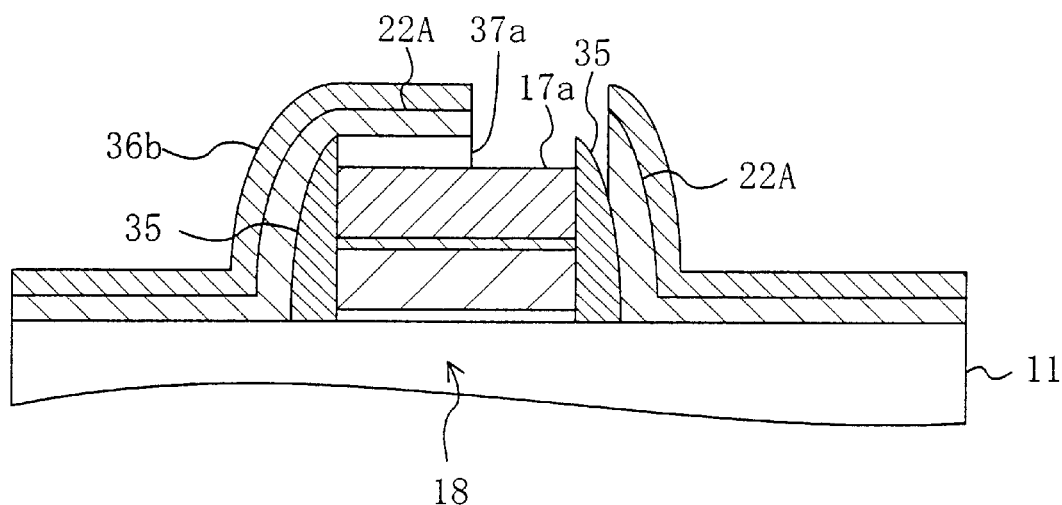
FIGS. 7A and 7B are cross-sectional views illustrating the process step of forming contact pads by patterning for a storage element according to the sixth embodiment and a comparative process, respectively.
Figure 7B:
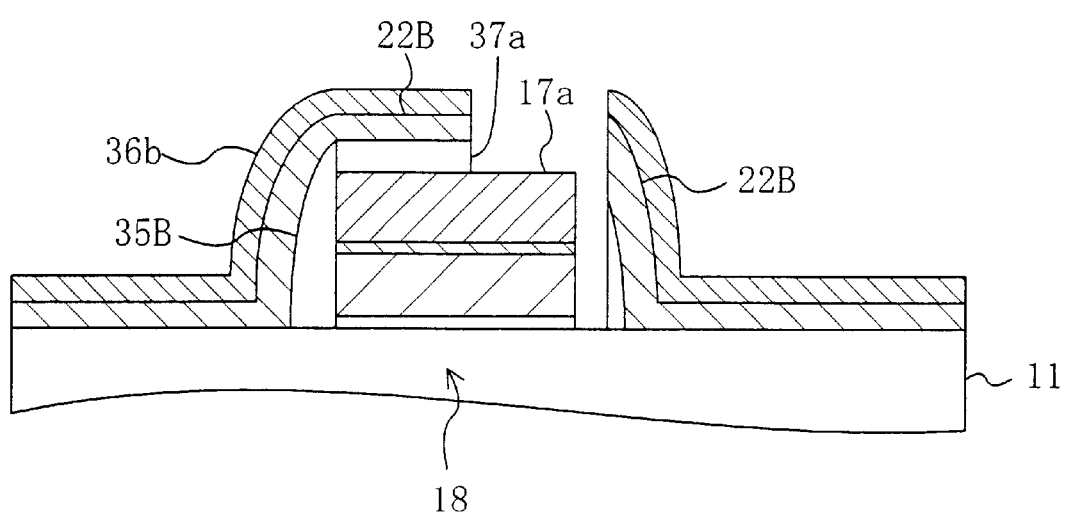

FIGS. 7A and 7B illustrate the process step of forming contact pads for a storage element according to the sixth embodiment and a comparative process, respectively. In FIGS. 7A and 7B, each member also shown in FIGS. 6J through 6M is identified by the same reference numeral and the description thereof will be omitted herein.

Suppose the resist pattern 89 has misaligned and shifted rightward as shown in FIG. 7A in the process step shown in FIG. 6K for forming the contact pads 22A. According to the sixth embodiment, the sidewall insulating film 35 and the first passivation film 37a on the control gate electrode 17a are made of mutually different materials and are etched at respectively different rates. For that reason, when the first passivation film 37a is removed, the sidewall insulating film 35 is hardly removed, thus increasing the mask alignment margin allowable for forming the contact pads 22A.

In contrast, where the sidewall insulating film 35B and first passivation film 37a are made of the same material (e.g., silicon dioxide) as in the comparative example shown in FIG. 7B, these films 35B and 37a are etched at the same rate. Accordingly, when the first passivation film 37a is removed, the sidewall insulating film 35B is also etched away unintentionally, thus causing some inconvenience.

The effects of the sixth embodiment are also attainable by any of the second through fifth embodiments if the sidewall insulating film for the structure 18 and the first passivation film on the control gate electrode 17a are made of dissimilar materials that realize a high etch selectivity between them.

Embodiment 7

Hereinafter, a seventh embodiment of the present invention will be described with reference to the accompanying drawings.

Figure 8A:
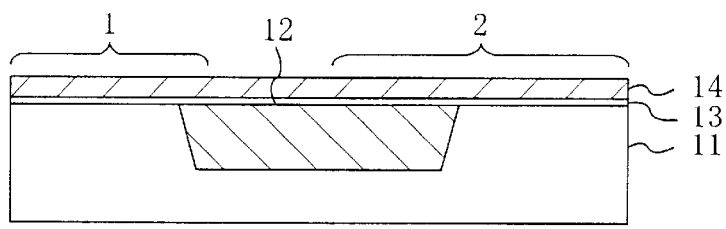
FIGS. 8A through 8P are cross-sectional views illustrating respective process steps for fabricating a semiconductor memory device according to a seventh embodiment of the present invention.
Figure 8B:
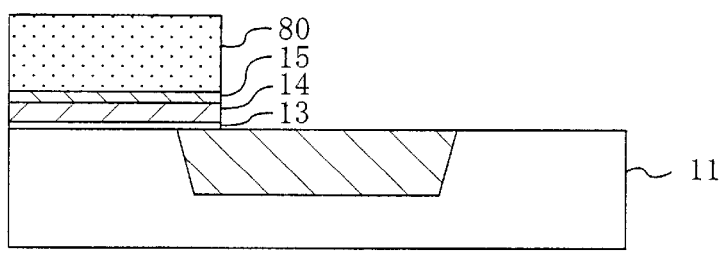
Figure 8C:
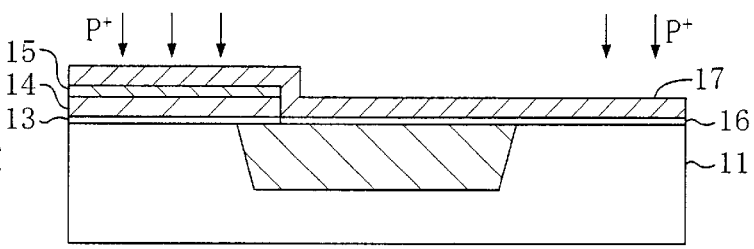
Figure 8D:
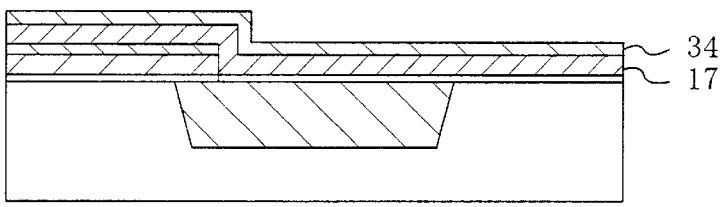
Figure 8E:
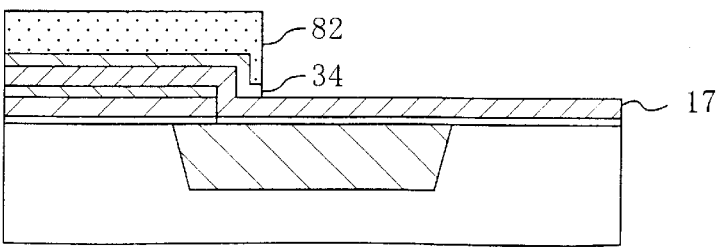
Figure 8F:
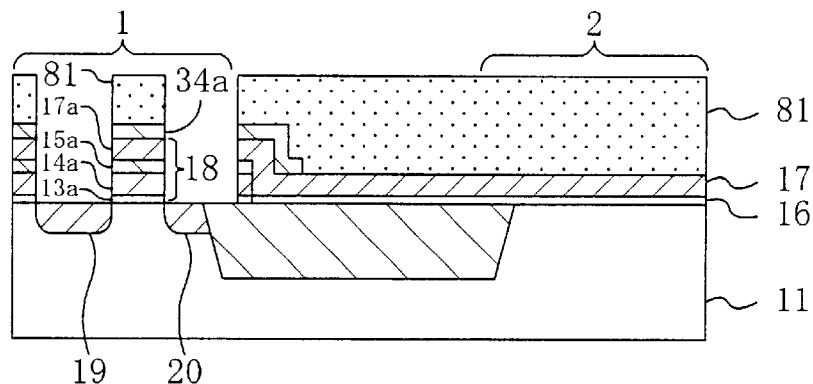
Figure 8G:
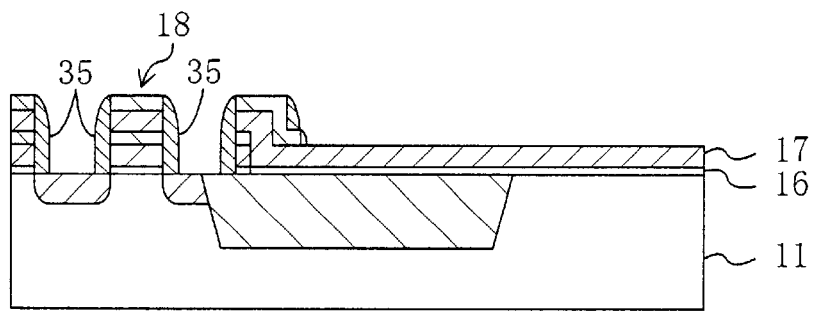
Figure 8H:
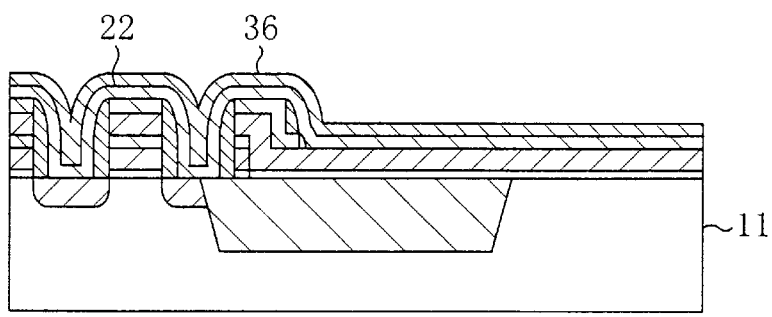
Figure 8I:
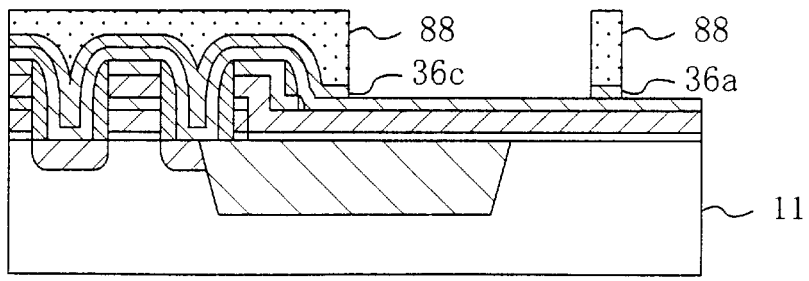
Figure 8J:
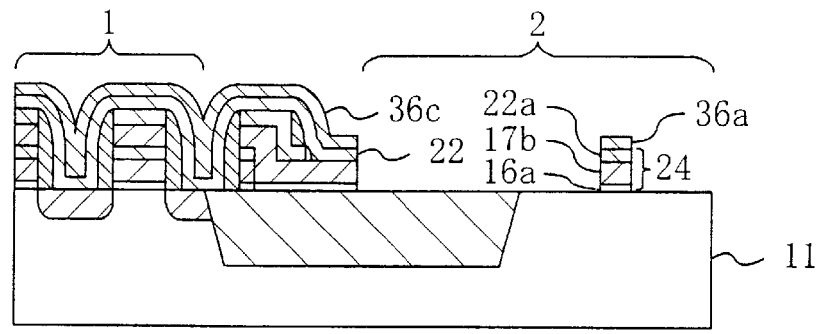
Figure 8K:
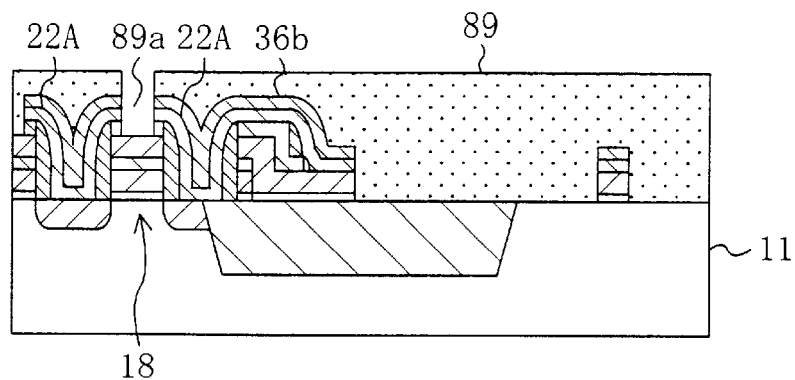
Figure 8L:
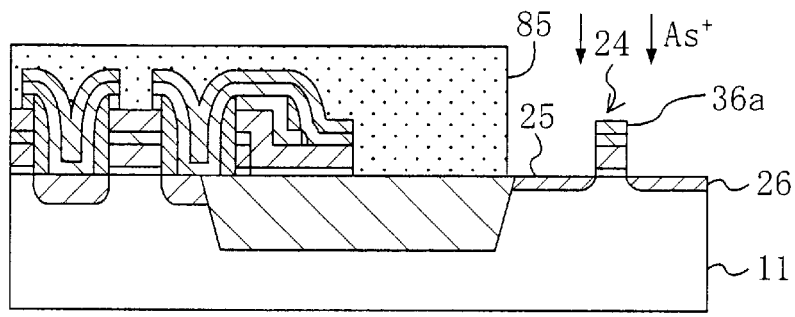
Figure 8M:
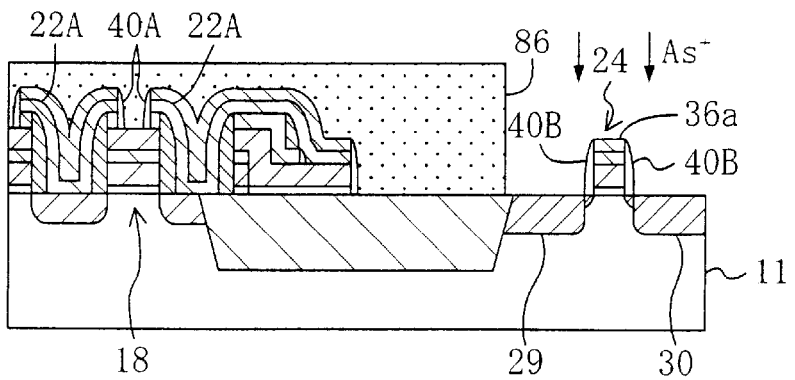
Figure 8N:
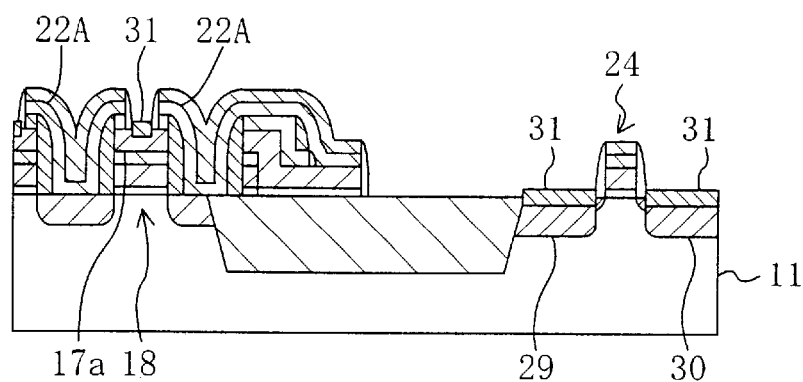
Figure 8O:
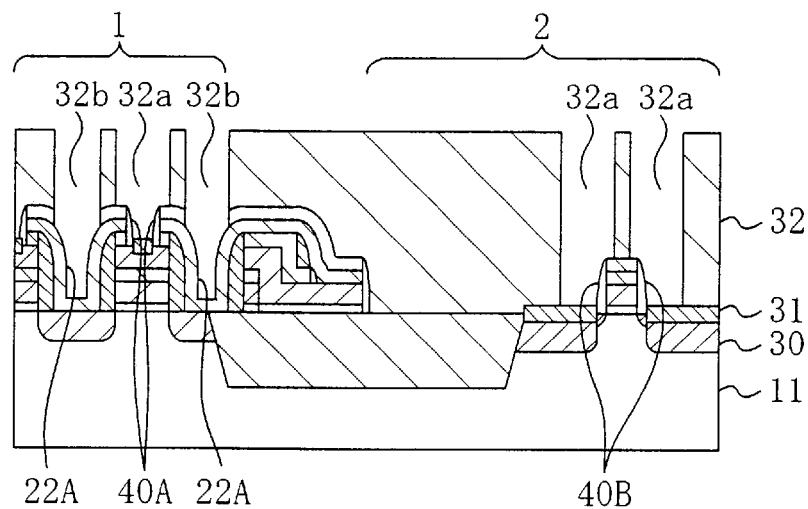
Figure 8P:
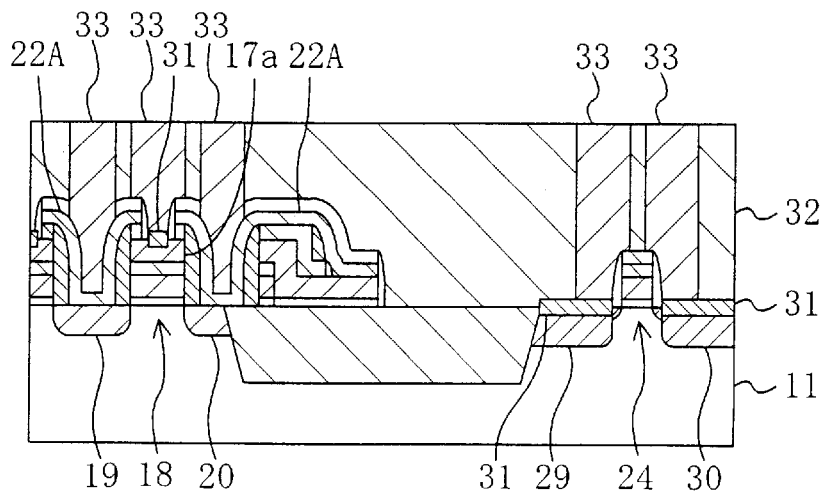

FIGS. 8A through 8P illustrate cross-sectional structures corresponding to respective process steps for fabricating a semiconductor memory device according to the seventh embodiment. It should be noted that although p- and n-channel transistors are actually formed in the logic circuit region, the illustration of the p-channel transistor is omitted from FIGS. 8A through 8P because of the reasons already described for the first embodiment.

The seventh embodiment of the present invention realizes a self-aligned contact (SAC) structure by increasing the etch selectivity of the material of the interlevel dielectric film to that of the insulating films covering the storage and logical elements.

First, in the process step shown in FIG. 8A, an isolation region 12 is defined in a semiconductor substrate 11 of silicon by embedding silicon dioxide in its surface region so that the substrate 11 is partitioned into a memory circuit region 1 and a logic circuit region 2. Thereafter, a first insulating film 13 to be a tunnel insulating film is formed to have a thickness of about 9 nm over the substrate 11 by a thermal oxidation process, for example. Next, a first gate prototype film 14 of polysilicon is deposited to a thickness of about 250 nm over the first insulating film 13 by a CVD process, for example.

Next, in the process step shown in FIG. 8B, a second insulating film 15 to be a capacitive insulating film is formed as a stack of silicon dioxide, silicon nitride and silicon dioxide films (i.e., having a so-called "ONO" structure) on the first gate prototype film 14. Thereafter, a resist pattern 80, covering the memory circuit region 1, is defined on the second insulating film 15. Then, respective parts of the first insulating, first gate prototype and second insulating films 13, 14 and 15 located in the logic circuit region 2 are removed using the resist pattern 80 as a mask.

Then, in the process step shown in FIG. 8C, the resist pattern 80 is removed and then a third insulating film 16 to be a gate insulating film is selectively formed to have a thickness of 10 nm on the logic circuit region 2 of the substrate 11. The third insulating film 16 may be formed by a thermal oxidation process, for example. Subsequently, a second gate prototype film 17 of polysilicon is deposited to a thickness of about 100 nm over the second and third insulating films 15 and 16 by a CVD process, for example. Thereafter, P$^+$ ions are implanted at a dose of about $5 \times 10^{15}$ cm$^{-2}$ into the second gate prototype film 17 to make the second gate prototype film 17 exhibit n-type conductivity. Although not shown, part of the second gate prototype film 17 where a p-channel transistor will be formed may be covered with a resist mask in this P$^+$ ion implanting step so that the covered part will exhibit p-type conductivity through implantation of a p-type dopant in a subsequent process step.

Next, in the process step shown in FIG. 8D, a fourth insulating film 34 of silicon nitride is deposited to a thickness of about 200 nm over the second gate prototype film 17 by a CVD process, for example.

Thereafter, in the process step shown in FIG. 8E, a resist pattern 82, covering the memory circuit region 1, is defined on the fourth insulating film 34. Then, using the resist pattern 82 as a mask, part of the fourth insulating film 34 located in the logic circuit region 2 is removed.

Subsequently, in the process step shown in FIG. 8F, the resist pattern 82 is removed and instead a resist pattern 81, covering the entire logic circuit region 2 and part of the memory circuit region 1 where a memory gate structure will be formed, is defined. Thereafter, using the resist pattern 81 as a mask, the multilayer structure consisting of the first insulating, first gate prototype, second insulating, second gate prototype and fourth insulating films 13, 14, 15, 17 and 34 is dry-etched anisotropically. In this manner, tunnel insulating film 13a, floating gate electrode 14a, capacitive insulating film 15a, control gate electrode 17a and first passivation film 34a are formed in the memory circuit region 1 out of the first insulating, first gate prototype, second insulating, second gate prototype and fourth insulating films 13, 14, 15, 17 and 34, respectively. In the following description, the gate structure made up of the tunnel insulating film 13a, floating gate electrode 14a, capacitive insulating film 15a and control gate electrode 17a will be referred to as a "memory gate structure" 18.

Subsequently, using the resist pattern 81 as a mask, phosphorus ions are implanted into the substrate 11 at a dose of about $2 \times 10^{15}$ cm$^{-2}$ and at an accelerating voltage of about 30 keV, thereby selectively defining source/drain regions 19 and 20 in the substrate 11 beside the memory gate structure 18 in the memory circuit region 1. Next, the resist pattern 81 is removed and then the substrate 11 including the source/drain regions 19 and 20 therein is annealed at about 900° C. This annealing process is performed to repair the ion-implant-induced damage done on the tunnel insulating film 13a and thereby improve the physical properties thereof.

Thereafter, in the process step shown in FIG. 8G, a silicon nitride film is deposited over the substrate 11 by a CVD process and then etched back, thereby forming a sidewall insulating film 35 of silicon nitride on the side faces of the memory gate structure 18 in the gate length direction.

Next, in the process step shown in FIG. 8H, a conductor film 22 of tungsten (W), for example, is deposited to a thickness of about 150 nm over the substrate 11 by a CVD, evaporation or sputtering process. In this process step, the memory gate structure 18 is also covered with the conductor film 22. Subsequently, a fifth insulating film 36 of silicon nitride is deposited to a thickness of about 100 nm over the conductor film 22.

Then, in the process step shown in FIG. 8I, a resist pattern 88, covering the entire memory circuit region 1 and part of the logic circuit region 2 where a logic gate structure will be formed, is defined over the substrate 11. Subsequently, using this resist pattern 88 as a mask, the fifth insulating film 36 is dry-etched. As a result, a second passivation film 36a and 36c is formed in the logic and memory circuit regions 2 and 1, respectively. The second passivation film 36a will be used as a mask for defining a logic gate structure in the next process step. On the other hand, the second passivation film 36c covers the memory circuit region 1 completely.

Next, in the process step shown in FIG. 8J, the resist pattern 88 is removed. Thereafter, using the second passivation film 36a and 36c as a mask, the third insulating, second gate prototype and conductor films 16, 17 and 22 are dry-etched anisotropically. In this manner, gate insulating film 16a and lower and upper gate electrodes 17b and 22a are formed in the logic circuit region 2 out of the third insulating, second gate prototype and conductor films 16, 17 and 22, respectively. In the memory circuit region 1 on the other hand, the conductor film 22 and its underlying layers are not etched because the memory circuit region 1 is entirely covered with the second passivation film 36c. In the following description, a gate structure, which has been formed in the logic circuit region 2 to include the gate insulating film 16a and lower and upper gate electrodes 17b and 22a, will be referred to as a "logic gate structure" 24.

Subsequently, in the process step shown in FIG. 8K, a resist pattern 89 having an opening 89a over the memory gate structure 18 is defined over the substrate 11. Then, using the resist pattern 89 as a mask, the first passivation, conductor and second passivation films 34a, 22 and 36c are dry-etched anisotropically, thereby exposing the control gate electrode 17a. As a result, contact pads 22A are formed out of the conductor film 22 and a second passivation film 36b is formed out of the fifth insulating film 36 on the contact pads 22A in the memory circuit region 1. The contact pads 22A are electrically connected to the source/drain regions 19 and 20 for storage element. Also, the contact pads 22A cover the upper surface of the source/drain regions 19 and 20 and the side faces and upper edges of the memory gate structure 18.

Thereafter, in the process step shown in FIG. 8L, the resist pattern 89 is removed and instead a resist pattern 85 covering the memory circuit region 1 is defined over the substrate 11. Subsequently, using the resist pattern 85 and logic gate structure 24 including the second passivation film 36a as a mask, As$^+$ ions are implanted into the substrate 11 at a dose of about $1 \times 10^{15}$ cm$^{-2}$ and at an accelerating voltage of about 10 keV, thereby defining LDD regions 25 and 26 in the logic circuit region 2.

Then, in the process step shown in FIG. 8M, the resist pattern 85 is removed and a silicon nitride film is deposited over the substrate 11 and then etched back. In this manner, sidewall insulating films 40A and 40B of silicon nitride are formed on the side edges of the contact pads 22A and on the side faces of the logic gate structure 24, respectively. Then, a resist pattern 86, covering the memory circuit region 1, is defined over the substrate 11. Subsequently, using the resist pattern 86, logic gate structure 24 including the second passivation film 36a and sidewall insulating film 40B as a mask, As$^+$ ions are implanted again into the substrate 11 at a dose of about $3\times10^{15}$ cm$^{-2}$ and at an accelerating voltage of about 30 keV, thereby defining HDD regions 29 and 30 in the logic circuit region 2.

Thereafter, in the process step shown in FIG. 8N, the resist pattern 86 is removed and then a Co film is deposited over the substrate 11 by an evaporation or sputtering process, for example. Subsequently, the substrate is annealed at a temperature high enough to cause silicidation reaction between the exposed silicon of the substrate 11 and control gate electrode 17a and the Co film. In this manner, a cobalt silicide layer 31 is selectively formed on the control gate electrode 17a of the memory gate structure 18 and on the HDD regions 29 and 30.

Subsequently, in the process step shown in FIG. 8O, an interlevel dielectric film 32 of silicon dioxide, for example, is deposited over the substrate 11. Next, a first group of openings 32a are formed in the interlevel dielectric film 32 to expose parts of the cobalt silicide layer 31 on the memory gate structure 18 and on the HDD regions 29 and 30. Then, a second group of openings 32b are formed in the interlevel dielectric film 32 to expose the contact pads 22A.

Thereafter, in the process step shown in FIG. 8P, the first and second groups of openings 32a and 32b of the interlevel dielectric film 32 are filled in with a metal film of tungsten, for example, by an evaporation or sputtering process. In this manner, contacts 33 are formed so as to make electrical contact with the control gate electrode 17a, source/drain regions 19 and 20 and HDD regions 29 and 30. In this case, the control gate electrode 17a and HDD regions 29 and 30 are connected to the contacts 33 via the cobalt silicide layer 31, while the source/drain regions 19 and 20 are connected to the contacts 33 via the contact pads 22A.

As described above, according to the seventh embodiment, the logic gate structure 24 is formed using the second passivation film 36a as a hard mask and the contact pads 22A are formed using the resist pattern 89 as in the fourth embodiment. Thus, these patterns can be defined more accurately.

In addition, in the process step shown in FIG. 8O for forming the contact holes, when the first group of openings 32a are formed through the interlevel dielectric film 32 in the logic circuit region 2, the logic gate structure 24 is covered with the second passivation film 36a of silicon nitride on its upper surface and with the sidewall insulating film 40B of silicon nitride on its side faces, respectively. Accordingly, the first group of openings 32a can be formed so as to be self-aligned with the side portions of the logic gate structure 24.

In the same way, when the opening 32a is formed through the interlevel dielectric film 32 in the memory circuit region 1, the contact pads 22A are also covered with the second passivation film 36b of silicon nitride on its upper surface and with the sidewall insulating film 40A of silicon nitride on its side faces, respectively. Accordingly, the opening 32a can be formed so as to be self-aligned with the side portions of the contact pads 22A. That is to say, the mask alignment margin allowable for forming the contacts 33 can be greatly increased for the memory and logic circuit regions 1 and 2. As a result, self-aligned contacts can be formed and the necessary chip area can be further reduced.

As in the seventh embodiment, the chip area needed can also be reduced easily by any of the first through sixth embodiments if the insulating films formed on the upper and side faces of the memory or logic gate structure are made of a material different from that of the interlevel dielectric film and if the etch selectivity of the latter material to the former can be sufficiently high. For example, in the second embodiment illustrated in FIG. 2L, the sidewall insulating films 27B and 27C may be both made of silicon nitride.

Embodiment 8

Hereinafter, an eighth embodiment of the present invention will be described with reference to the accompanying drawings.

Figure 9A:
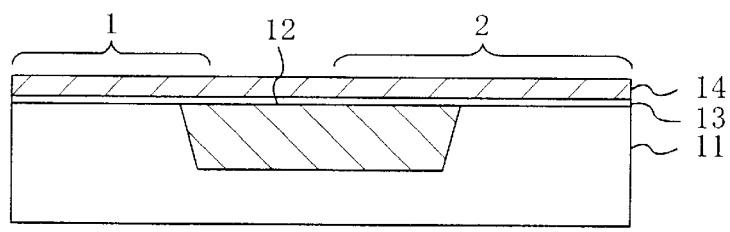
FIGS. 9A through 9P are cross-sectional views illustrating respective process steps for fabricating a semiconductor memory device according to an eighth embodiment of the present invention.
Figure 9B:
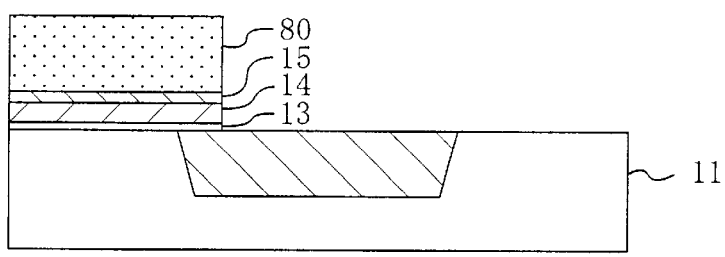
Figure 9C:
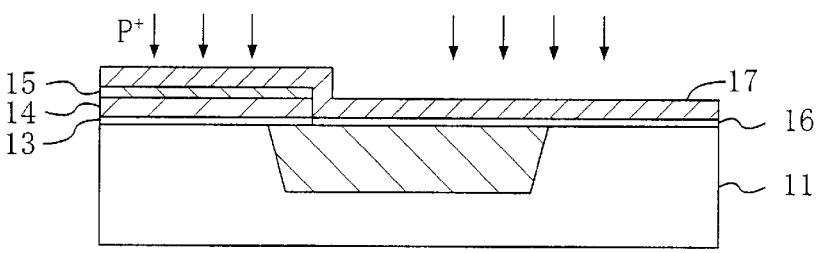
Figure 9D:
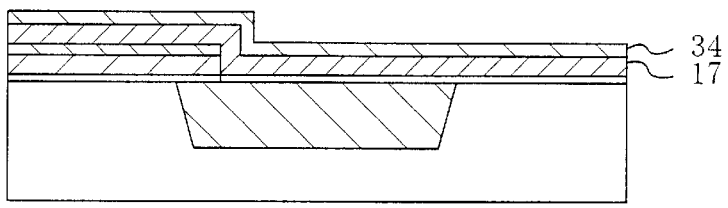
Figure 9E:
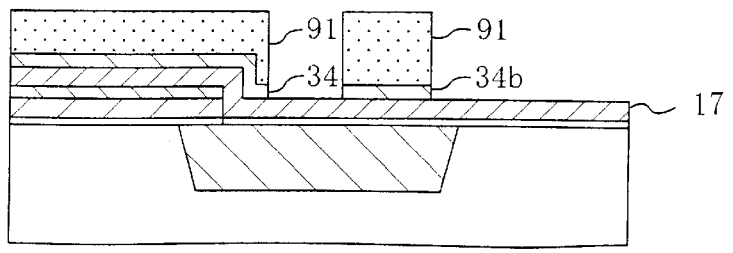
Figure 9F:
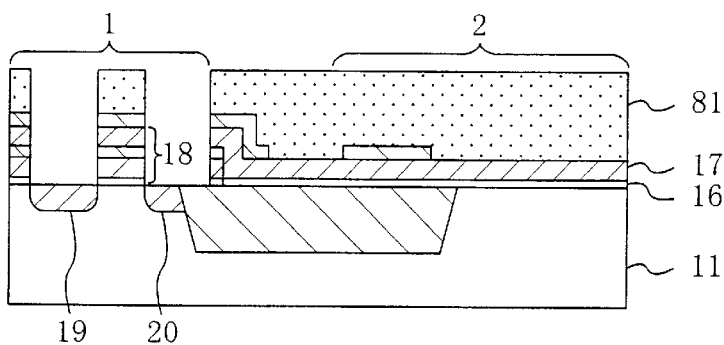
Figure 9G:
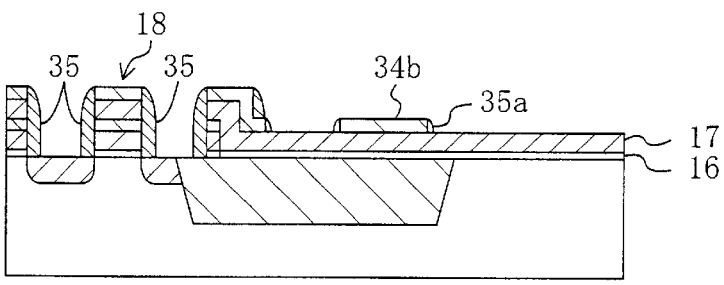
Figure 9H:
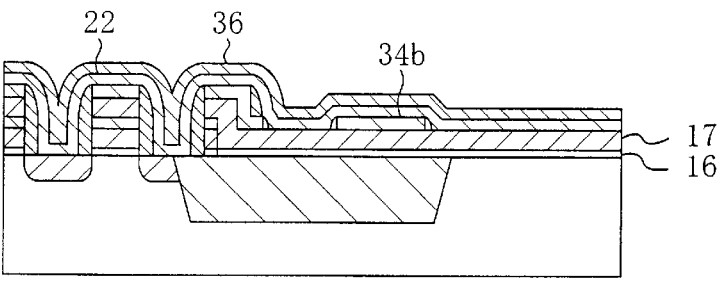
Figure 9I:
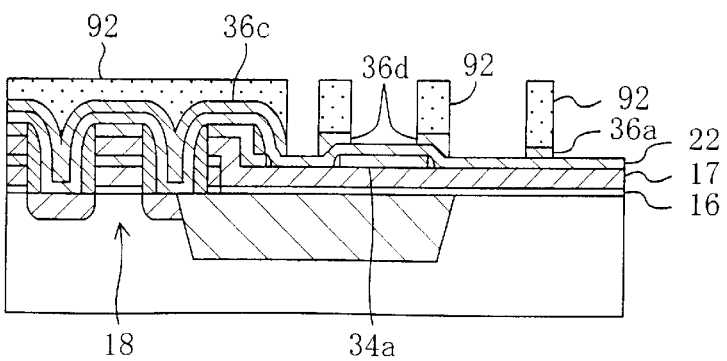
Figure 9J:
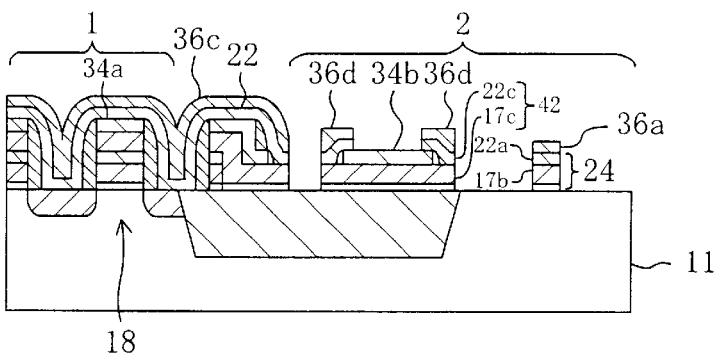
Figure 9K:
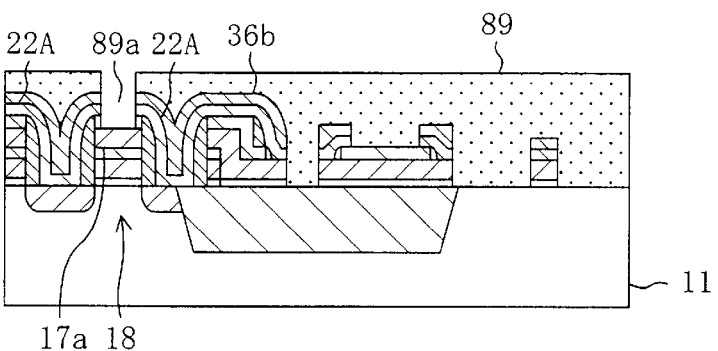
Figure 9L:
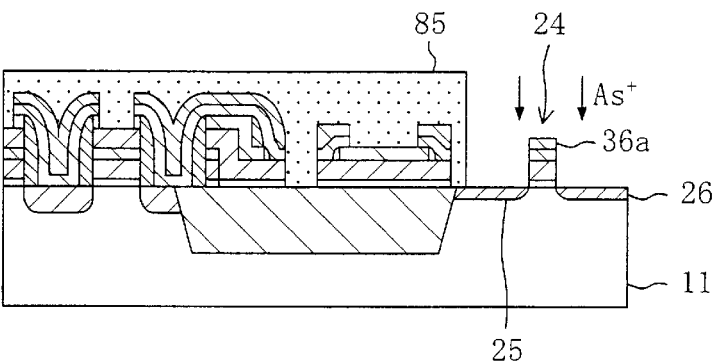
Figure 9M:
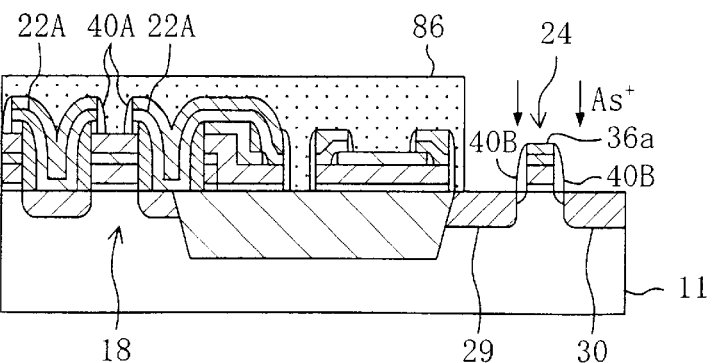
Figure 9N:
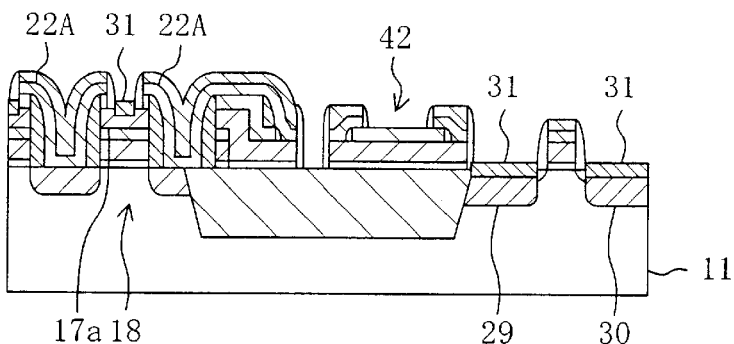
Figure 9O:
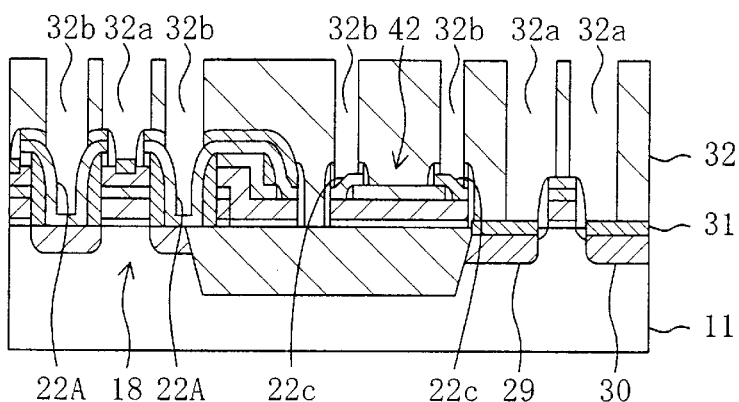
Figure 9P:
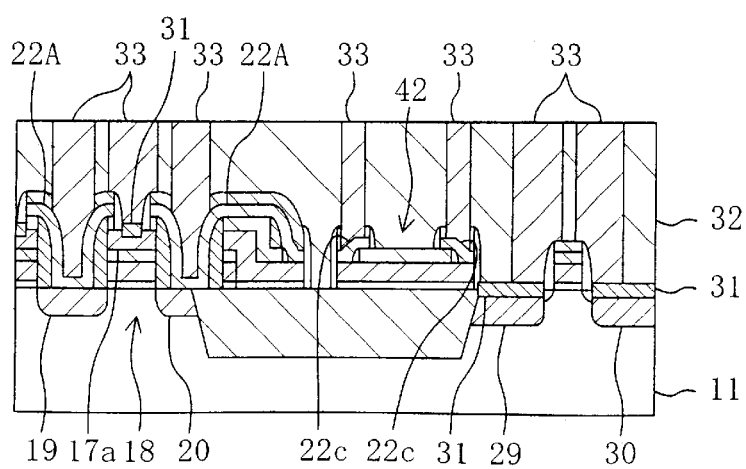
Figure 10A:
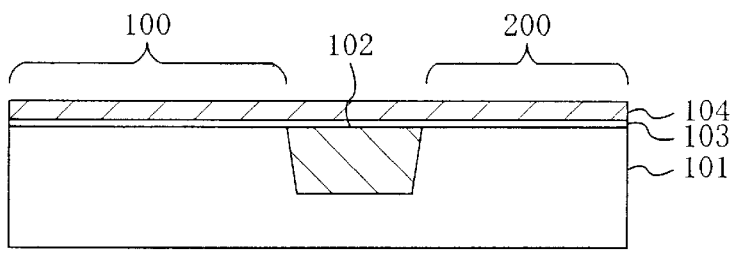
FIGS. 10A through 10L are cross-sectional views illustrating known process steps for fabricating a semiconductor memory device.
Figure 10B:
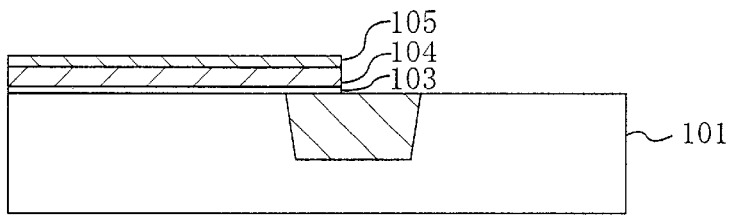
Figure 10C:
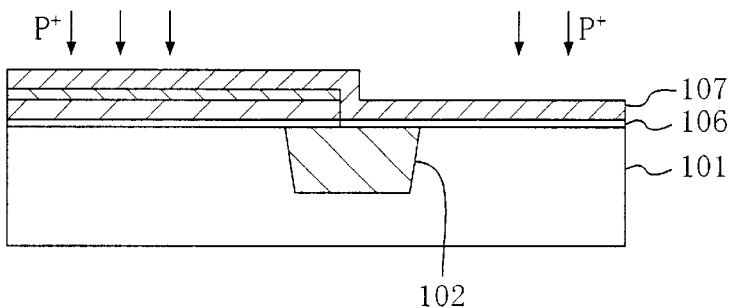
Figure 10D:
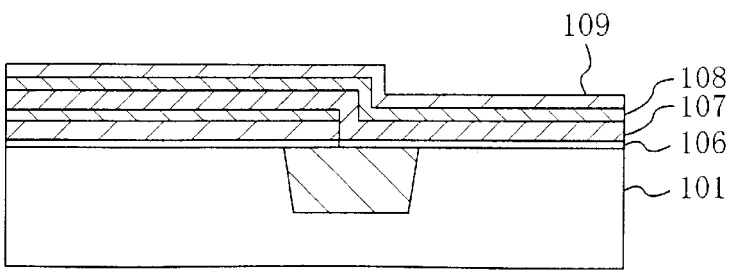
Figure 10E:
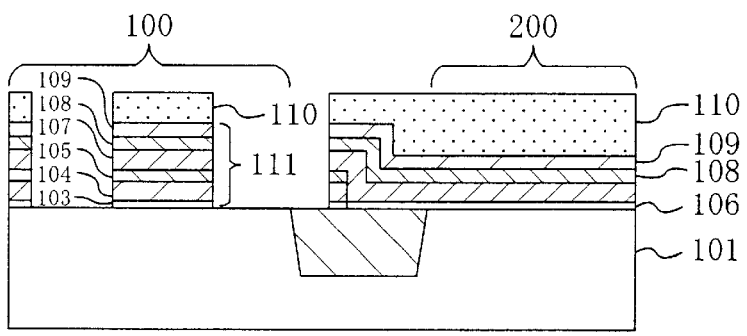
Figure 10F:
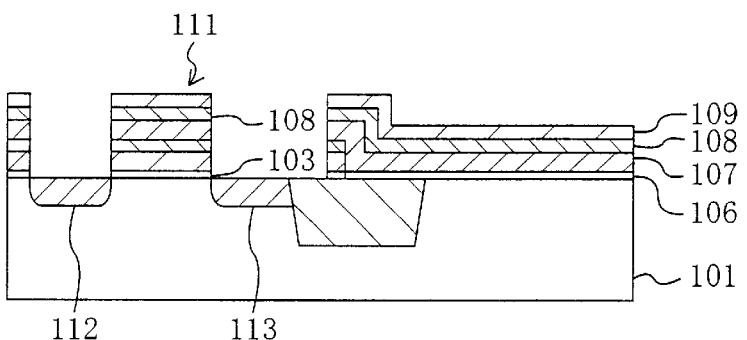
Figure 10G:
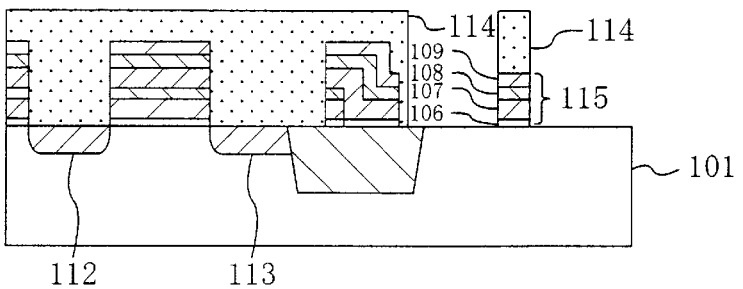
Figure 10H:
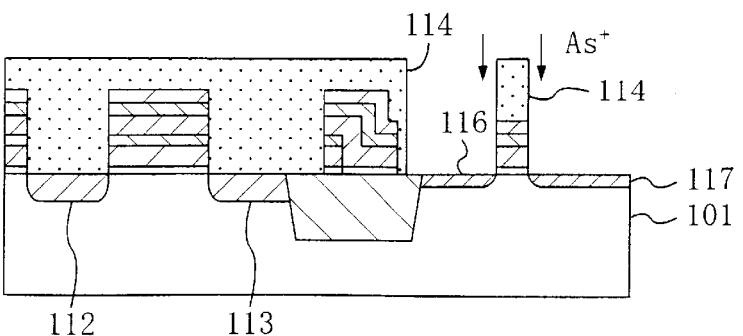
Figure 10I:
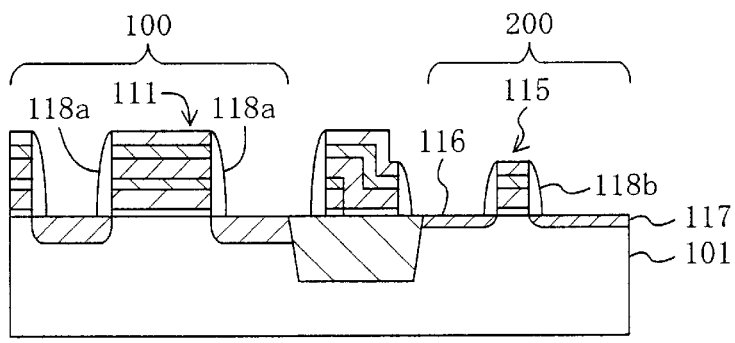
Figure 10J:
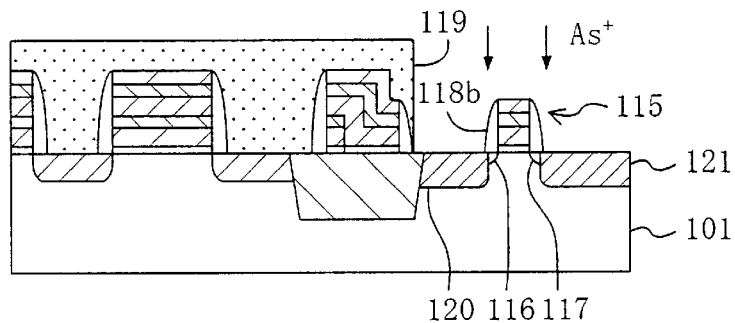
Figure 10K:
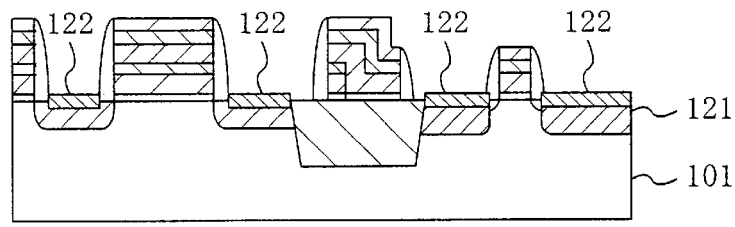
Figure 10L:
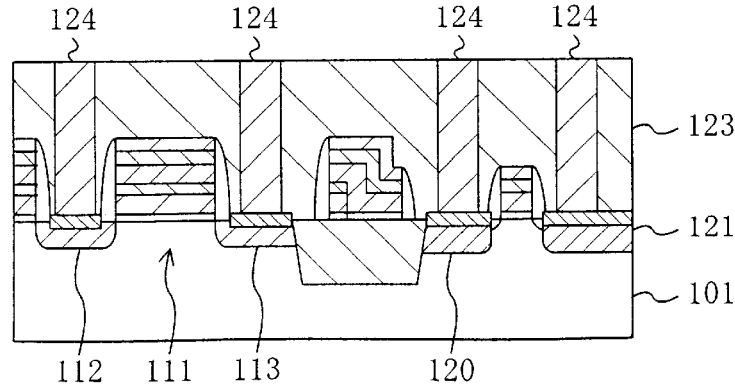

FIGS. 9A through 9P illustrate cross-sectional structures corresponding to respective process steps for fabricating a semiconductor memory device according to the eighth embodiment. It should be noted that although p- and n-channel transistors are actually formed in the logic circuit region, the illustration of the p-channel transistor is omitted from FIGS. 9A through 9P because of the reasons already described for the first embodiment.

The eighth embodiment of the present invention is characterized in that the insulating films formed on the upper and side faces of the memory or logic gate structure are made of a material different from that of the interlevel dielectric film. The eighth embodiment is also characterized by forming the logic gate structure 24 (i.e., poly-metal gate) and resistor 42 out of the second gate prototype and conductor films in the same process step.

First, in the process step shown in FIG. 9A, an isolation region 12 is defined in a semiconductor substrate 11 of silicon by embedding silicon dioxide in its surface region so that the substrate 11 is partitioned into a memory circuit region 1 and a logic circuit region 2. Thereafter, a first insulating film 13 to be a tunnel insulating film is formed to have a thickness of about 9 nm over the substrate 11 by a thermal oxidation process, for example. Next, a first gate prototype film 14 of polysilicon is deposited to a thickness of about 250 nm over the first insulating film 13 by a CVD process, for example.

Next, in the process step shown in FIG. 9B, a second insulating film 15 to be a capacitive insulating film is formed as a stack of silicon dioxide, silicon nitride and silicon dioxide films (i.e., having a so-called "ONO" structure) on the first gate prototype film 14. Thereafter, a resist pattern 80, covering the memory circuit region 1, is defined on the second insulating film 15. Then, respective parts of the first insulating, first gate prototype and second insulating films 13, 14 and 15 located in the logic circuit region 2 are removed using the resist pattern 80 as a mask.

Then, in the process step shown in FIG. 9C, the resist pattern 80 is removed and then a third insulating film 16 to be a gate insulating film is selectively formed to have a thickness of 10 nm on the logic circuit region 2 of the substrate 11. The third insulating film 16 may be formed by a thermal oxidation process, for example. Subsequently, a second gate prototype film 17 of polysilicon is deposited to a thickness of about 100 nm over the second and third insulating films 15 and 16 by a CVD process, for example. Thereafter, P$^+$ ions are implanted at a dose of about $5\times10^{15}$ cm$^{-2}$ into the second gate prototype film 17 to make the second gate prototype film 17 exhibit n-type conductivity. Although not shown, part of the second gate prototype film 17 where a p-channel transistor will be formed may be covered with a resist mask in this P$^+$ ion implanting step so that the covered part will exhibit p-type conductivity through implantation of a p-type dopant in a subsequent process step.

Next, in the process step shown in FIG. 9D, a fourth insulating film 34 of silicon nitride is deposited to a thickness of about 200 nm over the second gate prototype film 17 by a CVD process, for example.

Thereafter, in the process step shown in FIG. 9E, a resist pattern 91, covering the entire memory circuit region 1 and part of the logic circuit region 2 where a resistor will be formed over the isolation region 12, is defined on the fourth insulating film 34. Then, using the resist pattern 91 as a mask, the fourth insulating film 34 is partially removed. As a result, a passivation film 34b is formed out of the fourth insulating film 34 over part of the isolation region 12 located in the logic circuit region 2.

Subsequently, in the process step shown in FIG. 9F, the resist pattern 91 is removed and instead a resist pattern 81, covering the entire logic circuit region 2 and part of the memory circuit region 1 where a memory gate structure will be formed, is defined. Thereafter, using the resist pattern 81 as a mask, the multilayer structure consisting of the first insulating, first gate prototype, second insulating, second gate prototype and fourth insulating films 13, 14, 15, 17 and 34 is dry-etched anisotropically. In this manner, a memory gate structure 18 similar to the counterpart of the seventh embodiment is formed in the memory circuit region 1.

Subsequently, using the resist pattern 81 as a mask, phosphorus ions are implanted into the substrate 11 at a dose of about $2 \times 10^{15}$ cm$^{-2}$ and at an accelerating voltage of about 30 keV, thereby selectively defining source/drain regions 19 and 20 in the substrate 11 beside the memory gate structure 18 in the memory circuit region 1. Next, the resist pattern 81 is removed and then the substrate 11 including the source/drain regions 19 and 20 therein is annealed at about 900° C. This annealing process is performed to repair the ion-implant-induced damage done on the tunnel insulating film 13a and thereby improve the physical properties thereof.

Thereafter, in the process step shown in FIG. 9G, a silicon nitride film is deposited over the substrate 11 by a CVD process and then etched back, thereby forming a sidewall insulating film 35 of silicon nitride on the side faces of the memory gate structure 18 in the gate length direction. In this process step, another sidewall insulating film 35a of silicon nitride is formed on the side faces of the passivation film 34b.

Next, in the process step shown in FIG. 9H, a conductor film 22 of tungsten (W), for example, is deposited to a thickness of about 150 nm over the substrate 11 by a CVD, evaporation or sputtering process. In this process step, the memory gate structure 18 and the passivation film 34b are also covered with the conductor film 22. Subsequently, a fifth insulating film 36 of silicon nitride is deposited to a thickness of about 100 nm over the conductor film 22.

Then, in the process step shown in FIG. 9I, a resist pattern 92 is defined over the substrate 11. The resist pattern 92 covers the entire memory circuit region 1 and parts of the logic circuit region 2 where a logic gate structure and terminals of a resistor will be formed, respectively. Specifically, parts of the resist pattern 92 are located over the upper side edges of the passivation film 34b. Subsequently, using this resist pattern 92 as a mask, the fifth insulating film 36 is dry-etched. As a result, a second passivation film 36a and 36d is formed in the logic circuit region 2, while another second passivation film 36c is formed over the memory circuit region 1. The second passivation film 36a will be used as a mask for defining a logic gate structure in the next process step. On the other hand, the second passivation film 36d will be used as a mask for defining terminals for the resistor.

Next, in the process step shown in FIG. 9J, the resist pattern 92 is removed. Thereafter, using the second passivation film 36a, 36c and 36d as a mask, the third insulating, second gate prototype and conductor films 16, 17 and 22 are dry-etched anisotropically. In this manner, a logic gate structure 24 similar to the counterpart of the seventh embodiment and a resistor 42 are formed in the logic circuit region 2. The resistor 42 includes a body 17c and terminals 22c that have been formed out of the second gate prototype film 17 and the conductor film 22, respectively. The terminals 22c make electrical contact with both edges of the body 17c.

Subsequently, in the process step shown in FIG. 9K, a resist pattern 89 having an opening 89a over the memory gate structure 18 is defined over the substrate 11. Then, using the resist pattern 89 as a mask, the first passivation, conductor and second passivation films 34a, 22 and 36c are dry-etched anisotropically, thereby exposing the control gate electrode 17a. As a result, contact pads 22A are formed out of the conductor film 22 and a second passivation film 36b is formed out of the fifth insulating film 36 on the contact pads 22A in the memory circuit region 1. The contact pads 22A are electrically connected to the source/drain regions 19 and 20 for storage element. Also, the contact pads 22A cover the upper surface of the source/drain regions 19 and 20 and the side faces and upper edges of the memory gate structure 18.

Thereafter, in the process step shown in FIG. 9L, the resist pattern 89 is removed and instead a resist pattern 85 covering the memory circuit region 1 is defined over the substrate 11. Subsequently, using the resist pattern 85 and logic gate structure 24 including the second passivation film 36a as a mask, As$^+$ ions are implanted into the substrate 11 at a dose of about $1 \times 10^{15}$ cm$^{-2}$ and at an accelerating voltage of about 10 keV, thereby defining LDD regions 25 and 26 in the logic circuit region 2.

Then, in the process step shown in FIG. 9M, the resist pattern 85 is removed and a silicon nitride film is deposited over the substrate 11 and then etched back. In this manner, sidewall insulating films 40A and 40B of silicon nitride are formed on the side edges of the contact pads 22A and on the side faces of the logic gate structure 24, respectively. Then, a resist pattern 86, covering the memory circuit region 1, is defined over the substrate 11. Subsequently, using the resist pattern 86, logic gate structure 24 including the second passivation film 36a and sidewall insulating film 40B as a mask, As$^+$ ions are implanted again into the substrate 11 at a dose of about $3 \times 10^{15}$ cm$^{-2}$ and at an accelerating voltage of about 30 keV, thereby defining HDD regions 29 and 30 in the logic circuit region 2.

Thereafter, in the process step shown in FIG. 9N, the resist pattern 86 is removed and then a Co film is deposited over the substrate 11 by an evaporation or sputtering process, for example. Subsequently, the substrate is annealed at a temperature high enough to cause silicidation reaction between the exposed silicon of the substrate 11 and control gate electrode 17a and the Co film. In this manner, a cobalt silicide layer 31 is selectively formed on the control gate electrode 17a of the memory gate structure 18 and on the HDD regions 29 and 30.

Subsequently, in the process step shown in FIG. 9O, an interlevel dielectric film 32 of silicon dioxide, for example, is deposited over the substrate 11. Next, a first group of openings 32a are formed in the interlevel dielectric film 32 to expose parts of the cobalt silicide layer 31 on the memory gate structure 18 and on the HDD regions 29 and 30. Then, a second group of openings 32b are formed in the interlevel dielectric film 32 to expose the contact pads 22A and terminals 22c.

Thereafter, in the process step shown in FIG. 9P, the first and second groups of openings 32a and 32b of the interlevel dielectric film 32 are filled in with a metal film of tungsten, for example, by an evaporation or sputtering process. In this manner, contacts 33 are formed so as to make electrical contact with the control gate electrode 17a, source/drain regions 19 and 20, HDD regions 29 and 30 and terminals 22c. In this case, the control gate electrode 17a and HDD regions 29 and 30 are connected to the contacts 33 via the cobalt silicide layer 31. The source/drain regions 19 and 20 are connected to the contacts 33 via the contact pads 22A. And the resistor body 17c is connected to the contacts 33 by way of the terminals 22c.

According to the eighth embodiment, the chip area required can also be reduced as in the seventh embodiment. In addition, in the process step shown in FIG. 9J, a poly-metal gate, including upper and lower gate electrodes 22a and 17b formed out of the conductor and second gate prototype films 22 and 17 of tungsten and polysilicon, respectively, is defined as the logic gate structure 24. Also, the resistor body 17c can be formed out of the second gate prototype film 17 by shaping the fourth and fifth insulating films 34 and 36 over the second gate prototype film 17 into the passivation films 34b and 36d, respectively, in the region where the resistor will be formed. In this case, the passivation film 34b can also function as a mask for preventing the conductor film 22 from being deposited on the resistor body 17c. In this manner, the poly-metal gate and the resistor 42, including the polysilicon as a material for the poly-metal gate, can be formed in the same process step. Accordingly, there is no need to perform an additional process step of removing part of the conductor film 22 to form the resistor 42.

In the eighth embodiment, the resistor 42 is formed in the logic circuit region 2. Alternatively, the resistor 42 may be formed on part of the isolation region 12 belonging to the memory circuit region 1.

In the foregoing first through eighth embodiments, the first and second gate prototype films 14 and 17 are made of polysilicon. However, these films 14 and 17 may also be made of amorphous silicon.

Also, in the foregoing embodiments, the LDD regions 25 and 26 are defined in the logic circuit region 2. But the LDD regions 25 and 26 may be replaced with more heavily doped, extended source/drain regions.

Moreover, in the foregoing embodiments, the conductor film 22 as a material for the contact pads 22A and logic gate structure 24 is made of tungsten. Alternatively, the conductor film 22 may also be made of titanium, titanium nitride, an alloy containing tungsten or titanium or a metal silicide.

Furthermore, the cobalt silicide layer 31 may be replaced with a titanium or nickel silicide layer.

What is claimed is:

1. A semiconductor memory device comprising a memory circuit and a logic circuit that are formed on a single semiconductor substrate, wherein the memory circuit includes;
   a storage element having a memory gate structure, the memory gate structure including:
      a tunnel insulating film formed on the substrate; and a control gate electrode formed out of a gate prototype film formed over the tunnel insulating film,
   a first passivation film formed on the upper surface of the control gate electrode,
   source/drain regions defined in parts of the substrate that are located beside the memory gate structure,
   a first sidewall insulating film formed on the side faces of the control gate electrode, and
   contact pads formed on the source/drain regions, and
   wherein the logic circuit includes a logical element having a logic gate structure, the logic gate structure including: a gate insulating film formed on the substrate, a lower gate electrode formed out of the gate prototype film formed over the gate insulating film; and an upper gate electrode formed out of a metal film on the lower gate electrode,
   wherein the control gate electrode includes no metal film, and
   wherein the contact pads are formed out of the same metal film for the upper gate electrode.

2. The device of claim 1, wherein the storage element further comprises a silicide film on the control gate electrode.

3. The device of claim 1,
   wherein an etch selectivity of the first passivation film to the first sidewall insulating film is sufficiently high.

4. The device of claim 1,
   wherein the contact pads cover the upper surface of the source/drain regions and the side faces and upper edges of the memory gate structure, and is in contact with the first sidewall insulating film and the first passivation film.

5. The device of claim 1, wherein the upper surface and side edges of the contact pads are covered with a second passivation film and a second sidewall insulating film, respectively, and
   wherein the upper surface and side faces of the logic gate structure are also covered with the second passivation and second sidewall insulating films, respectively, and
   wherein the second passivation and second sidewall insulating films have been shaped out of first and second insulating films, respectively.

6. The device of claim 5, wherein an interlevel dielectric film has been deposited as a third insulating film over the substrate, and
   wherein the first and second insulating films are made of the same material, and
   wherein an etch selectivity of the third insulating film to the first and second insulating films is sufficiently high.

7. The device of claim 1, further comprising: an isolation region defined in the substrate; and a resistor formed on the isolation region,
   wherein the resistor includes: a body formed out of the gate prototype film; and two terminals, which have been formed out of the metal film and make electrical contact with both edges of the body.

8. The device of claim 1, wherein the upper gate electrode is a single metal film, a stack of multiple metal films or a multilayer structure made of a metal film and a silicide film.

9. The device of claim 1, wherein a sidewall passivation film with an L-cross section and a first sidewall insulating film have been stacked in this order on the side faces of the memory gate structure, and
   wherein the side faces of the logic gate structure are not covered with the sidewall passivation film but with the first sidewall insulating film.

10. The device of claim 1, wherein the memory gate structure further comprises a floating gate electrode and a capacitive insulating film that have been formed in this order on the tunnel insulating film and under the control gate electrode.

11. The device of claim 1, wherein the gate prototype film is made of silicon, and the metal film is made of tungsten.

12. The device of claim 2, wherein the gate prototype film is made of silicon, and the metal film is made of tungsten.

13. The device of claim 2, wherein the suicide film is made of cobalt suicide.

14. The device of claim 13, wherein the gate prototype film is made of silicon, and the metal film is made of tungsten.

* * * * *

UNITED STATES PATENT AND TRADEMARK OFFICE
CERTIFICATE OF CORRECTION

PATENT NO. : 6,774,429 B2
DATED : August 10, 2004
INVENTOR(S) : Masatoshi Arai

It is certified that error appears in the above-identified patent and that said Letters Patent is hereby corrected as shown below:

Column 37,
Line 49, "includes;" should read -- includes, --

Signed and Sealed this

Twenty-sixth Day of April, 2005

JON W. DUDAS
*Director of the United States Patent and Trademark Office*